United States Patent
Okada et al.

(10) Patent No.: US 8,383,456 B2
(45) Date of Patent: Feb. 26, 2013

(54) SEMICONDUCTOR DEVICE AND MANUFACTURING METHOD THEREFOR

(75) Inventors: Mikako Okada, Tokyo (JP); Toshikazu Ishikawa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/439,992

(22) Filed: Apr. 5, 2012

(65) Prior Publication Data

US 2012/0208322 A1 Aug. 16, 2012

Related U.S. Application Data

(63) Continuation of application No. 12/423,826, filed on Apr. 15, 2009, now Pat. No. 8,159,057.

(30) Foreign Application Priority Data

May 28, 2008 (JP) .................................. 2008-139680

(51) Int. Cl.
  *H01L 21/44* (2006.01)
  *H01L 21/48* (2006.01)
  *H01L 21/50* (2006.01)
(52) U.S. Cl. ......... 438/108; 438/106; 257/777; 257/778
(58) Field of Classification Search ........................ None
  See application file for complete search history.

(56) References Cited

U.S. PATENT DOCUMENTS

| 6,900,551 | B2 | 5/2005 | Matsuzawa et al. |
| 7,323,773 | B2 | 1/2008 | Hayashi et al. |

FOREIGN PATENT DOCUMENTS

| JP | 2003-086941 A | 3/2003 |
| JP | 2003-124632 A | 4/2004 |
| JP | 2006-093189 A | 4/2006 |
| JP | 2006-196656 A | 7/2006 |
| JP | 2006-344664 A | 12/2006 |

OTHER PUBLICATIONS

Office Action issued Feb. 7, 2012, in Japanese Patent Application No. 2008-139680.
Office Action issued Sep. 13, 2012, in Chinese Patent Application No. 200910202967.7.

*Primary Examiner* — Thien F Tran
(74) *Attorney, Agent, or Firm* — Miles and Stockbridge P.C.

(57) ABSTRACT

A multilayer wiring substrate has an upper surface with multiple bonding leads and a lower surface with multiple lands. Multiple wiring layers and insulating layers are alternately formed on the upper surface side and on the lower surface side of the core material of the wiring substrate. The bonding leads are formed of part of the uppermost wiring layer and the lands are formed of part of the lowermost wiring layer. The insulating layers include second insulating layers containing fiber and resin and third insulating layers smaller in fiber content than the second insulating layers. The second insulating layers are formed on the upper and lower surface sides of the core material. The third insulating layers are formed on the upper and lower surface sides of the core material with the second insulating layers in-between. The uppermost and lowermost wiring layers are formed over the third insulating layers.

9 Claims, 89 Drawing Sheets

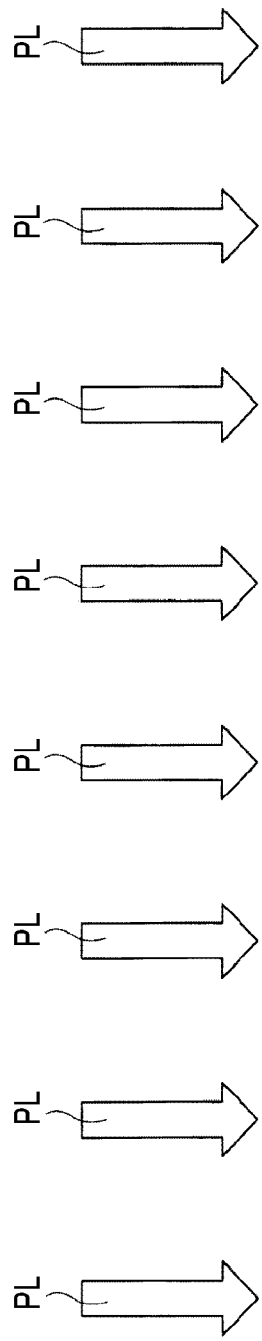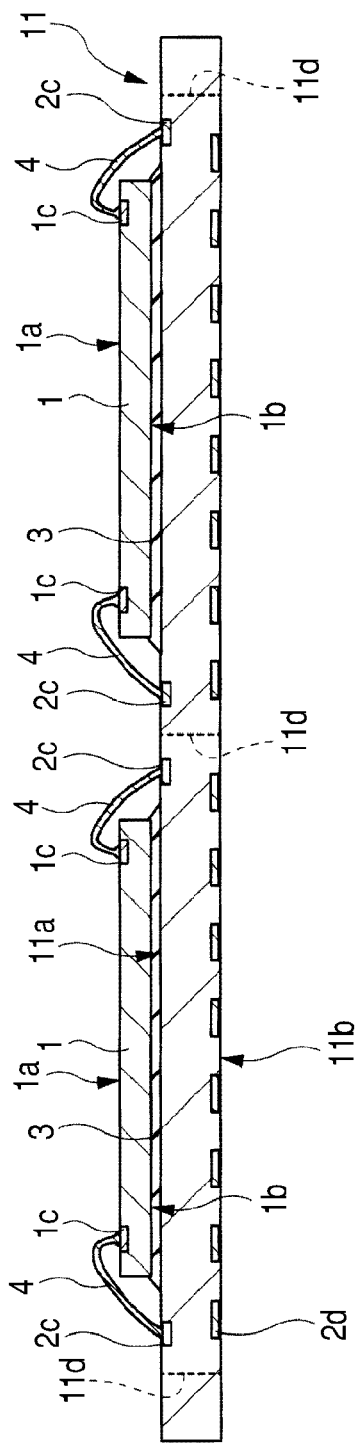
FIG. 26

US 8,383,456 B2

SEMICONDUCTOR DEVICE AND MANUFACTURING METHOD THEREFOR

CROSS-REFERENCE TO RELATED APPLICATIONS

This application is a continuation of application Ser. No. 12/423,826 filed Apr. 15, 2009 now U.S. Pat. No. 8,159,057. Also, the disclosure of Japanese Patent Application No. 2008-139680 filed on May 28, 2008 including the specification, drawings and abstract is incorporated herein by reference in its entirety.

BACKGROUND OF THE INVENTION

The present invention relates to a technology effectively applicable to a BGA (Ball Grid Array) type semiconductor device formed by mounting a semiconductor chip over a wiring substrate and a manufacturing method for the semiconductor device.

As one of the configurations of semiconductor devices (semiconductor packages) incorporated in electronic equipment, such as personal computers and cellular phones, a BGA (Ball Grid Array) type semiconductor device formed by mounting a semiconductor chip over a wiring substrate (printed wiring substrate) is known.

As one of examples of the configurations of wiring substrates, there is that disclosed in Japanese Unexamined Patent Publication No. 2003-124632 (Patent Document 1). This wiring substrate is formed by: laminating prepreg, obtained by impregnating glass cloth 14 with insulating resin 15 mixed with filler, and copper foil over a wiring substrate 10 in which a first wiring layer 12 is formed on both sides of an insulating substrate 11; thereby forming an insulating layer 21 and surface copper foil 22; patterning the surface copper foil 22 to form a surface copper foil opening 23; and applying a laser beam through the surface copper foil opening 23 to form a hole 16 for via hole having a glass cloth protruded portion 14a.

As another example of the configurations of wiring substrates, there is that disclosed in Japanese Unexamined Patent Publication No. 2006-196656 (Patent Document 2). This wiring substrate is formed by: forming a first wiring 106a including a semiconductor chip connecting terminal and a first interlayer connecting terminal 101 over a core substrate 100 as an insulating layer on the side where a semiconductor chip is to be mounted; forming a second wiring 106b including a second interlayer connecting terminal 103 on the opposite side of the core substrate 100; electrically coupling together the first interlayer connecting terminal and the second interlayer connecting terminal through a first via hole 102 for interlayer coupling (hereafter, referred to as first via hole) in the core substrate 100; forming an insulating layer 104 on the side of the core substrate 100 where the second wiring is formed; forming a third wiring 106c including a third interlayer connecting terminal over the insulating layer 104; and electrically coupling together the second interlayer connecting terminal and the third interlayer connecting terminal through a second blind via hole 108 for interlayer coupling (hereafter, referred to as second via hole).

As a further example of the configurations of wiring substrates, there is that disclosed in Japanese Unexamined Patent Publication No. 2003-86941 (Patent Document 3). In this wiring substrate, the outermost insulating resin layer 2b is formed as a layer predominantly comprised of resin that does not contain glass cloth 4 as base material. In addition, the second outermost insulating resin layer 2a is formed as a layer containing glass cloth 4 as base material.

[Patent Document 1]
Japanese Unexamined Patent Publication No. 2003-124632
[Patent Document 2]
Japanese Unexamined Patent Publication No. 2006-196656
[Patent Document 3]
Japanese Unexamined Patent Publication No. 2003-86941

SUMMARY OF THE INVENTION

With respect to the configurations of semiconductor devices (semiconductor packages), aside from BGA (Ball Grid Array) type semiconductor devices using a wiring substrate (printed wiring substrate), various types, including QFP (Quad Flat Package) type semiconductor devices using a lead frame, have been developed.

Any of the various types of the semiconductor devices includes a semiconductor chip mounted in a semiconductor device and multiple external terminals for inputting/outputting signals between this semiconductor device and an external device (external LSI) placed close thereto.

In case of the BGA type semiconductor device, the multiple external terminals (bump electrodes) can be arranged in a matrix pattern on the side of the lower surface of a wiring substrate. (The lower surface of the wiring substrate refers to the surface on the opposite side to the surface where a semiconductor chip is mounted.) Therefore, increase in the outer dimensions of semiconductor devices can be suppressed even when the number of external terminals is increased with the enhancement of functionality of semiconductor devices. It is believed that the BGA type semiconductor device is more effective than the QFP type semiconductor device using a lead frame in this regard.

In recent years, however, there is a tendency to further reduce the outer dimensions of (downsize and thin) electronic equipment in which such a semiconductor device is incorporated. Especially, when the number of pads (electrodes) formed in the main surface of semiconductor chips is increased with the enhancement of functionality of semiconductor devices, it is required to take the following measure: it is required to form multiple wiring patterns that form current paths from a semiconductor chip mounted over a wiring substrate to external terminals formed on the lower surface (rear surface) side of the wiring substrate.

To efficiently route a wiring pattern forming a current path to a desired external terminal, it is effective to use a multilayer wiring substrate having multiple wiring layers formed therein. However, when the number of semiconductor chips mounted on the upper surface side of a wiring substrate is increased with the enhancement of functionality of semiconductor devices, it is required to further increase the number of wiring layers as well. As a result, the thickness of wiring substrates tends to be more and more increased.

When a semiconductor device is manufactured, for this reason, it is required to taken into account not only the reduction of the size of the semiconductor device but also the reduction of the thickness of the semiconductor device so that the mounting height of the semiconductor device can also be reduced.

Consequently, the prevent inventors examined semiconductor devices that make it possible to reduce, especially, the mounting height.

First, the thickness of an adopted wiring substrate and that of a semiconductor chip mounted over this wiring substrate could be reduced to reduce the mounting height of a semiconductor device.

However, when the wiring substrate is manufactured using a material different from a material configuring the semiconductor chip, a problem arises. A difference is produced in coefficient of thermal expansion between the wiring substrate and the semiconductor chip. If heat treatment is carried out after the semiconductor chip is mounted over the wiring substrate, the wiring substrate is warped. If the thickness of the wiring substrate is increased, the strength (hardness) of the wiring substrate is also enhanced and warpage can be suppressed. However, this makes it difficult to reduce the mounting height of the semiconductor device.

This problem of warpage becomes more prominent with reduction in the thickness of a wiring substrate since the strength of the wiring substrate is more degraded with reduction in the thickness. When the amount of warpage is increased, it is difficult to mount a finished semiconductor device over the mother board of electronic equipment even though a semiconductor chip can be mounted over the wiring substrate.

Consequently, the present inventors considered using a so-called prepreg-like wiring substrate (a wiring substrate including a prepreg material) with glass cloth impregnated as disclosed in Patent Documents 1 to 3.

The prepreg material contains not only resin but also glass cloth (fiber, filler, and the like). Therefore, it is a material effective at enhancing the strength of a wiring substrate without increasing the thickness of the wiring substrate.

However, the present inventors found that use of a prepreg material posed the following new problems:

As mentioned above, the following must be formed in a wiring substrate: wiring patterns that form current paths from a semiconductor chip mounted over the wiring substrate to external terminals formed on the lower surface (rear surface) side of the wiring substrate. However, as the number of pads (electrodes) formed in the main surface of a semiconductor chip is increased with the enhancement of functionality of a semiconductor device, a large number of wiring patterns must be accordingly formed in the wiring substrate. This makes it difficult to reduce the size of the semiconductor device.

Consequently, the pitches between wiring patterns could be reduced as much as possible to suppress increase in the outer dimensions of a semiconductor device.

To suppress increase in the outer dimensions of a semiconductor device, the pitches between wiring patterns can be reduced as much as possible when the semiconductor device is formed.

However, the prepreg material contains glass cloth and is inferior in processing accuracy to resin materials containing almost no glass cloth. For this reason, it is difficult to reduce the diameter of a via (through hole) that forms a path for electrically coupling together the upper surface and the lower surface of a wiring substrate.

In general, wiring patterns are formed by forming a seed layer over a base material (prepreg material) beforehand and thereafter depositing a plating film having a predetermined thickness over the seed layer by electrolytic plating. There are several methods to form the seed layer: a method in which electroless plating is used and a method in which metal foil is stuck. In case of electroless plating, a seed layer can be formed over an insulating layer by crystal grain and thus the thickness of the seed layer can be made smaller than the thickness of metal foil formed over a prepreg material. When a wiring pattern having a small width is formed, for this reason, it is effective to form a seed layer by electroless plating.

Since the prepreg material contains glass cloth, however, microscopic asperities are formed on the surface thereof. For this reason, to form a wiring pattern in the surface of a prepreg material, it is required to stick metal foil thicker than a seed layer formed by electroless plating and form the wiring pattern over this metal foil.

Description will be given to a difference in the width of formed wiring patterns observed when the thickness of a seed layer is varied. FIG. 94 and FIG. 95 are sectional views respectively illustrating wiring patterns formed over seed layers. FIG. 94 illustrates a case where seed layers are formed by electroless plating and FIG. 95 illustrates a case where metal foil thicker than in FIG. 94 is used as seed layers.

When the thickness of seed layers 80 is large in the examples in FIG. 94 and FIG. 95, the width L1 of each wiring pattern 81 formed by etching is increased. This is because, as illustrated in FIG. 95, the seed layers 80*b* using metal foil are so formed that the width L1 thereof is larger than the width L1 of the seed layers 80*a* formed by electroless plating illustrated in FIG. 94. That is, it is difficult to reduce the pitches between wiring patterns 81.

When an excess portion of the seed layers 80 is removed after the formation of the wiring patterns 81, a time required for etching is increased with increase in the thickness of the seed layers 80. When the etching time is increased, part (side face and the like) of the plating films 82 configuring the wiring patterns 81 is also etched and narrowed. In the example in FIG. 95, therefore, the line width of the wiring patterns 81 must be increased beforehand. As a result, the wiring patterns 81 obtained after etching are large in placement spacing L2. That is, it is difficult to reduce the placement spacing L2 between the wiring patterns 81.

An object of the invention is to provide a technology that makes it possible to reduce the mounting height of a semiconductor device.

Another object of the invention is to provide a technology that makes it possible to achieve reduction in the pitch of a semiconductor device.

A further object of the invention is to provide a technology that makes it possible to achieve reduction in the size of a semiconductor device.

The above and other objects and novel features of the invention will be apparent from the description in this specification and the accompanying drawings.

The following is a brief description of the gist of the representative elements of the invention laid open in this application.

A semiconductor device in an embodiment of the invention includes: a wiring substrate having an upper surface having multiple bonding leads formed therein and a lower surface positioned on the opposite side to the upper surface and having multiple lands formed therein; a semiconductor chip having a main surface with multiple pads formed therein and mounted over the upper surface of the wiring substrate; multiple conductive members that electrically couple together the pads of the semiconductor chip and the bonding leads of the wiring substrate; and multiple external terminals respectively coupled to the lands of the wiring substrate. The wiring substrate includes a core material having an upper surface positioned on the upper surface side of the wiring substrate and a lower surface positioned on the lower surface side of the wiring substrate. The wiring substrate is a multilayer wiring substrate in which multiple wiring layers and multiple insulating layers are alternately formed both on the upper surface side and the lower surface side of the core material. The bonding leads are formed of part of the uppermost wiring layer of the wiring layers and the lands are formed of part of the lowermost wiring layer of the wiring layers. The core material is a first insulating layer containing fiber and resin.

The insulating layers includes a second insulating layer containing fiber and resin and a third insulating layer lower in fiber content than the first insulating layer and the second insulating layer. The second insulating layer is formed on both the upper surface side and the lower surface side of the core material. The third insulating layer is formed on both the upper surface side and the lower surface side of the core material with the second insulating layer in-between. The uppermost wiring layer and the lowermost wiring layer are respectively formed over the third insulating layers.

The following is a brief description of the gist of effects obtained by the representative elements of the invention laid open in this application:

A wiring substrate is obtained by: forming a second insulating layer containing fiber and resin above and under a core material as a first insulating layer containing fiber and resin; and forming a third insulating layer lower in fiber content than the first insulating layer and the second insulating layer above and under the core material with the second insulating layer in-between. Use of this wiring substrate makes it possible to reduce the mounting height of the semiconductor device.

BRIEF DESCRIPTION OF THE DRAWINGS

FIG. 26 is a sectional view illustrating the wiring substrates for multiple cavity molding illustrated in FIG. 24 with the upper surfaces thereof irradiated with plasma;

DETAILED DESCRIPTION OF THE PREFERRED EMBODIMENTS

Style of Description, Basic Terms, and Usage Thereof in this Specification

The description of embodiments in this specification is divided into multiple sections or the like as required for the sake of convenience. These sections or the like are not independent of or separate from one another unless otherwise explicitly stated. Each section or the like is each part of a single example and one section is the details of part of another or a modification or the like to part or all of another regardless of the order of description. The repetitive description of a similar part will be omitted as a rule. Each constituent element of the embodiments is not indispensable unless otherwise explicitly stated, the number of constituent elements is theoretically limited, or the constituent element is contextually obviously indispensable.

Even when the wording of "X comprised of A" or the like is used in the description of the embodiments with respect to material, composition, or the like, what containing an element other than A as one of major constituent elements is not excluded. This applies unless otherwise explicitly stated or it is contextually obviously excluded. Examples will be taken. With respect to component, the above wording means that "X including A as a main component" or the like. A term of "silicon member" or the like is not limited to members of pure silicon and includes SiGe (silicon germanium) alloys, other multi-element alloys predominantly comprised of silicon, and members containing other additive or the like, needless to add. The terms of gold plate, copper layer, nickel plate, and the like include not only pure ones but also members respectively predominantly comprised of gold, copper, nickel, and the like unless otherwise explicitly stated.

When reference is made to any specific numeric value or quantity, the specific numeric value or quantity may be exceeded or may be underrun. This applies unless otherwise explicitly stated, any other specific numeric value or quantity is theoretically impermissible, or the specific numeric value or quantity contextually may not be exceeded or underrun.

First Embodiment

First, description will be given to the general configuration of a semiconductor device (semiconductor integrated circuit device) 10 in the first embodiment with reference to FIG. 1 to FIG. 3.

Figure 1:
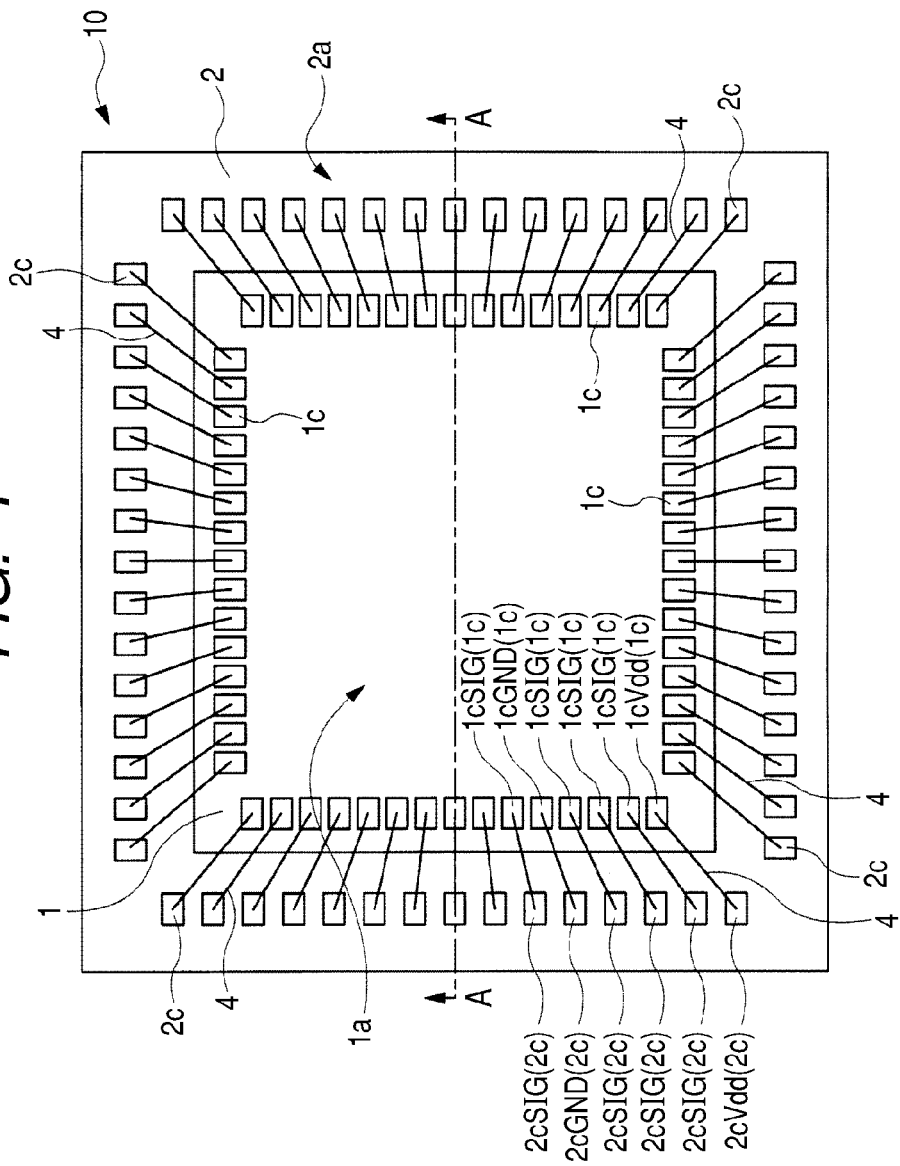
FIG. 1 is a plan view of a semiconductor device in a first embodiment of the invention as viewed from the upper surface side of a wiring substrate where a semiconductor chip is mounted.

FIG. 1 is a plan view of a wiring substrate (board) mounted with a semiconductor chip in the first embodiment as viewed from the upper surface (front face) side; FIG. 2 is a plan view of the wiring substrate illustrated in FIG. 1 as viewed from the lower surface (rear surface) positioned on the opposite side to the upper surface; and FIG. 3 is a sectional view taken along line A-A of FIG. 1. Over the upper surface of the wiring substrate, as illustrated in FIG. 3, an encapsulating body (resin encapsulating body) for encapsulating the semiconductor chip is formed. In FIG. 1, this encapsulating body is intentionally omitted so that the internal configuration is understandable. In the following plan views illustrating a wiring substrate mounted with a semiconductor chip as viewed from the upper surface side, the encapsulating body will be similarly omitted.

Figure 2:
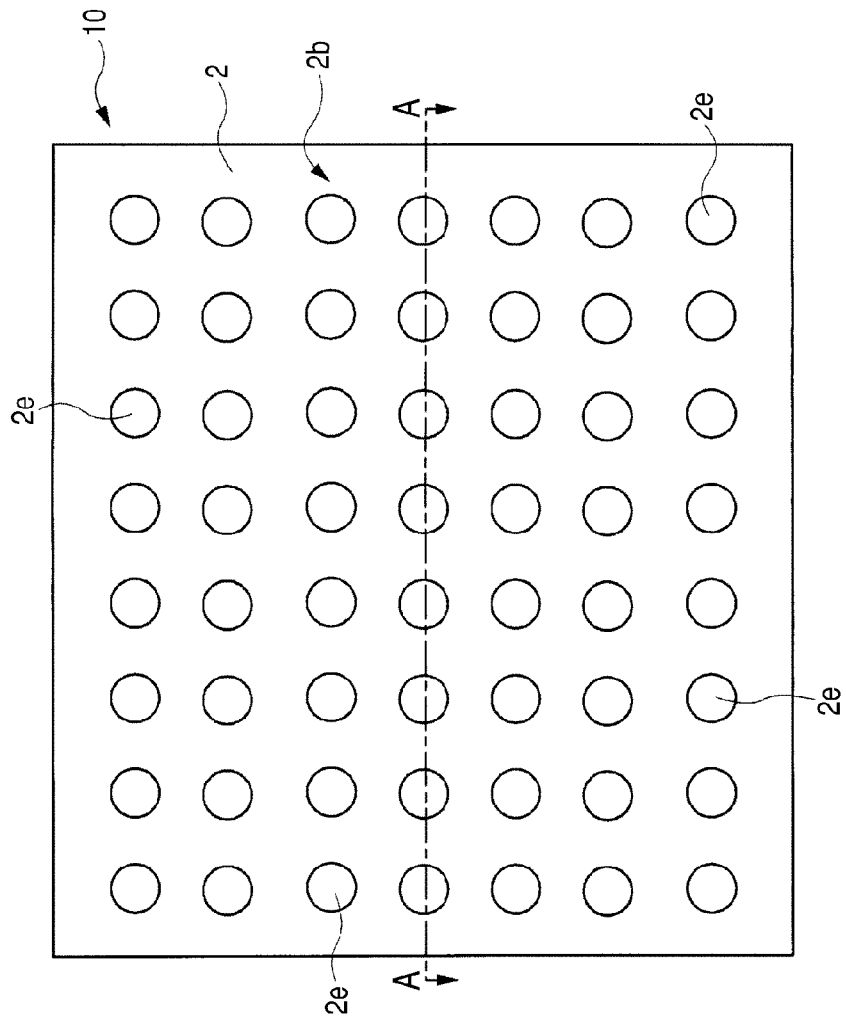
FIG. 2 is a plan view of the wiring substrate illustrated in FIG. 1 as viewed from the lower surface side.
Figure 3:
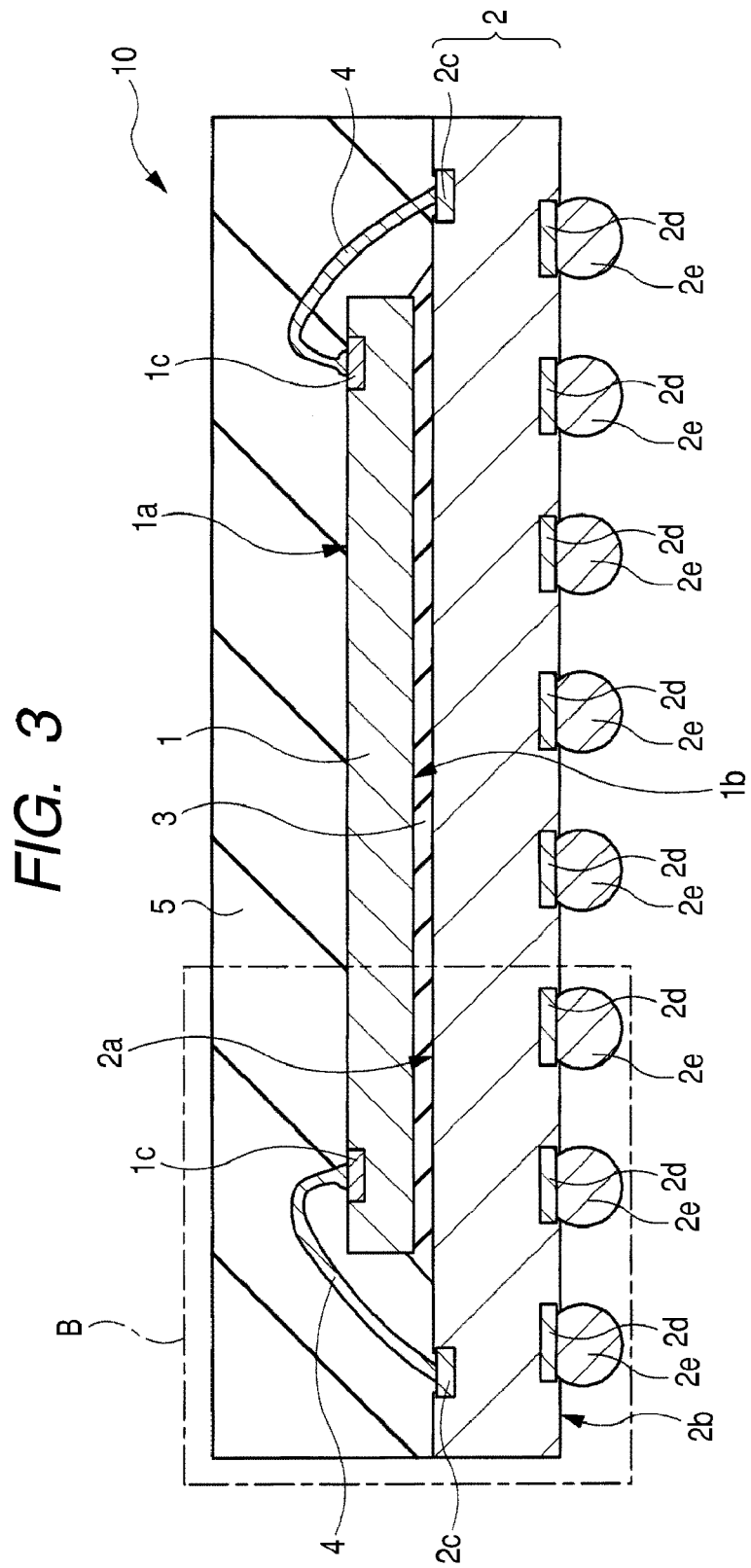
FIG. 3 is a sectional view taken along line A-A of FIG. 1.

As illustrated in FIG. 1 and FIG. 3, the following measure is taken in the semiconductor device 10 in the first embodiment: the semiconductor chip 1 is mounted over the upper surface (front face, first face) 2a of the wiring substrate 2 with adhesive 3 in-between so that the rear surface 1b of the semiconductor chip 1 is opposed to the upper surface 2a of the wiring substrate 2. That is, face-up mounting is implemented. The multiple pads (electrodes) 1c formed in the main surface 1a of the semiconductor chip 1 are respectively electrically coupled with the multiple bonding leads (wire coupling leads) 2c formed over the upper surface 2a of the wiring substrate 2 through multiple wires 4 as conductive members. Over the upper surface 2a of the wiring substrate 2, the encapsulating body (resin encapsulating body) 5 that encapsulates the semiconductor chip 1 and the wires 4 and is formed of resin is formed. In the lower surface (rear surface, second face) 2b of the wiring substrate 2, multiple lands (electrodes, pads) 2d are formed as illustrated in FIG. 3. These lands 2d are respectively joined with multiple bump electrodes (external terminals) 2e that form external terminals of the semiconductor device 10. As illustrated in FIG. 2, the bump electrodes 2e are arranged in a matrix pattern in the lower surface 2b of the wiring substrate 2 having a rectangular planar shape. That is, the bump electrodes 2e are formed not only in the peripheral portion of the wiring substrate 2 but also in the central portion of the lower surface 2b of the wiring substrate 2.

Hereafter, detailed description will be given to each constituent element (semiconductor chip 1, wiring substrate 2, and the like).

As illustrated in FIG. 1, the semiconductor chip 1 has a rectangular planar shape in the direction intersecting the direction of thickness and is square in this embodiment. For the material of the semiconductor chip 1, silicon (Si) is used. As illustrated in FIG. 3, the semiconductor chip 1 has a main surface 1a and a rear surface 1b positioned on the opposite side to the main surface. In the main surface 1a of the semiconductor chip 1, a computation circuit is formed though no shown in the drawings. The computation circuit converts signals (input/output data) supplied from, for example, an external device (external LSI) placed in proximity to the semiconductor device 10.

In the main surface of the semiconductor chip 1, multiple pads 1c are formed along each side. These pads 1c include: a first interfacing pad (first external interfacing pad) 1cSIG that is electrically coupled with the above-mentioned computation circuit and to which signals supplied from the external device are inputted; a second interfacing pad (second external interfacing pad) 1cSIG that is electrically coupled with the above-mentioned computation circuit and to which signals converted at the computation circuit are outputted; a power supply potential pad 1cVdd to which power supply potential supplied from the external device is inputted; and a reference potential pad 1cGND to which reference potential (GND potential) supplied from the external device is inputted. The interfacing pad 1cSIG is electrically coupled to an interfacing bonding lead 2cSIG; the power supply potential pad 1cVdd is electrically coupled to a power supply potential bonding lead 2cVdd; and the reference potential pad 1cGND is electrically coupled to a reference potential bonding lead 2cGND. These pads and bonding leads are respectively coupled together through wires 4. Each pad 1c is formed of metal and is comprised of, for example, aluminum (Al) in this embodiment.

As illustrated in FIG. 1 and FIG. 2, the wiring substrate 2 has a rectangular planar shape in the direction intersecting the direction of thickness and is square in this embodiment. As illustrated in FIG. 3, the wiring substrate 2 has an upper surface 2a and a lower surface 2b positioned on the opposite side to the upper surface 2a. As illustrated in FIG. 1 and FIG. 3, the upper surface 2a of the wiring substrate 2 is provided in the central portion thereof with an area for mounting the semiconductor chip 1 (chip placement area). Around this area, the bonding leads 2c are formed along each side of the wiring substrate 2.

In the lower surface 2b of the wiring substrate 2, the lands 2d are arranged in a matrix pattern and these lands 2d are coupled (joined) with the bump electrodes 2e as external terminals. The bonding leads 2c and the lands 2d are formed of metal and are comprised of, for example, copper (Cu) in this embodiment. The bump electrodes 2e are so-called lead-free solder that contains substantially no lead (Pb) and are comprised of, for example, only Sn (tin), Sn (tin)-Bi (bismuth), Sn (tin)-Ag (silver)-Cu (copper), or the like. The lead-free solder cited here refers to solder with a lead (Pb) content of 0.1 wt % or below and this content is stipulated as a basis of the directive on the RoHS (Restriction of Hazardous Substances).

The wiring substrate 2 has a core material (core layer, first insulating layer) 2f. The wiring substrate is a multilayer wiring substrate in which multiple wiring layers 2g and multiple insulating layers 2h are alternately laminated both on the upper surface (third face) 2fa side and on the lower surface (fourth face) 2fb side of the core material 2f. Detailed description will be given to the configuration of this multilayer wiring substrate with reference to FIG. 4.

Figure 4:
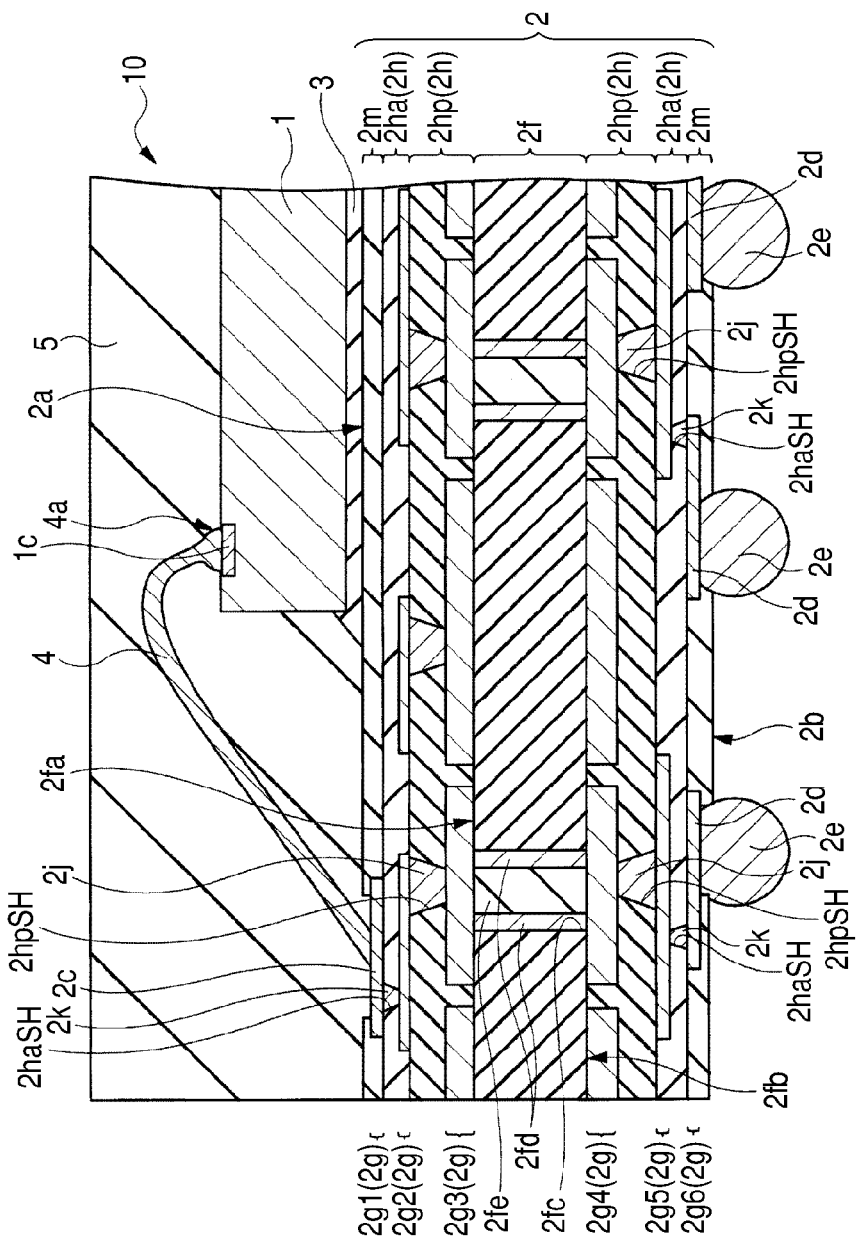
FIG. 4 is an enlarged sectional view of B site in FIG. 3.

FIG. 4 is an enlarged sectional view of B site in FIG. 3. The wiring substrate 2 in this embodiment is a multilayer wiring substrate having three wiring layers 2g formed on each of the upper surfaces 2fa side and the lower surface 2fb side of the core material 2f, six wiring layers 2g in total. The above-mentioned bonding leads 2c are formed of part of the uppermost wiring layer 2g1 of the wiring layers 2g. (The uppermost wiring layer is the wiring layer farthest from the upper surface 2fa of the core material 2f and is also referred to as first wiring layer or chip placement surface wiring layer.) Meanwhile, the above-mentioned lands 2d are formed of part of the lowermost wiring layer 2g6 of the wiring layers 2g. (The lowermost wiring layer is the wiring layer farthest from the lower surface 2fb of the core material 2f and is also referred to as sixth wiring layer or rear surface wiring layer.)

The core material (core layer) 2f is an insulating layer (first insulating layer, first insulating film) that contains fiber, such as glass cloth and filler, and resin and is designated as so-called prepreg material. In this embodiment, the core material has a thickness of, for example, 100 to 400 µm.

The insulating layers 2h include: insulating layers (second insulating layers, second insulating films) 2hp that are formed above and under the core material (first insulating layer) 2f, contain fiber, such as glass cloth and filler, and resin, and are similarly designated as prepreg material; and insulating layers (third insulating layers, third insulating films) 2ha that are formed above and under the core material 2f with the second insulating layers 2hp in-between, do substantially not contain the above-mentioned fiber, and is comprised only of resin. With respect to the third insulating layers 2ha, it has been described that they do substantially not contain the above-mentioned fiber and are comprised only of resin but, in reality, some include a slight amount of fiber. When they are roughly discriminated from the above-mentioned prepreg material, those containing a smaller amount of fiber than the prepreg material does are classified under this category of the material used for the third insulating layers. The thickness of the second insulating layers 2hp is smaller than the thickness of the core material (first insulating layer) 2f and is, for example, 40 to 50 µm in this embodiment. The thickness of the third insulating layers 2ha is smaller than the thickness of the core material 2f and that of the second insulating layers 2hp and is, for example, 30 µm in this embodiment.

Figure 5:
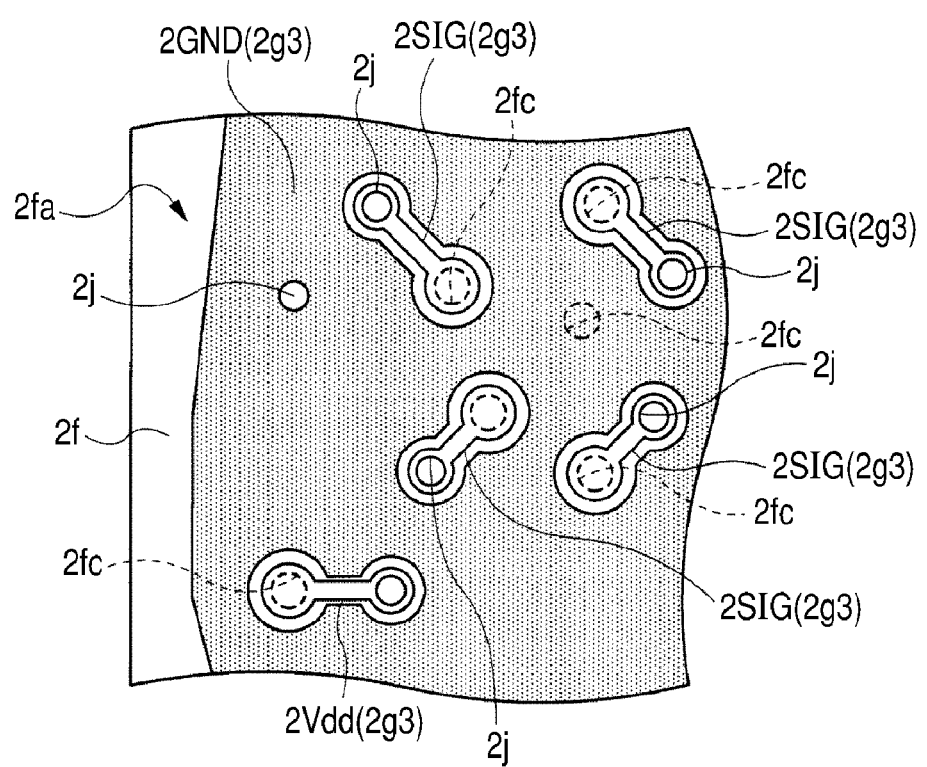
FIG. 5 is a plan view illustrating part of the third wiring layer of the wiring substrate illustrated in FIG. 1 to FIG. 4.
Figure 6:
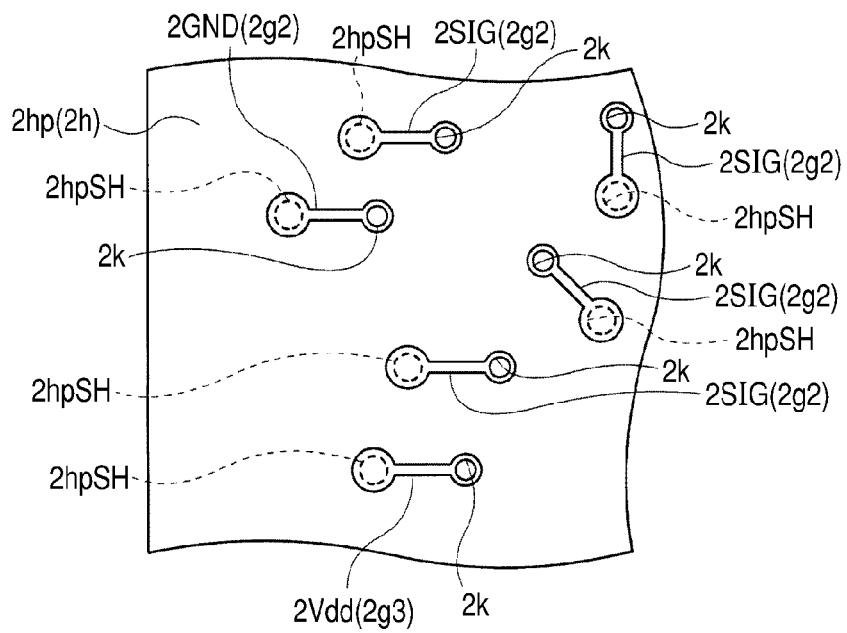
FIG. 6 is a plan view illustrating part of the second wiring layer of the wiring substrate illustrated in FIG. 1 to FIG. 4.
Figure 7:
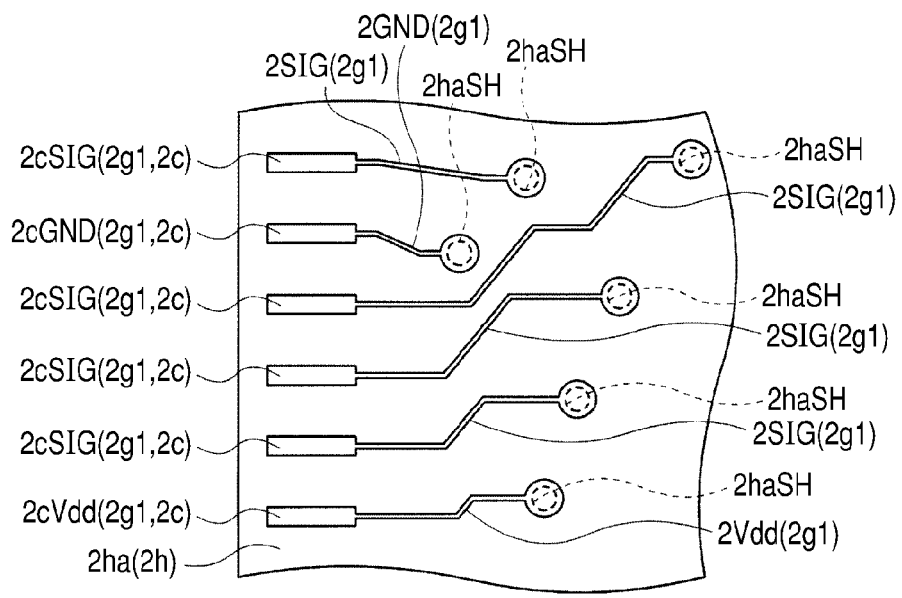
FIG. 7 is a plan view illustrating part of the first wiring layer of the wiring substrate illustrated in FIG. 1 to FIG. 4.
Figure 8:
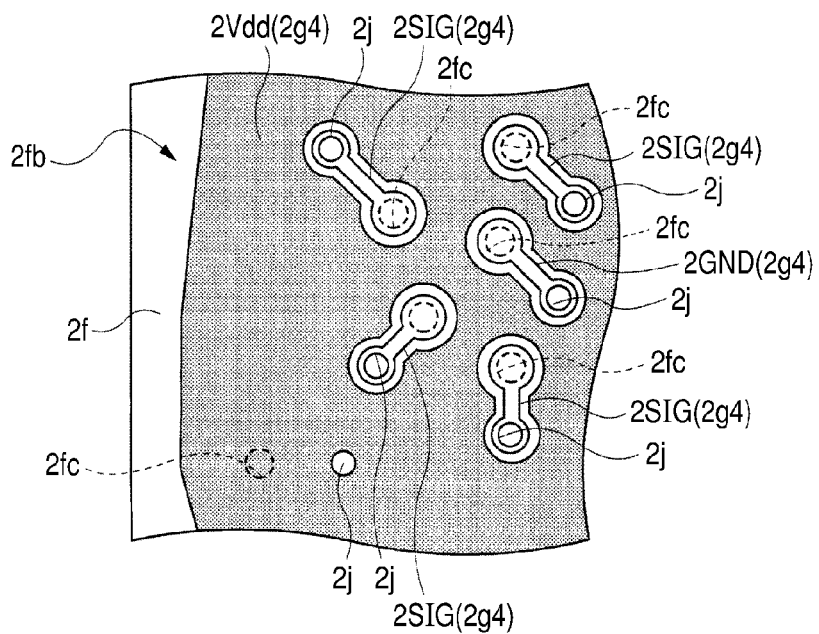
FIG. 8 is a plan view illustrating part of the fourth wiring layer of the wiring substrate illustrated in FIG. 1 to FIG. 4.
Figure 9:
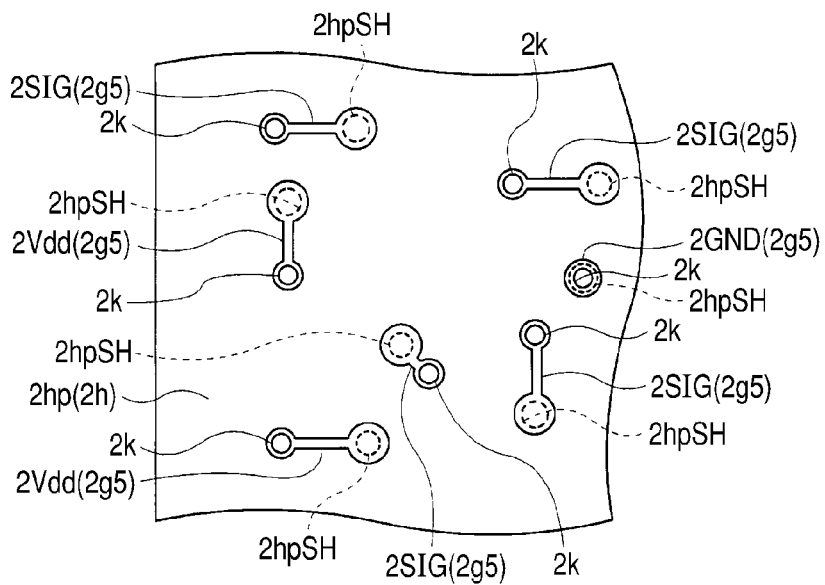
FIG. 9 is a plan view illustrating part of the fifth wiring layer of the wiring substrate illustrated in FIG. 1 to FIG. 4.
Figure 10:
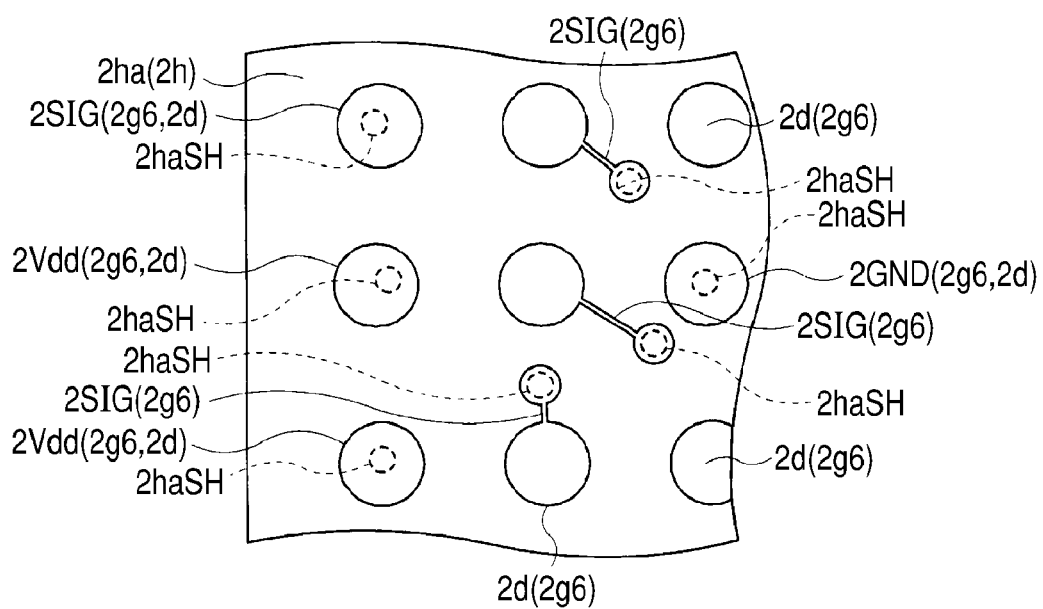
FIG. 10 is a plan view illustrating part of the sixth wiring layer of the wiring substrate illustrated in FIG. 1 to FIG. 4.

Detailed description will be given to the arrangement relation (order of lamination) between the wiring layers and the insulating layers with reference to FIGS. 4 to 10. FIG. 5 is a partial enlarged plan view of the third wiring layer of the wiring substrate illustrated in FIG. 1 to FIG. 4; FIG. 6 is a partial enlarged plan view of the second wiring layer of the wiring substrate illustrated in FIG. 1 to FIG. 4; FIG. 7 is a partial enlarged plan view of the first wiring layer of the wiring substrate illustrated in FIG. 1 to FIG. 4; FIG. 8 is a partial enlarged plan view of the fourth wiring layer of the wiring substrate illustrated in FIG. 1 to FIG. 4; FIG. 9 is a partial enlarged plan view of the fifth wiring layer of the wiring substrate illustrated in FIG. 1 to FIG. 4; and FIG. 10 is a partial enlarged plan view of the sixth wiring layer of the wiring substrate illustrated in FIG. 1 to FIG. 4. FIG. 5, FIG. 6, and FIG. 7 depict the planes of the respective wiring layers on the upper surface side and FIG. 8, FIG. 9, and FIG. 10 depict the planes of the respective wiring layers on the lower surface side.

Over the upper surface (front face, third face) 2fa of the core material (core layer, first insulating layer) 2f, there is formed a wiring layer (first upper surface-side wiring layer) 2g3 having multiple wiring patterns illustrated in FIG. 4 and FIG. 5. This wiring layer 2g3 is equivalent to the third wiring layer in the six-layer wiring substrate.

Over the third wiring layer 2g3, an insulating layer (second insulating layer) 2hp containing fiber and resin is formed so that part of the third wiring layer 2g3 (part of each of the wiring patterns) is exposed. Part of the third wiring layer 2g3 is exposed from openings (second insulating layer openings) 2hpSH formed in this insulating layer (second insulating layer) 2hp.

Over the second insulating layer 2hp, there is formed a wiring layer (second upper surface-side wiring layer) 2g2 having multiple wiring patterns illustrated in FIG. 6. This wiring layer 2g2 is equivalent to the second wiring layer 2g2 in the six-layer wiring substrate. The second wiring layer 2g2 is electrically coupled with the third wiring layer 2g3 through wirings (metal films) 2j formed in the openings 2hpSH in the second insulating layer 2hp.

Over the second wiring layer 2g2, an insulating layer (third insulating layer) 2ha is formed so that part of the second wiring layer 2g2 (part of each of the wiring patterns) is exposed. This insulating layer 2ha does substantially not contain fiber and is comprised only of resin. Part of the second wiring layer 2g2 is exposed from openings (third insulating layer openings) 2haSH formed in the insulating layer (third insulating layer) 2ha. The third insulating layer 2ha contains almost no fiber and is comprised substantially only of resin; therefore, it is easier to process than the second insulating layer 2hp containing more fiber than the third insulating layer 2ha does. Therefore, it is possible to make the diameter of the openings (third insulating layer openings) 2haSH formed in the third insulating layer 2ha smaller than the diameter of the openings (second insulating layer openings) 2hpSH formed in the second insulating layer 2hp.

Over the third insulating layer 2ha, there is formed a wiring layer (third upper surface-side wiring layer) 2g1 having multiple wiring patterns illustrated in FIG. 7. This wiring layer 2g1 is equivalent to the first (uppermost) wiring layer 2g1 in the six-layer wiring substrate. The first wiring layer 2g1 is electrically coupled with the second wiring layer through wirings (metal films) 2k formed in openings 2haSH in the third insulating layer 2ha. (Refer to FIG. 6 for the wirings 2k.)

Over the first wiring layer 2g1, there is formed an insulating resin film (solder resist film) 2m as a protective film. (Refer to FIG. 4.) The insulating resin film is so formed that part of the first wiring layer 2g1 (part of each of the wiring patterns) is exposed. Each of the above-mentioned bonding leads 2c is part of the wiring layer 2g1 (wiring patterns) formed in the first layer and is equivalent to part exposed from the resin film 2m.

The configuration of the lower surface (rear surface) 2fb side of the core material 2f is the same as the configuration of the upper surface 2fa side of the core material 2f. Over the lower surface (rear surface, fourth face) 2fb of the core material (core layer, first insulating layer) 2f, there is formed a wiring layer (first lower surface-side wiring layer) 2g4 having multiple wiring patterns illustrated in FIG. 4 and FIG. 8. This wiring layer 2g4 is equivalent to the fourth wiring layer 2g4 in the six-layer wiring substrate. The fourth wiring layer 2g4 is electrically coupled with the third wiring layer 2g3 through wirings (through hole wirings) 2fd formed in through holes (vias) 2fc extending to the upper and lower surfaces 2fa, 2fb of the core material 2f. The diameter of the through holes 2fc is larger than the diameter of the openings formed in the individual insulating layers (second insulating layer, third insulating layer) 2hp, 2ha; therefore, the interior of the through holes is filled with resin (through hole filling resin) 2fe.

Over the fourth wiring layer 2g4, an insulating layer (second insulating layer) 2hp containing fiber and resin is formed so that part of the fourth wiring layer 2g4 (part of each of the wiring patterns) is exposed. ("Over the fourth wiring layer" refers to the lower surface side of the fourth wiring layer 2g4 placed on the lower surface 2fb side of the core material 2f.) Part of the fourth wiring layer 2g4 is exposed from openings (second insulating layer openings) 2hpSH formed in this insulating layer (second insulating layer) 2hp.

Over the second insulating layer 2hp, there is formed a wiring layer (second lower surface-side wiring layer) 2g5 having multiple wiring patterns illustrated in FIG. 9. ("Over the second insulating layer" refers to the lower surface side of the second insulating layer 2hp placed on the lower surface 2fb side of the core material 2f.) This wiring layer 2g5 is equivalent to the fifth wiring layer 2g5 in the six-layer wiring substrate. The fifth wiring layer 2g5 is electrically coupled with the fourth wiring layer 2g4 through wirings (metal films) 2j formed in the openings 2hpSH in the second insulating layer 2hp.

Over the fifth wiring layer 2g5, an insulating layer (third insulating layer) 2ha is formed so that part of the fifth wiring layer 2g5 (part of each of the wiring patterns) is exposed. ("Over the fifth wiring layer" refers to the lower surface side of the fifth wiring layer 2g5 placed on the lower surface 2fb side of the core material 2f.) The insulating layer does substantially not contain fiber and is comprised only of resin. Part of the fifth wiring layer 2g5 is exposed from openings (third insulating layer openings) 2haSH formed in this insulating layer (third insulating layer) 2ha.

Over the third insulating layer 2ha, there is formed a wiring layer (third lower surface-side wiring layer) 2g6 having multiple wiring patterns illustrated in FIG. 10. ("Over the third insulating layer" refers to the lower surface side of the third insulating layer 2ha placed on the lower surface 2fb side of the core material 2f.) This wiring layer 2g6 is equivalent to the sixth (lowermost) wiring layer 2g6 in the six-layer wiring substrate. The sixth wiring layer is electrically coupled with the fifth wiring layer through wirings (metal films) 2k formed in openings in the third insulating layer.

Over the sixth wiring layer 2g6, there is formed an insulating resin film (solder resist film) 2m is formed as a protective film so that part of the sixth wiring layer 2g6 (part of each of the wiring patterns) is exposed. (Refer to FIG. 4.) ("Over the sixth wiring layer" refers to the lower surface side of the sixth wiring layer 2g6 placed on the lower surface 2fb side of the core material 2f.) Each of the above-mentioned lands 2d is part of the wiring patterns formed in the sixth layer and is equivalent to part exposed from the resin film 2m.

The individual wiring layers 2g are formed by the semi-additive process illustrated in FIG. 11 to FIG. 15. Hereafter, detailed description will be given to this procedure. The drawings from FIG. 11 to FIG. 15 are enlarged sectional views explaining the method for forming each wiring layer in this embodiment.

Figure 11:
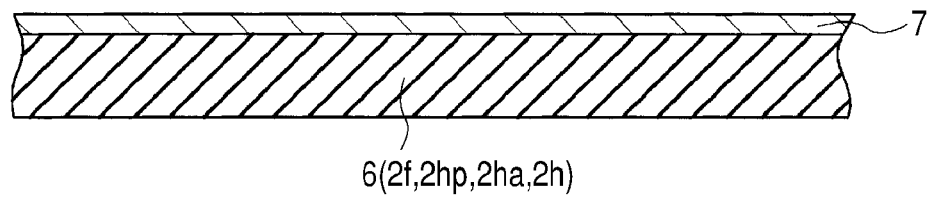
FIG. 11 is a sectional view illustrating how a seed layer is formed over the upper surface of a core material.

First, a base material (first insulating layer, second insulating layer, third insulating layer) 6 with a seed layer (metal thin film) 7 formed over one face thereof as illustrated in FIG. 11 is prepared. (In this description, a base material with a seed layer formed over the upper surface thereof will be taken as an example.)

Figure 12:
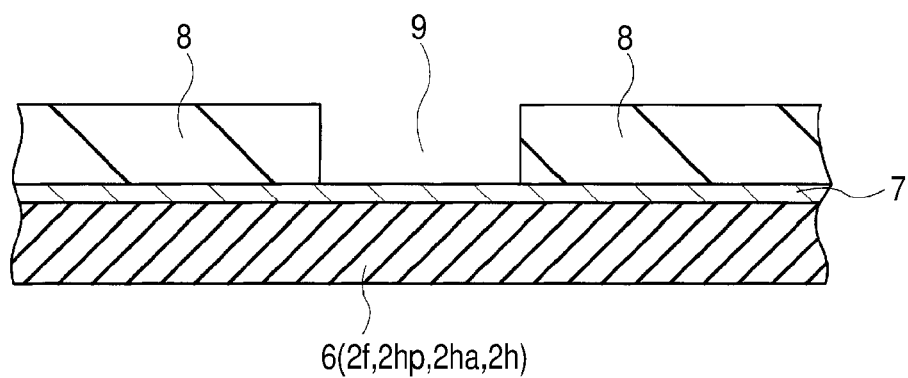
FIG. 12 is a sectional view illustrating how a resist film for forming a wiring pattern is formed over the seed layer.

A resist film 8 is formed over the seed layer 7 and then an opening 9 is formed in the resist film 8 so that only a portion where a wiring pattern is to be formed is exposed as illustrated in FIG. 12.

Figure 13:
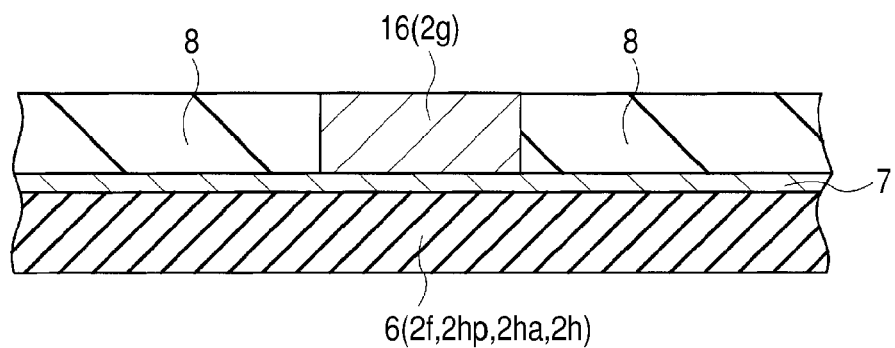
FIG. 13 is a sectional view illustrating how a metal film to be the wiring pattern is formed in an opening in the resist film.

A metal film (electrolytic plating film) 16 to be a wiring layer 2g is formed in the opening 9 in the resist film 8 by electrolytic plating as illustrated in FIG. 13.

Figure 14:
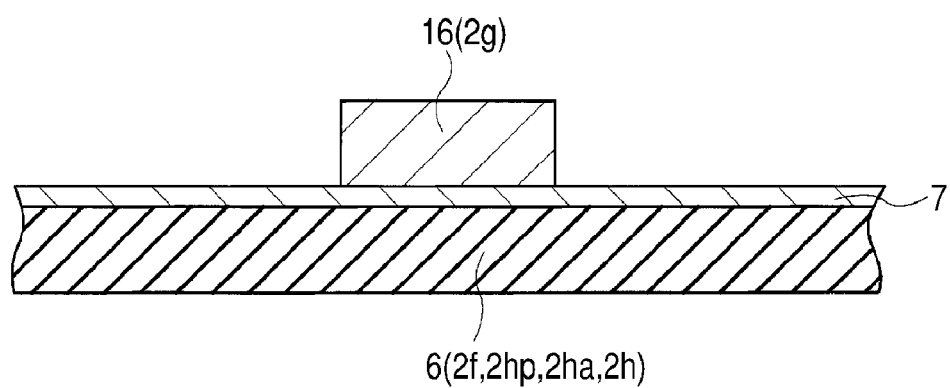
FIG. 14 is a sectional view illustrating how the resist film is removed.

The resist film 8 is removed as illustrated in FIG. 14.

Figure 15:
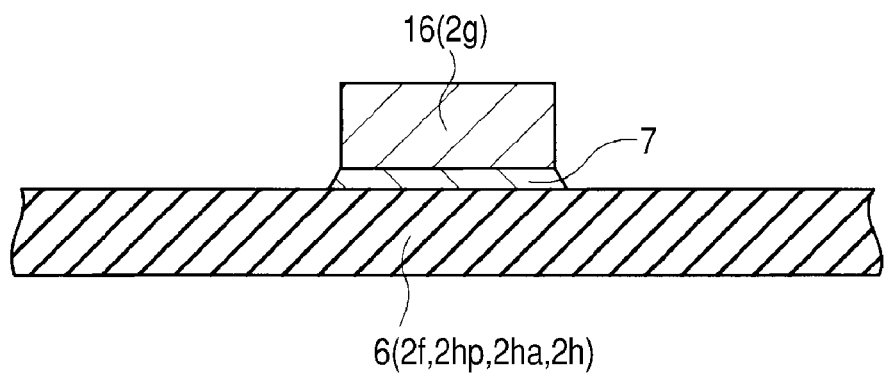
FIG. 15 is a sectional view illustrating how an unnecessary portion of the seed layer is removed.

Finally, portions unnecessary for the wiring pattern (portions not covered with the metal film 16) are removed by etching as illustrated in FIG. 15 and the wiring patterns 2SIG, 2Vdd, 2GND illustrated in FIG. 5 to FIG. 10 are thereby formed. Since part of the seed layer 7 is removed by etching at this time, the side faces of the seed layer film 7 are not completely perpendicular and are slightly sloped.

As the thickness of the seed layer 7 is increased, the etching time is lengthened when an excess portion of the seed layer 7 is removed by etching. When the etching time is lengthened, part of the metal film 16 or part of the seed layer 7 covered with the metal film 16 may also be removed. Therefore, to prevent it from becoming impossible to form wiring patterns with a predetermined line width, it is required to increase the line width of the wiring patterns beforehand when the thickness of the seed layer 7 is large. This makes it possible to nestle the line width of each wiring pattern into a predetermined width. However, when the line width of each wiring pattern is increased beforehand allowing for the etching process as mentioned above, a new problem of difficulty in reducing the placement spacing between wiring patterns arises. Therefore, it is desirable to reduce the thickness of the seed layer 7 as much as possible. From this viewpoint, the following measure is preferable to sticking metal foil of Cu to a base material 6 and taking it as a seed layer 7 in that a thin seed layer 7 can be formed: forming a metal thin film (metal film 6) of Cu or the like over the front face of a base material 6 by electroless plating. This is because the thickness of the metal film 6 can be made thinner by electroless plating than by sticking metal foil.

In the third and fourth wiring layers 2g3, 2g4, the following is implemented with respect to the above-mentioned pads 1c of the semiconductor chip 1: the number of routed second and third wiring patterns (power supply potential wiring pattern, reference potential wiring pattern) 2Vdd, 2GND is larger than the number of routed first wiring patterns (signaling wiring patterns) 2SIG. The second and third wiring patterns 2Vdd, 2GND are electrically coupled with a power supply potential pad 1cVdd or a reference potential pad 1cGND. The first wiring patterns 2SIG are electrically coupled with interfacing pads (first interfacing pad, second interfacing pad) 1cSIG that become communication paths mainly for signals. That is, the total area of the second and third wiring patterns 2Vdd, 2GND electrically coupled with a power supply potential pad 1cVdd or a reference potential pad 1cGND is larger than the total area of the first wiring patterns 2SIG electrically coupled with the interfacing pads 1cSIG.

The reason for this is as follows. As mentioned above, for wiring patterns formed over a prepreg material (core material 2f or second insulating layers 2hp), a method of sticking metal foil is used to form a seed layer 7. For this reason, it is difficult to reduce the pitch of wiring patterns as compared with wiring patterns formed over the third insulating layers 2ha containing no fiber to which a different seed layer 7 formation method (electroless plating) can be applied.

However, to stably drive the computation circuit formed in the main surface 1a of the semiconductor chip 1, as much power supply potential and reference potential as possible only have to be supplied. Therefore, it is more desirable to form one large-width wiring pattern, for example, as illustrated in FIG. 5 and FIG. 8 than to form multiple wiring patterns and separate a current path (path for supplying potential).

In this embodiment, for this reason, current paths for power supply potential or reference potential are preferentially routed in the third and fourth wiring layers 2g3, 2g4 where it is especially difficult to reduce the pitch because of the problem of processing accuracy. When the potential (power supply potential or reference potential) is identical, it is unnecessary to specially divide a wiring pattern. As illustrated in FIG. 5 and FIG. 8, therefore, the following measure is taken with respect to the second and third wiring patterns 2Vdd, 2GND for supplying power supply potential or reference potential: the second and third wiring patterns 2Vdd, 2GND are formed in the shape of plane thicker (larger) than the width (area) of the first wiring patterns 2SIG that are electrically coupled with interfacing pads 1cSIG and are used to supply signals.

In the first and sixth wiring layers 2g1, 2g6, the following is implemented with respect to the above-mentioned pads 1c of the semiconductor chip 1: the number of routed first wiring patterns 2SIG electrically coupled with interfacing pads 1cSIG is larger than the number of routed second and third wiring patterns 2Vdd, 2GND electrically coupled with a power supply potential pad 1cVdd or a reference potential pad 1cGND. That is, the total area of the first wiring patterns 2SIG electrically coupled with interfacing pads 1cSIG is larger than the total area of the second and third wiring patterns 2Vdd, 2GND electrically coupled with a power supply potential pad 1cVdd or a reference potential pad 1cGND.

The reason for this is as follows. The pitch of wiring patterns formed over an insulating layer (third insulating layer) 2ha that contains almost no fiber and is comprised substantially only of resin can be reduced unlike the following pitch: the pitch of wiring patterns formed over a prepreg material (core material 2f or second insulating layers 2hp).

As mentioned above, the pitch of wiring patterns formed over the third insulating layers 2ha that contain almost no fiber and are comprised substantially only of resin can be made smaller than the pitch of wiring patterns formed over a prepreg material. The reason for this is as follows:

The third insulating layers 2ha that contain almost no fiber and are comprised substantially only of resin contain almost no fiber, such as glass cloth or filler. For this reason, openings 2haSH that form paths for electrical coupling with the wiring layers 2g1, 2g2 (or the wiring layers 2g5, 2g6) formed above and under the third insulating layers 2ha can be formed in a desired size. Meanwhile, the prepreg material contains not only resin but also fiber. The fiber interferes when the openings 2hpSH are formed. For this reason, the openings must be formed with a diameter larger than the desired diameter with the removal of the fiber taken into account. That is, the phenomenon illustrated in FIG. 6 and FIG. 9 occurs. Specifically, the diameter of each opening (via) 2hpSH formed in the prepreg material becomes larger than the diameter of each opening 2haSH formed in an insulating layer that contains almost no fiber and is comprised substantially only of resin. This is one of the reasons why a difference is produced in the pitch of wiring patterns.

The second reason is as follows. In case of the third insulating layers 2ha that contain almost no fiber and are comprised substantially only of resin, the front faces of the third insulating layers 2ha become substantially flat since almost no fiber is contained. (This flat state is a state in which the planarity of the front faces of the third insulating layers is higher than the planarity of the front face of the prepreg material.) For this reason, the seed layers 7 for forming the wiring layers 2g1, 2g6 can be formed by electroless plating. The seed layers 7 formed by electroless plating can be formed over the third insulating layers 2ha by crystal grain and thus the film thickness of the seed layers 7 can be made smaller than the thickness of metal foil formed over the prepreg material. When the film thickness of each seed layer 7 is small, the side faces of the seed layer after an etching process are substantially perpendicular and thus the width of wiring patterns can be reduced. In addition, any unnecessary portion of each seed layer 7 (the seed layer 7 in an area not covered with the metal film 16) can be removed in a short time during an etching process by reducing the film thickness of the seed layer 7. Therefore, it is unnecessary to form wiring patterns with a width larger than a predetermined width allowing for etching. As a result, the pitch of adjacently arranged wiring patterns can be reduced.

In the semiconductor device 1 in the first embodiment, as mentioned above, the multilayer wiring substrate 2 comprised of the following is used: the core material (first insulating layer) 2f that contains fiber, such as glass cloth and filler, and resin and is designated as so-called prepreg material; the insulating layers (second insulating layers) 2hp that similarly contain fiber, such as glass cloth and filler, and resin and is designated as prepreg material; and the insulating layers (third insulating layers) 2ha that do substantially not contain the above-mentioned fiber and are comprised substantially only of resin. For this reason, the strength (hardness) of the wiring substrate 2 can be ensured even though the thickness of the wiring substrate 2 is reduced. That is, it is possible to ensure a predetermined strength (hardness) and further reduce the mounting height of the semiconductor device. In the wiring substrate 2 in the first embodiment, substantially the same level of strength (hardness) as that of a wiring substrate in a comparative example (not shown) can be ensured. In this wiring substrate in the comparative example, a prepreg material is not used for the second insulating layers 2hp unlike the example in FIG. 4 and the second insulating layers 2hp and the third insulating layers 2ha are comprised of insulating layers that do substantially not contain fiber and are comprised substantially only of resin. The above level of strength (hardness) can be ensured even though the thickness of the wiring substrate 2 is reduced to approximately ⅔ of the thickness of the wiring substrate in the comparative example.

The semiconductor device 1 in the first embodiment uses the wiring substrate 2 in which the following is implemented: the thickness of the second insulating layers 2hp is made smaller than the thickness of the first insulating layer (core material 2*f*) and the thickness of the third insulating layers 2*ha* is made smaller than the thickness of the second insulating layers 2*hp*. Therefore, the strength (hardness) of the wiring substrate 2 can be ensured even though the thickness of the wiring substrate 2 is further reduced and thus the mounting height of the semiconductor device 10 can be further reduced.

The semiconductor device 1 in the first embodiment uses the wiring substrate 2 in which the following is implemented: the second insulating layer 2*hp* comprised of prepreg material is formed above and under the core material (first insulating layer) 2*f* similarly comprised of prepreg material; and the third insulating layer 2*ha* comprised substantially only of resin is formed above and under the core material with the second insulating layers 2*hp* in-between. Therefore, the seed layers 7 for the bonding leads 2*c* or the lands 2*d* formed in the uppermost layer (first layer) or the lowermost layer (sixth layer) can be formed by electroless plating. As a result, the pitch thereof can be made smaller than the pitch of wiring patterns formed over prepreg material and thus it is possible to cope with increase in the number of pins in association with the enhancement of functionality of semiconductor devices 10.

In the wiring substrate 2 of the semiconductor device 10 in the first embodiment, current paths (first wiring patterns 2SIG) for supplying signals that must be divided and arranged are preferentially routed over the third insulating layers 2*ha* that can accommodate reduction in pitch. The current paths (second wiring patterns 2Vdd, third wiring patterns 2GND) for power supply potential or reference potential may be formed as one large-width wiring pattern. These current paths are preferentially routed over the second insulating layers 2*hp* where it is more difficult to reduce a pitch than in the third insulating layers 2*ha*. For this reason, even when the number of pads is of the semiconductor chip 1 mounted over the upper surface 2*a* of the wiring substrate 2 is increased, the following can be implemented: multiple different types of current paths (wiring patterns) can be efficiently routed with the limited number of wiring layers and the thickness and size of the wiring substrate 2 can be reduced. As a result, it is possible not only to reduce the mounting height of the semiconductor device 10 but also to achieve downsizing of the semiconductor device 10.

The semiconductor device 10 in the first embodiment uses the wiring substrate 2 in which the same number (three) of wiring layers and insulating layers are formed on the front side and the rear side of the core material. Therefore, the planarity of the wiring substrate 2 can be maintained. Further, it is possible to place the semiconductor chip 1 without producing a gap between the rear surface 1*b* of the semiconductor chip 1 and the upper surface 2*a* of the wiring substrate 2 during the semiconductor chip 1 placement process.

In the semiconductor device 10 in the first embodiment, the wiring patterns (second wiring patterns 2Vdd, third wiring patterns 2GND) for supplying power supply potential or reference potential are preferentially routed in the following wiring layers: the third and fourth wiring layers 2*g*3, 2*g*4 thicker than the first and sixth wiring layers 2*g*1, 2*g*6 having a seed layer 7 formed by electroless plating. Therefore, the third and fourth wiring layers 2*g*3, 2*g*4 that form paths for supplying power supply potential or reference potential are lower in resistance value than the first and sixth wiring layers 2*g*1, 2*g*6. For this reason, it is possible to stabilize power supply potential or reference potential and enhance the reliability of the semiconductor device 10.

In the semiconductor device 10 in the first embodiment, the prepreg materials (second insulating layers 2*hp*) covering the third and fourth wiring layers 2*g*3, 2*g*4 also contain fiber. For this reason, the permittivity thereof is higher than that of the insulating layers (third insulating layers 2*ha*) covering the second and fifth wiring layers 2*g*2, 2*g*5. For this reason, parasitic capacitance is produced in the prepreg materials if the second or fifth wiring layer (wiring patterns) 2*g*2, 2*g*5 is placed in the following position: a position where it planarly overlaps with the third or fourth wiring layer (wiring patterns) 2*g*3, 2*g*4 through which power supply potential or reference potential is supplied.

As mentioned above, there is formed the computation circuit in the main surface 1*a* of the semiconductor chip 1. This computation circuit is supplied with data signals, command signals, address signals, clock signals, and the like from the external device through the wiring patterns. Among them, the clock signals are especially susceptible to noise and parasitic capacitance. Consequently, it is desirable that the wiring patterns 2CL for clock signals should be formed so that each of them does not planarly overlap with a wiring pattern through which power supply potential or reference potential is supplied. (Refer to FIG. 16 for the wiring patterns 2CL for clock signals.)

Figure 16:
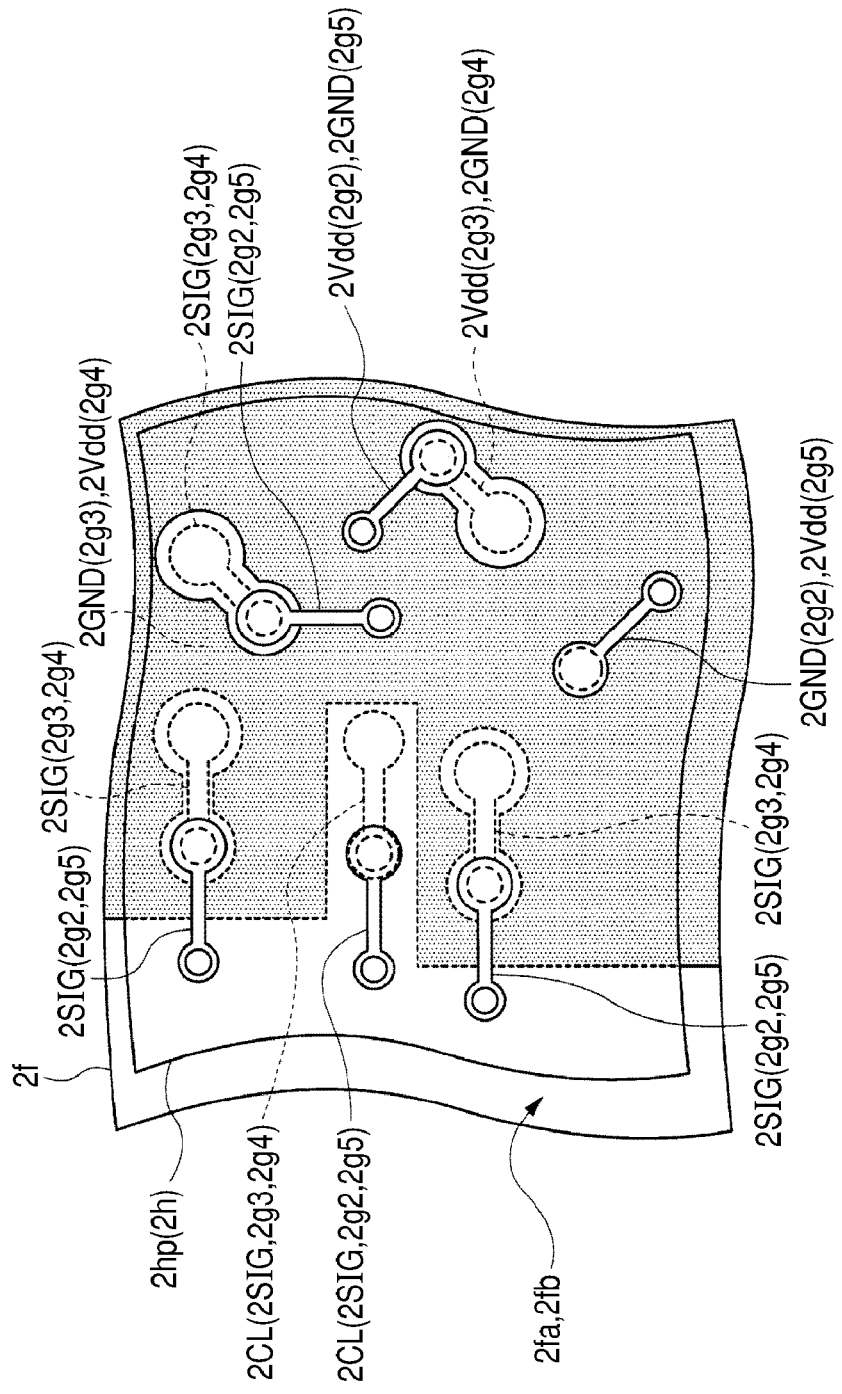
FIG. 16 is a plan view illustrating wiring patterns in the second layer and wiring patterns in the third layer (or wiring patterns in the fifth layer and wiring patterns in the fourth layer) overlapped in the wiring substrate illustrated in FIG. 1 to FIG. 4.

FIG. 16 is a plan view illustrating wiring patterns in the second layer and wiring patterns in the third layer (or wiring patterns in the fifth layer and wiring patterns in the fourth layer) that overlap with each other in the first embodiment. In the first embodiment, as illustrated in FIG. 16, for example, the following measure is taken in the wiring patterns in the third (or fourth) layer formed in the shape of plane: wiring patterns (for example, second wiring patterns 2Vdd or third wiring patterns 2GND) are not formed in an area where they planarly overlap with a wiring pattern 2CL for clock signals. This makes it possible to enhance the reliability of the semiconductor device 10.

In the semiconductor device 10 in the first embodiment, the semiconductor chip 1 is covered with the encapsulating body 5. Therefore, it is possible to protect the semiconductor chip 1 and enhance the reliability of the semiconductor device 10.

In the semiconductor device 10 in the first embodiment, the encapsulating body 5 covers not only the semiconductor chip 1 but also the wires 4. Therefore, it is possible to protect the semiconductor chip 1, suppress the occurrence of problems of foreign matter sticking to a wire 4 and a break in a wire 4 and other like problems, and enhance the reliability of the semiconductor device 10.

In the semiconductor device 10 in the first embodiment, the lands 2*d* and the bump electrodes 2*e* are arranged in a matrix pattern in the lower surface of the wiring substrate. Therefore, it is possible to cope with increase in the number of pins in association with the enhancement of functionality of semiconductor devices 10 without increasing the outer dimensions of the wiring substrate 2.

Further, in the semiconductor device 10 in the first embodiment, lead-free solder is used for the bump electrodes 2*e* and a countermeasure against environmental pollution problems can be provided.

Figure 17:
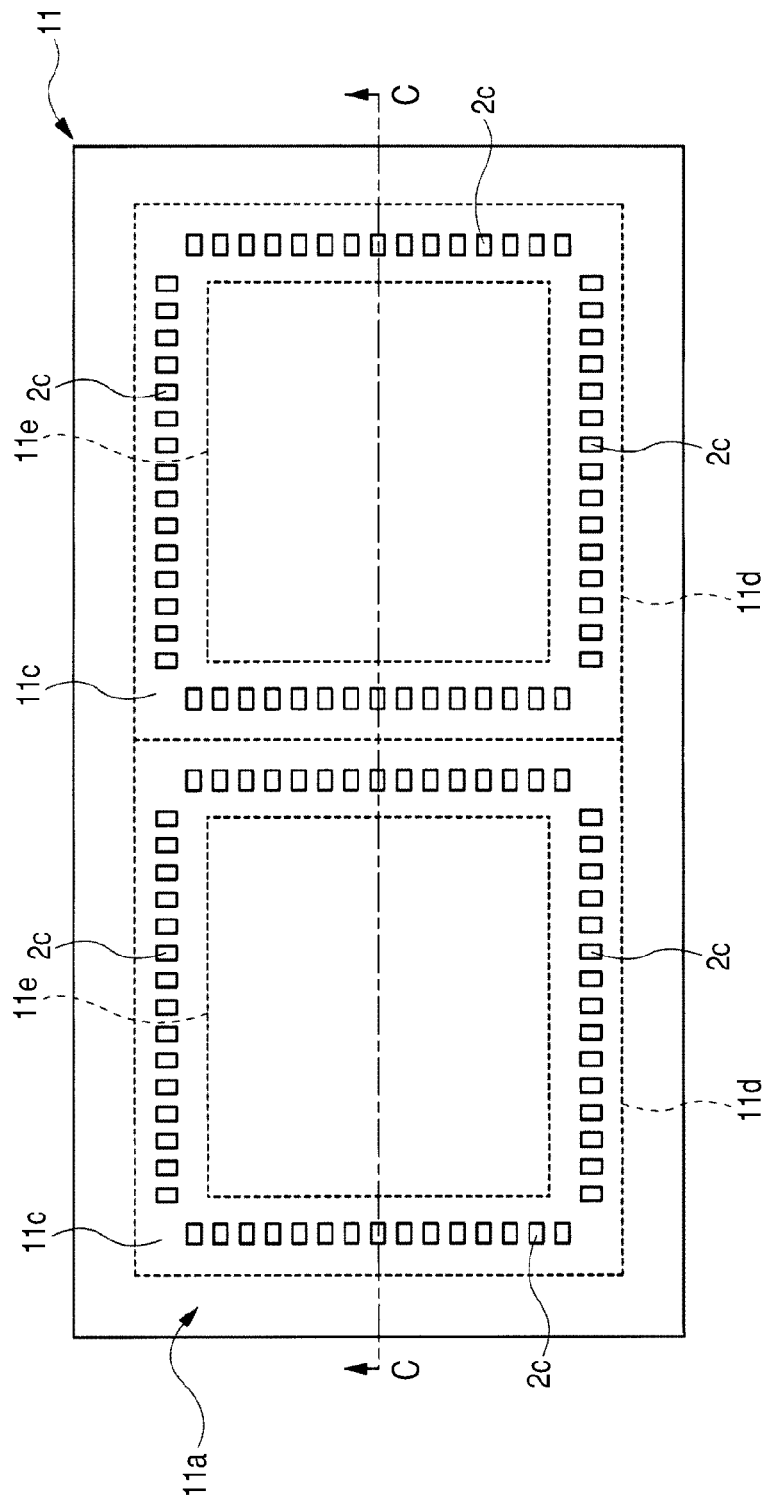
FIG. 17 is a plan view illustrating the upper surface side of wiring substrates prepared for multiple cavity molding in a manufacturing method for the semiconductor device in the first embodiment of the invention.
Figure 18:
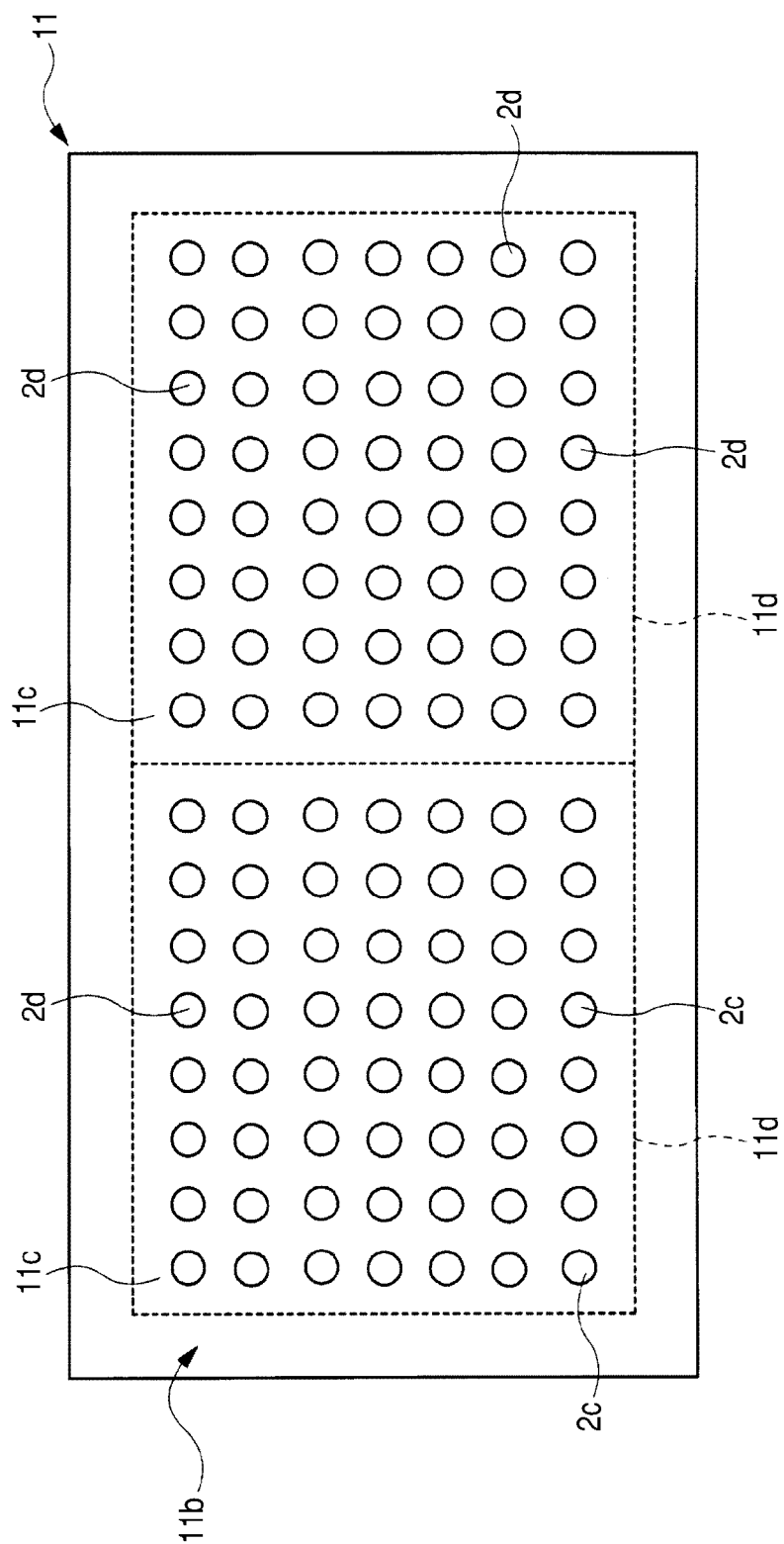
FIG. 18 is a plan view illustrating the lower surface side of the wiring substrates for multiple cavity molding illustrated in FIG. 17.
Figure 19:
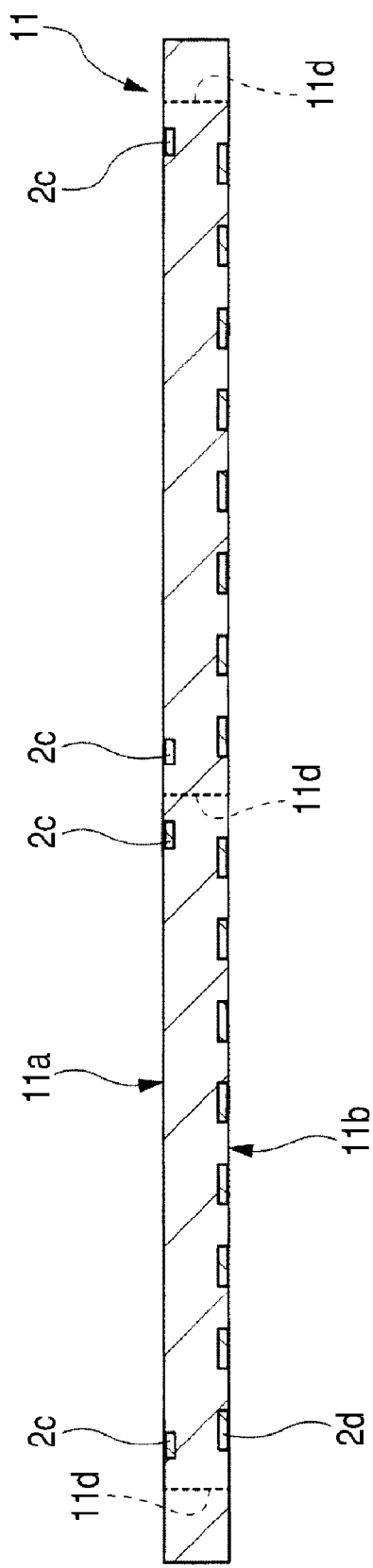
FIG. 19 is a sectional view taken along line C-C of FIG. 17.
Figure 20:
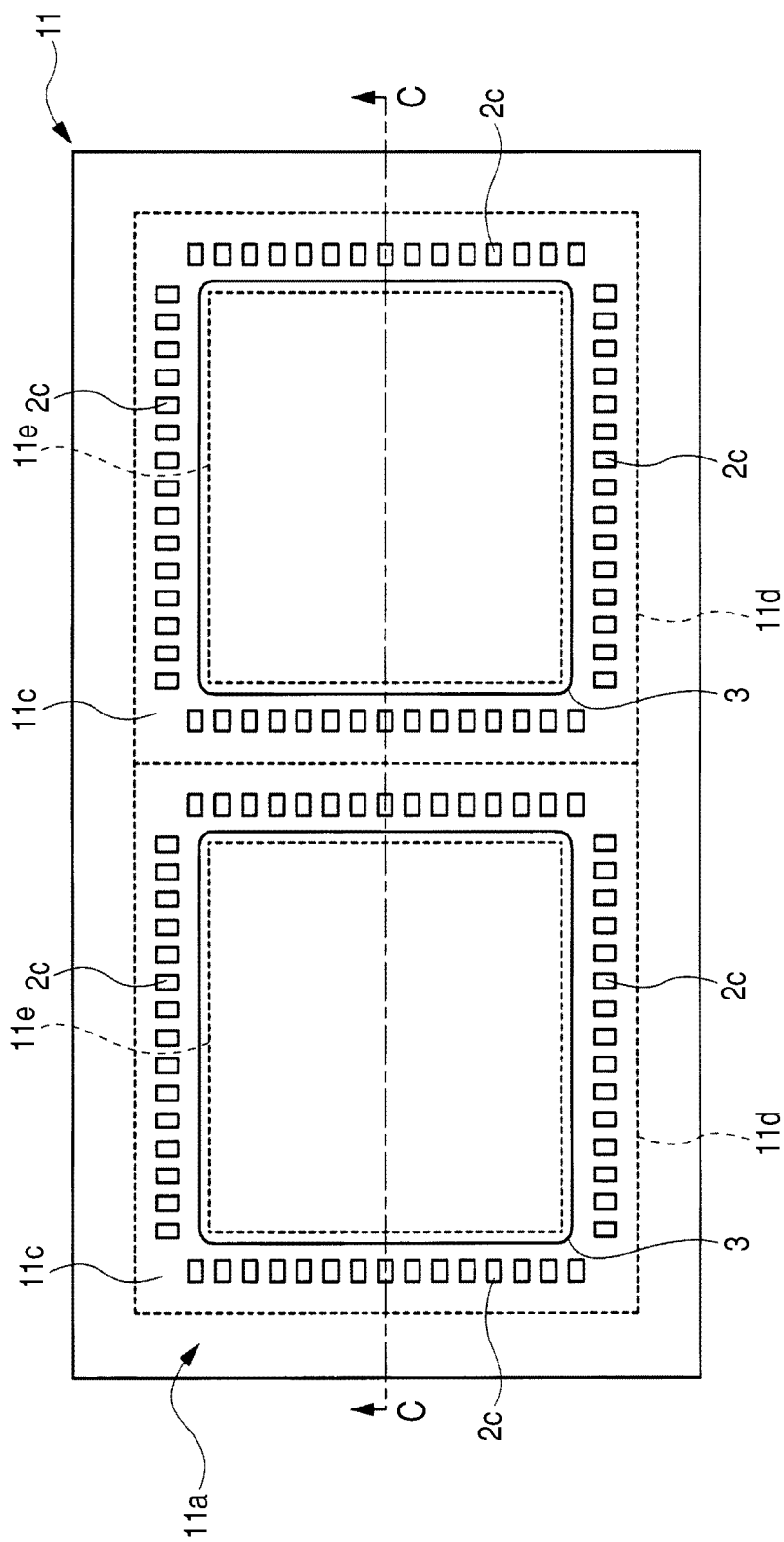
FIG. 20 is a plan view of the upper surface side of the wiring substrates for multiple cavity molding illustrated in FIG. 17 after adhesive is applied to the upper surfaces of the wiring substrates for multiple cavity molding.
Figure 21:
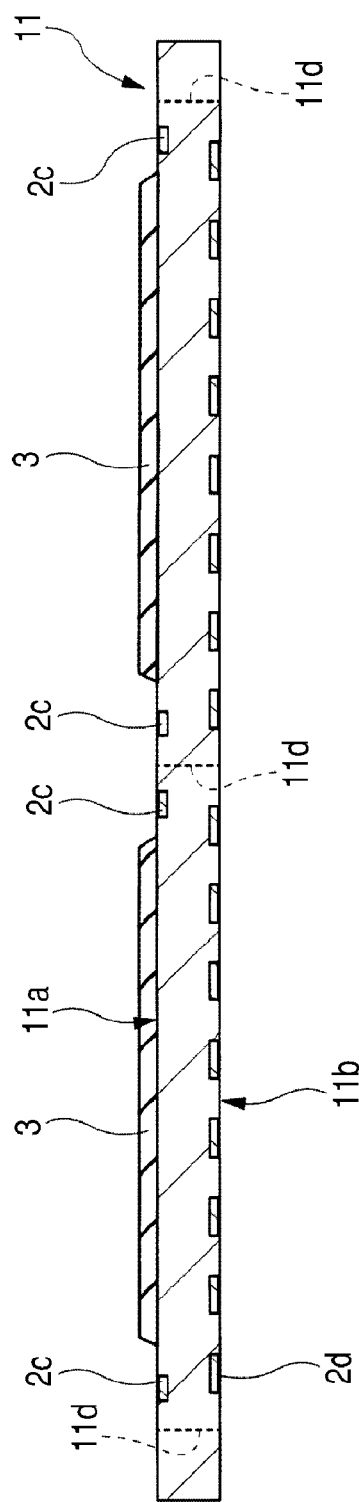
FIG. 21 is a sectional view taken along line C-C of FIG. 20.
Figure 22:
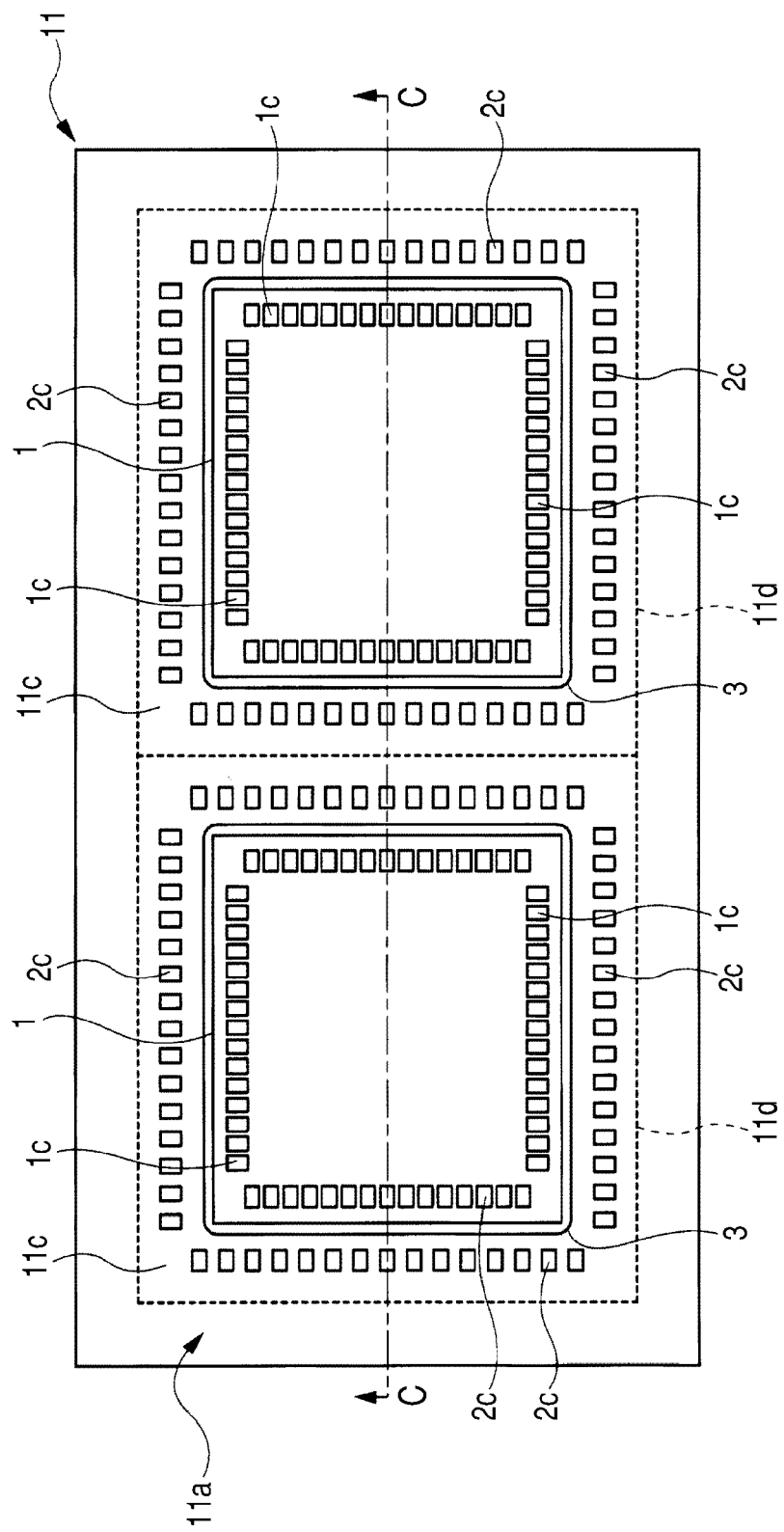
FIG. 22 is a plan view of the upper surface side of the wiring substrates for multiple cavity molding illustrated in FIG. 12 with semiconductor chips mounted over the wiring substrates.
Figure 23:
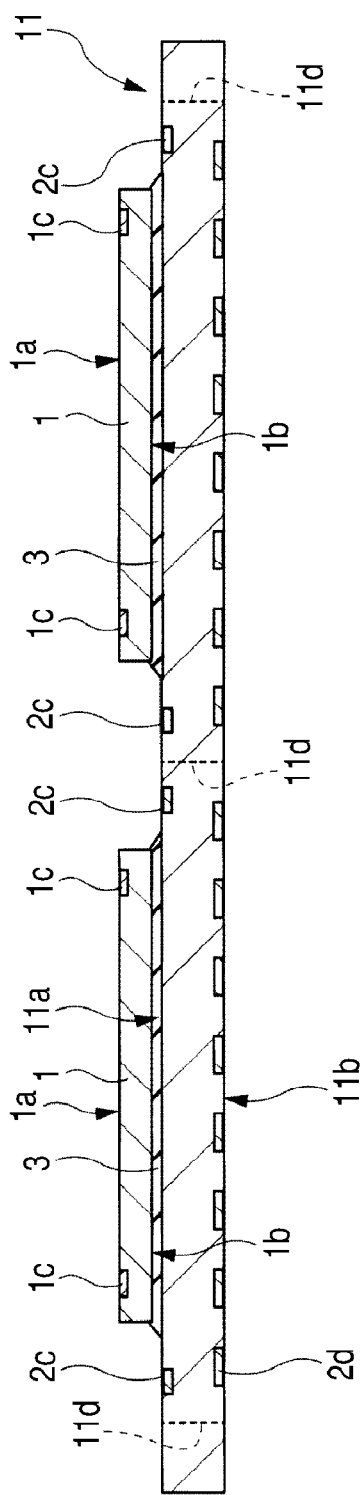
FIG. 23 is a sectional view taken along line C-C of FIG. 22.
Figure 24:
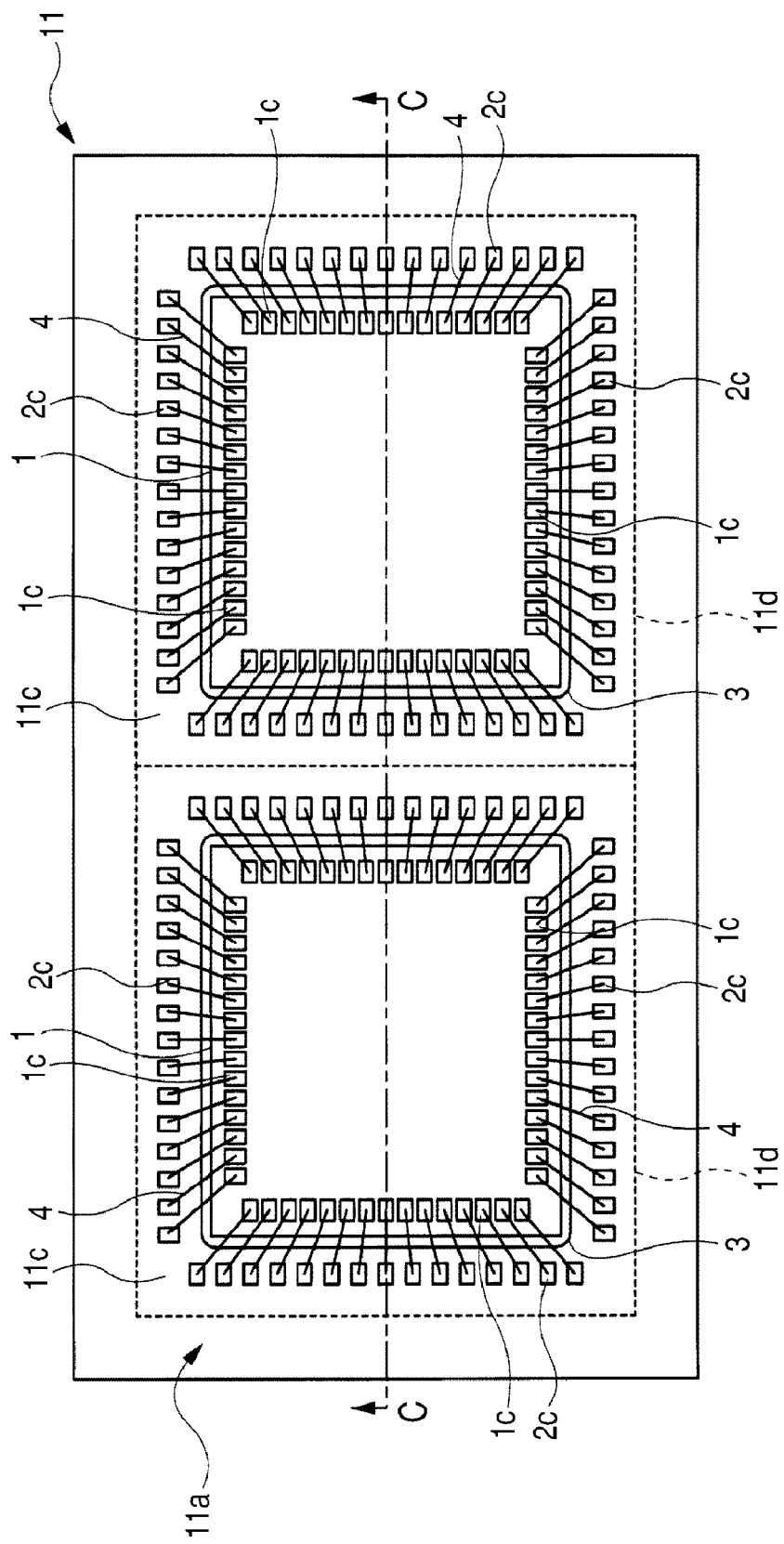
FIG. 24 is a plan view of the upper surface side of the wiring substrates for multiple cavity molding after a wire bonding process in the manufacturing method for the semiconductor device in the first embodiment of the invention.
Figure 25:
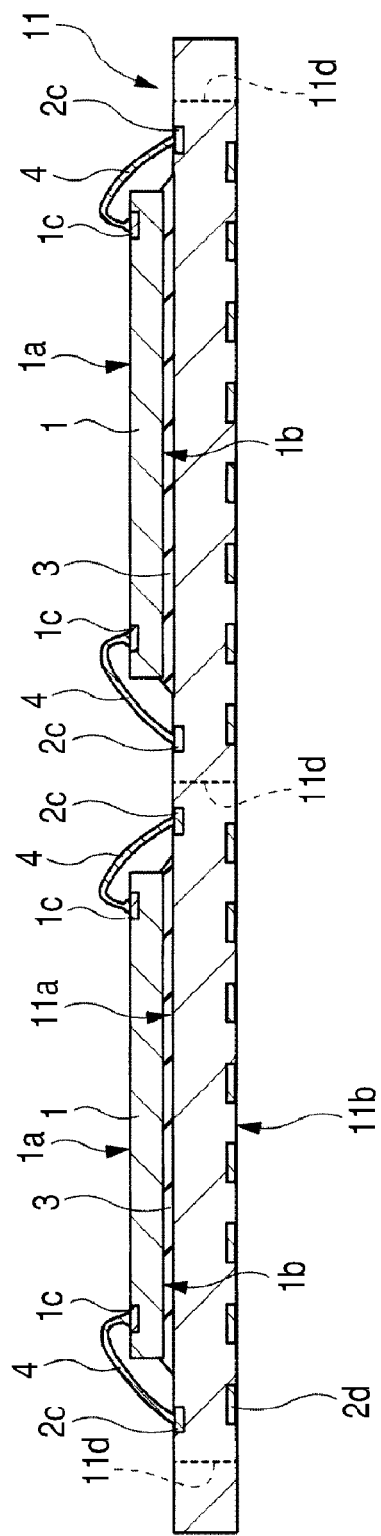
FIG. 25 is a sectional view taken along line C-C of FIG. 24.
Figure 27:
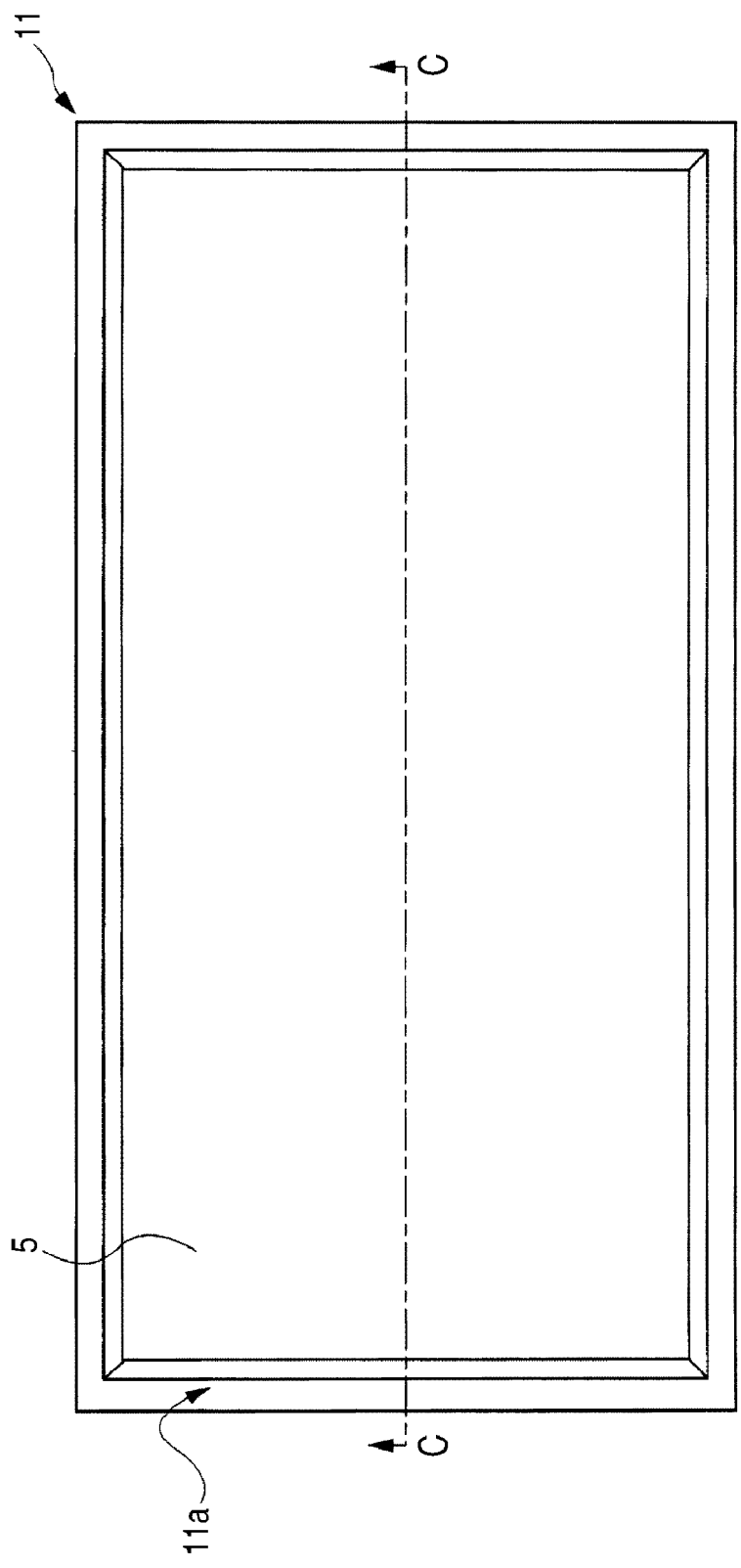
FIG. 27 is a plan view of the upper surfaces of the wiring substrates after an encapsulating body is formed in the manufacturing method for the semiconductor device in the first embodiment of the invention.
Figure 28:
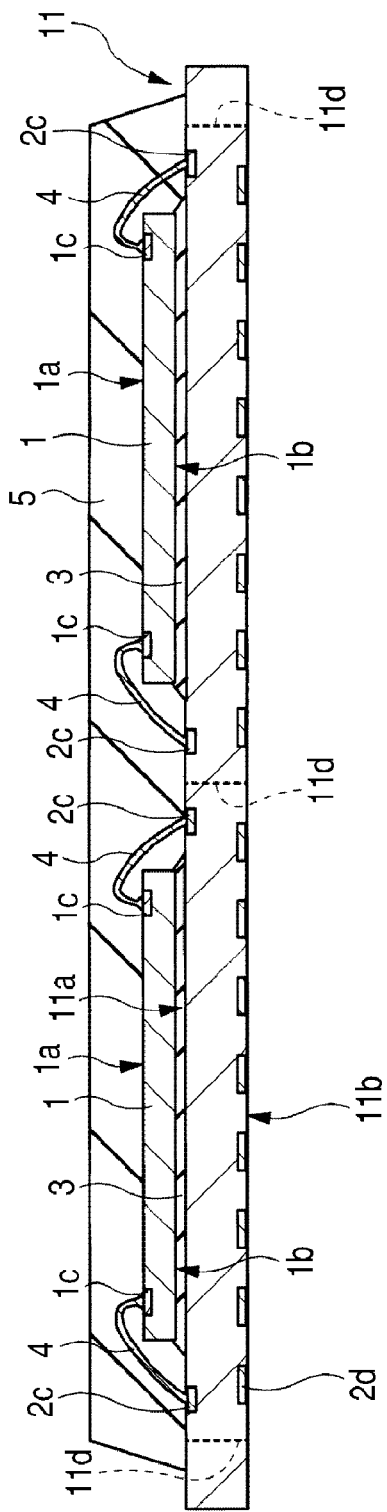
FIG. 28 is a sectional view taken along line C-C of FIG. 27.
Figure 29:
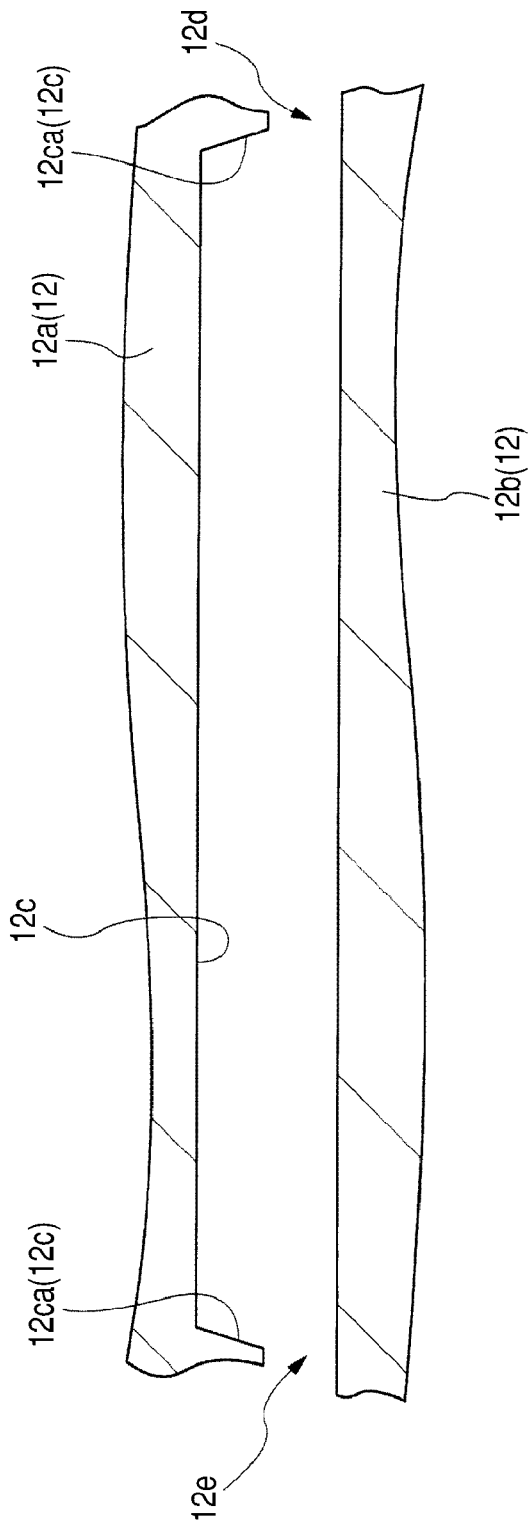
FIG. 29 is a sectional view of a forming mold used in the manufacturing method for the semiconductor device in the first embodiment of the invention.
Figure 30:
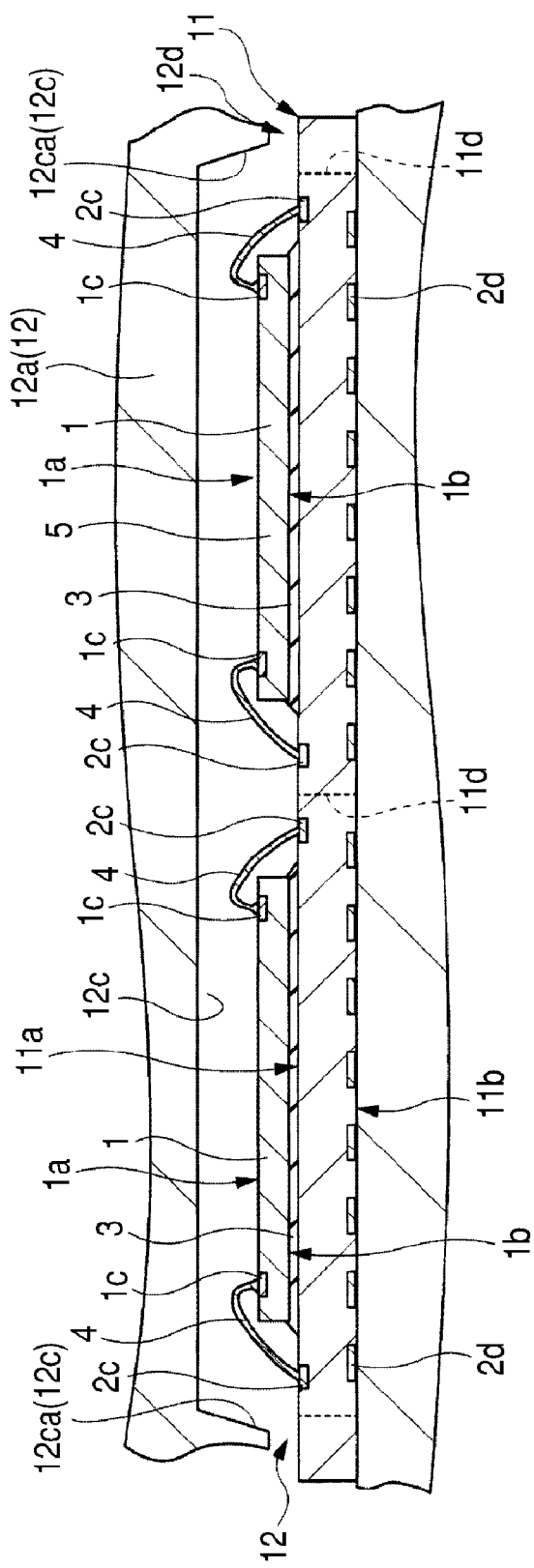
FIG. 30 is a sectional view illustrating how the wiring substrates for multiple cavity molding illustrated in FIG. 26 are set on the lower die of the forming mold illustrated in FIG. 29.
Figure 31:
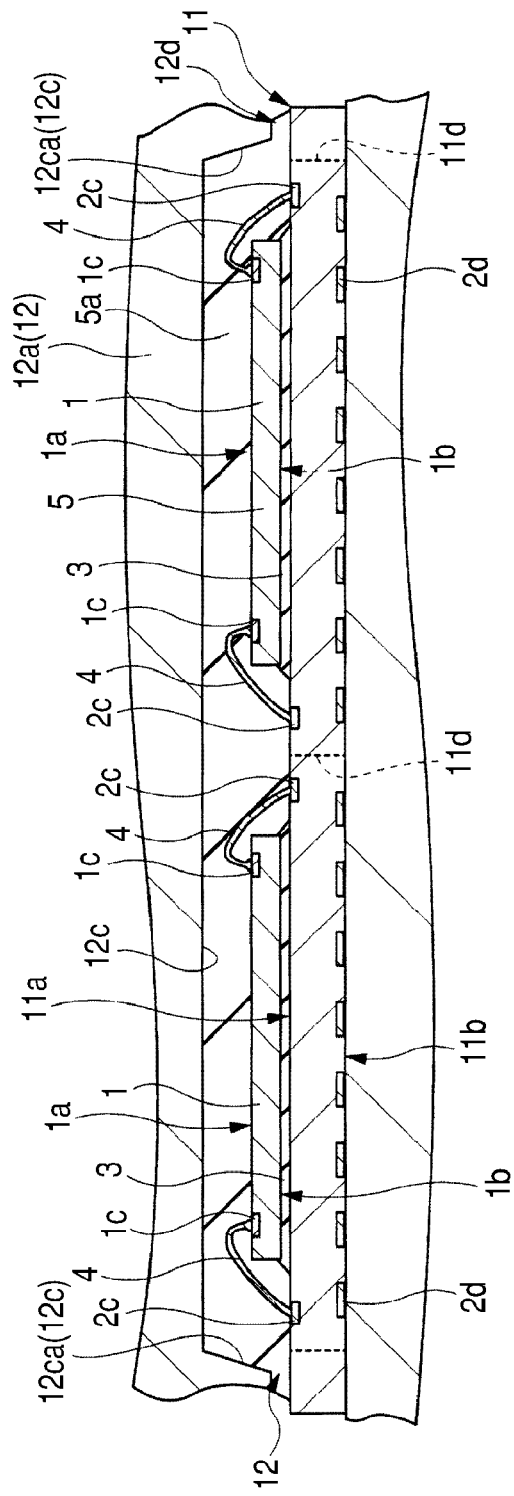
FIG. 31 is a sectional view illustrating the forming mold illustrated in FIG. 30 with the cavities thereof supplied with resin.
Figure 32:
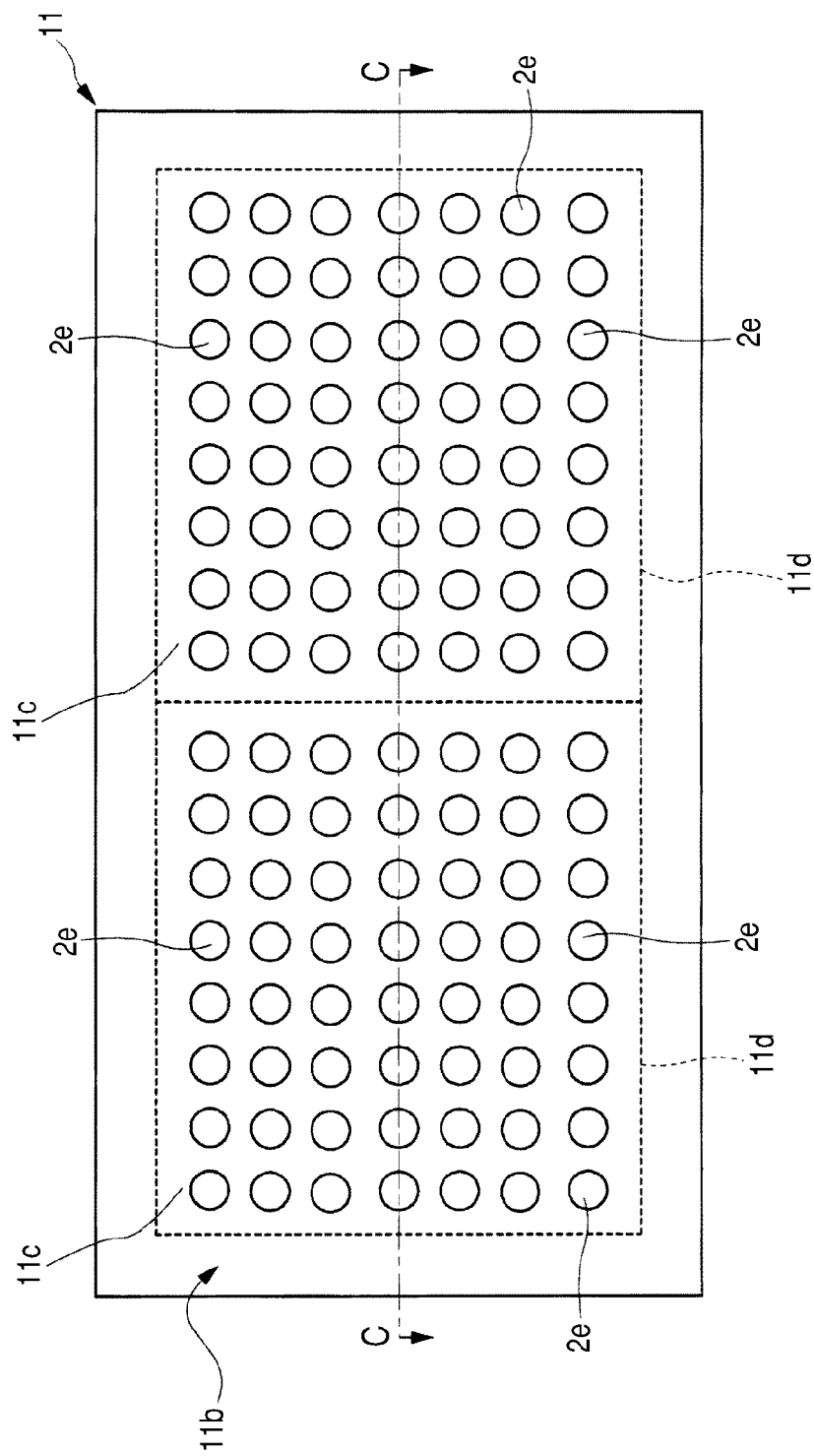
FIG. 32 is a plan view of the lower surface side of the wiring substrates for multiple cavity molding after multiple bump electrodes are joined in the manufacturing method for the semiconductor device in the first embodiment of the invention.
Figure 33:
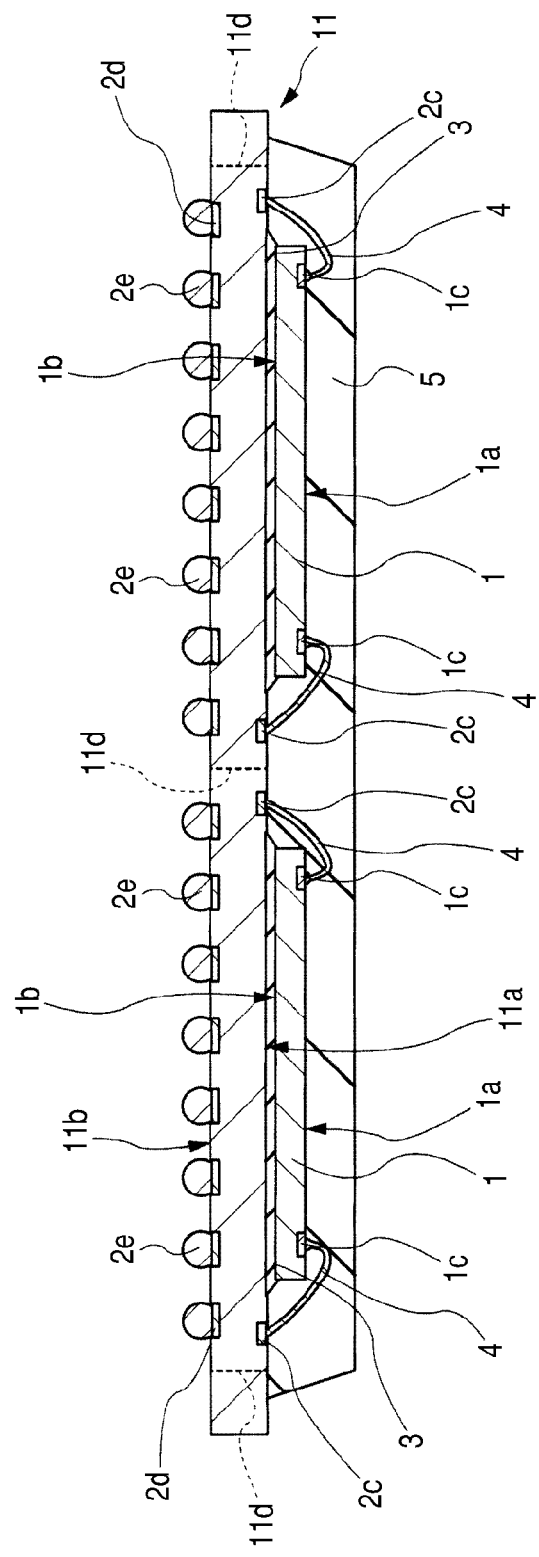
FIG. 33 is a sectional view taken along line C-C of FIG. 32.
Figure 34:
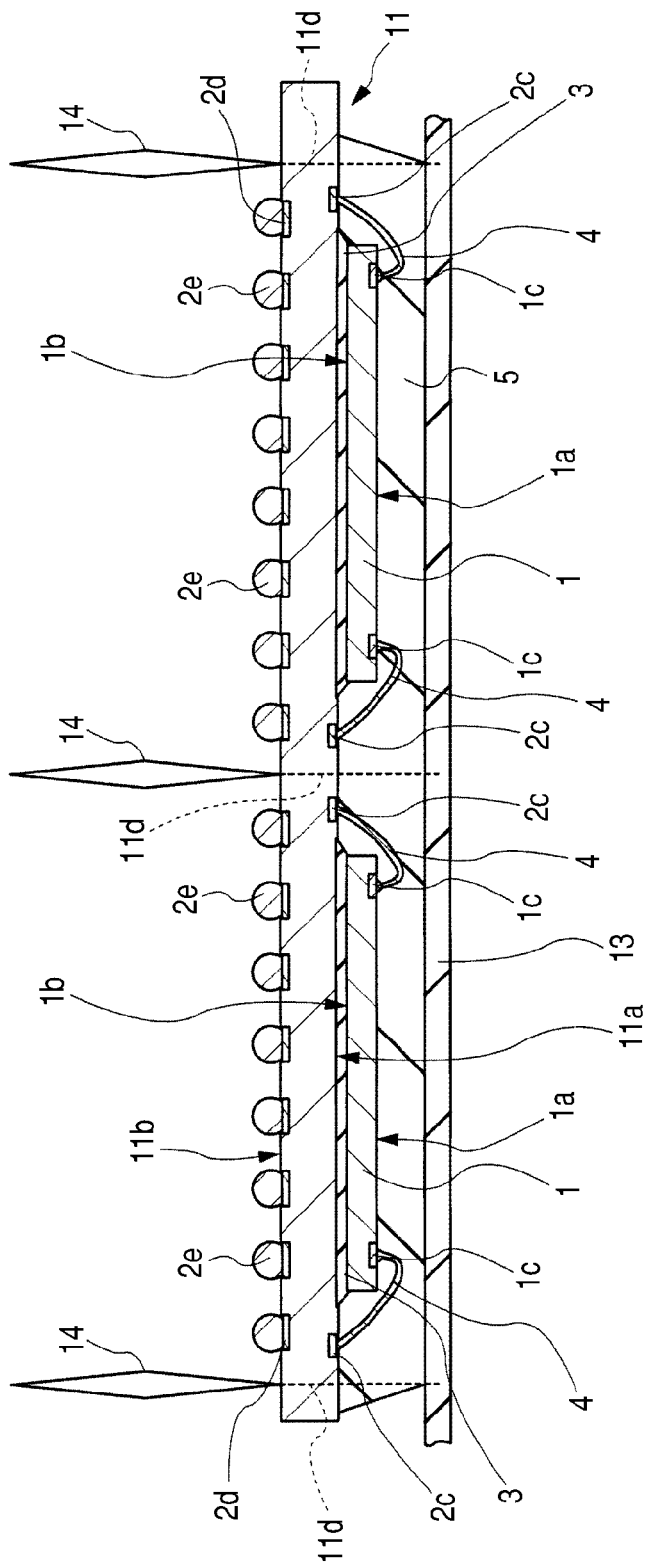
FIG. 34 is a sectional view of a dicing process in the manufacturing method for the semiconductor device in the first embodiment of the invention.

Hereafter, description will be given to a manufacturing method for the semiconductor device 10 in the first embodiment with reference to FIG. 17 to FIG. 34. The drawings from FIG. 17 to FIG. 34 explain the manufacturing method for the semiconductor device 10 in the first embodiment. FIG. 17 is a plan view illustrating the upper surface side of wiring substrates prepared for multiple cavity molding in the first embodiment. FIG. 18 is a plan view illustrating the lower surface side of the wiring substrates for multiple cavity molding illustrated in FIG. 17. FIG. 19 is a sectional view taken along line C-C of FIG. 17. FIG. 20 is a plan view illustrating the upper surface side of the wiring substrates for multiple cavity molding after adhesive is applied in the first embodiment. FIG. 21 is a sectional view taken along line C-C of FIG. 20. FIG. 22 is a plan view of the upper surface side of the wiring substrates for multiple cavity molding with semiconductor chips mounted over the wiring substrates for multiple cavity molding in the first embodiment. FIG. 23 is a sectional view taken along line C-C of FIG. 22. FIG. 24 is a plan view of the upper surface side of the wiring substrates for multiple cavity molding after a wire bonding process in the first embodiment. FIG. 25 is a sectional view taken along line C-C of FIG. 24. FIG. 26 is a sectional view illustrating the wiring substrates for multiple cavity molding in the first embodiment with the upper surfaces irradiated with plasma. FIG. 27 is a plan view of the upper surface side of the wiring substrates for multiple cavity molding after the encapsulating body is formed in the first embodiment. FIG. 28 is a sectional view taken along line C-C of FIG. 27. FIG. 29 is a sectional view of a forming mold used in the first embodiment. FIG. 30 is a sectional view illustrating how the wiring substrates for multiple cavity molding are set on the lower die of the forming mold. FIG. 31 is a sectional view illustrating how resin is supplied into the cavities in the forming mold. FIG. 32 is a plan view of the lower surface side of the wiring substrates for multiple cavity molding after the bump electrodes are joined in the first embodiment. FIG. 33 is a sectional view taken along line C-C of FIG. 32. FIG. 34 is a sectional view illustrating a dicing process in the first embodiment.

First, the wiring substrates 11 for multiple cavity molding illustrated in FIG. 17 to FIG. 19 are prepared. The wiring substrates have multiple product formation regions (device formation regions) 11c and a dicing area 11d positioned between the product formation regions 11c. In, the upper surface 11a of each wiring substrate 11, as illustrated in FIG. 17, there is formed a chip placement area 11e where the semiconductor chip 1 (FIG. 1) is to be placed in a subsequent process and multiple bonding leads 2c encircling the chip placement area 11e. In the lower surface 11b of each wiring substrate 11, as illustrated in FIG. 18, there are formed multiple lands 2d.

As illustrated in FIG. 20 and FIG. 21, subsequently, adhesive 3 is applied to each of the product formation regions 11c of the wiring substrates 11. The adhesive 3 used in the first embodiment is comprised of paste thermosetting resin.

As illustrated in FIG. 22 and FIG. 23, subsequently, the semiconductor chip 1 is placed over each of the product formation regions 11c with the adhesive 3 in-between. At this time, the semiconductor chips 1 are mounted over the upper surfaces 11a of the wiring substrates 11 so that the rear surfaces 1b of the semiconductor chips 1 are opposed to the upper surfaces 11a of the wiring substrates 11. Since the adhesive 3 used in this embodiment is thermosetting adhesive, the semiconductor chips 1 are placed in the chip placement areas 11e (FIG. 20) of the wiring substrates 11 and then heat is applied. The adhesive 3 is thereby cured to fix the semiconductor chips 1.

As illustrated in FIG. 24 and FIG. 25, subsequently, the pads 1c formed in the main surfaces 1a of the semiconductor chips 1 and the bonding leads 2c formed in the upper surfaces 11a of the wiring substrates 11 are electrically coupled together through the wires 4 as conductive members. In this embodiment, both ultrasonic bonding and thermocompression bonding are used. As the method for wire bonding, a so-called normal bonding method is used and one end of a wire 4 is joined with a pad is of a semiconductor chip 1 and then the other end of the wire 4 is joined with a bonding lead 2c of a wiring substrate 11. As illustrated in FIG. 25, a ball portion 4a formed by discharging one end of a wire 4 protruded from the tip of a capillary (not shown) is joined with a pad 1c of a semiconductor chip 1 by the load of the capillary. (Refer to FIG. 4 for details.) (Also refer to FIG. 4 for the ball portion.) The strength of bonding between a pad as the 1st side and a wire 4 can be further enhanced by forming this ball portion 4a at one end of the wire 4.

As illustrated in FIG. 26, subsequently, plasma (indicated by arrows PL in FIG. 26) is applied from the upper surface 11a side of the wiring substrates 11. This is intended to enhance the adhesion between the encapsulating body 5 formed in a subsequent process and the resin film (insulating film, solder resist film) 2m formed over the upper surfaces 11a of the wiring substrates 11. (Refer to FIG. 4.) More detailed description will be given. As mentioned above, the resin film 2m as an insulating film is also formed over the upper surface 11a of each wiring substrate 11 to protect the uppermost wiring layer (first wiring layer) 2g1. Outgassing from the resin film 2m is caused by the influence of heat during a semiconductor chip 1 placement process (die bonding process) or the wire bonding process. When this gas sticks to the front face of the resin film 2m, the adhesion between the resin film and the encapsulating body 5 is degraded. To cope with this, it is required to remove volatile components sticking to the resin film 2m over the upper surface 11a of each wiring substrate 11 by this plasma irradiation process.

After the plasma irradiation process is carried out, as illustrated in FIG. 27 and FIG. 28, the encapsulating body 5 comprised of resin is formed over the upper surfaces 11a of the wiring substrates 11. This encapsulating body is so formed that the semiconductor chips 1 and the wires 4 are covered and protected. In this embodiment, the encapsulating body 5 is formed by so-called batch molding (batch transfer molding) and multiple product formation regions 11c are encapsulated in a lump.

Detailed description will be given to the process of forming the encapsulating body 5 with reference to FIG. 29 to FIG. 31.

First, as illustrated in FIG. 29, a forming mold 12 having an upper die (first die) 12a and a lower die (second die) 12b opposed to the upper die 12a is prepared. The upper die 12a includes: an upper die face; a cavity 12c formed in the upper die face; a gate portion 12d formed in the upper die so that it communicates with the cavity 12c and used to supply resin; and an air vent portion 12e formed in the upper die 12a in a position where it is opposed to the gate portion 12d with the cavity 12c in-between. The side face 12ca of the cavity 12c is sloped from outside to inside and this enhances the mold release characteristics helpful in taking wiring substrates 11 with the encapsulating body 5 formed thereover out of the forming mold 12. Meanwhile, the lower die 12b includes a lower die face opposed to the upper die face of the upper die 12a.

Then the forming mold 12 is opened (the lower die 12b is pulled away from the upper die 12a) and then the wiring substrates 11 mounted with the semiconductor chips 1 are set on the lower die face of the lower die 12b as illustrated in FIG. 30. At this time, the wiring substrates 11 are placed in the forming mold 12 so that the following is implemented: the lower surfaces 11b of the wiring substrates 11 are opposed to the lower die face of the lower die 12b and the semiconductor chips 1 are positioned in the cavity 12c in the upper die 12a.

Subsequently, the peripheral portions of the wiring substrates 11 are clamped between the upper die 12a and the lower die 12b. At the time, the gate portion 12d and air vent portion 12e formed in the upper die are positioned on the upper surface 11a side of the wiring substrates 11.

As illustrated in FIG. 31, subsequently, resin 5a is supplied into the cavities 12c through the gate portion 12d and heat is applied to the forming mold 12 to cure the resin 5a. As a result, the encapsulating body 5 encapsulating the semiconductor chips 1 in a lump is formed. Since the air vent portion 12e is provided in the forming mold 12, the following can be implemented even when air (air bubble) is trapped in the supplied resin 5a: this air (air bubble) does not remain in the cavities 12c and is let out through the air vent portion 12e and the problem of formation of a void in the formed encapsulating body 5 does not arise.

By opening the forming mold 12, the wiring substrates 11 with the encapsulating body 5 formed thereover are taken out of the forming mold 12 and the process of forming the encapsulating body 5 is completed.

As illustrated in FIG. 32 and FIG. 33, subsequently, the bump electrodes 2e to be external terminals are formed on the lower surface 11b side of the wiring substrates 11 taken out of the forming mold. The bump electrodes 2e are respectively joined to the lands 2d formed in the lower surfaces 11b of the wiring substrates 11.

Subsequently, a process (dicing process) of dividing the wiring substrates 11 for multiple cavity molding with the encapsulating body 5 formed thereover is carried out.

As illustrated in FIG. 34, the dicing process is carried out with the lower surface 11b of each wiring substrate 11 with the bump electrodes 2e formed therein facing upward. In other words, the dicing process is carried out with the front face of the encapsulating body 5 fixed on a dicing tape 13. A dicing blade 14 is driven from the lower surface 11b side of the wiring substrates 11 to divide them. At this time, the dicing blade 14 is caused to reach not only the encapsulating body 5 but also part of the dicing tape 13. As a result, the wiring substrates 11 and the encapsulating body 5 can be completely divided. While the dicing blade 14 is cutting the wiring substrates 11 and the encapsulating body 5, it is moved along the dicing areas 11d illustrated in FIG. 34. As the result of this process, the multiple semiconductor devices 10 are obtained. (Refer to FIG. 1 to FIG. 4.)

Figure 35:
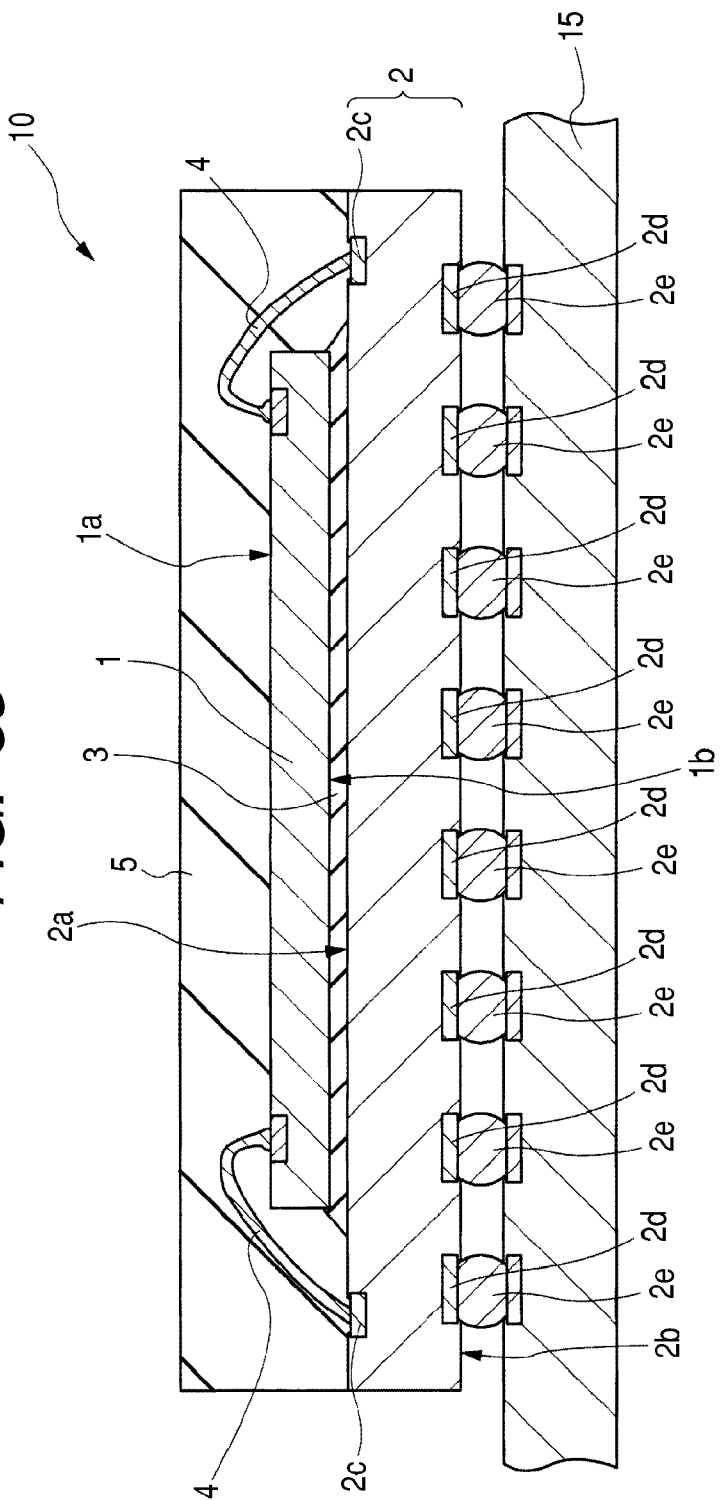
FIG. 35 is a sectional view illustrating how a finished semiconductor device is mounted over a mother board.

Finally, the appearance of the divided individual semiconductor devices 10 is checked for any bump electrode 2e broken away or cracking in the wiring substrate 2 and the manufacture of the semiconductor device is completed. As illustrated in FIG. 35, the manufactured semiconductor device 10 is mounted over a mother board (mounting board) 15 through the bump electrodes 2e. FIG. 35 is a sectional view illustrating how a completed semiconductor device is mounted over a mother board.

Second Embodiment

Figure 38:
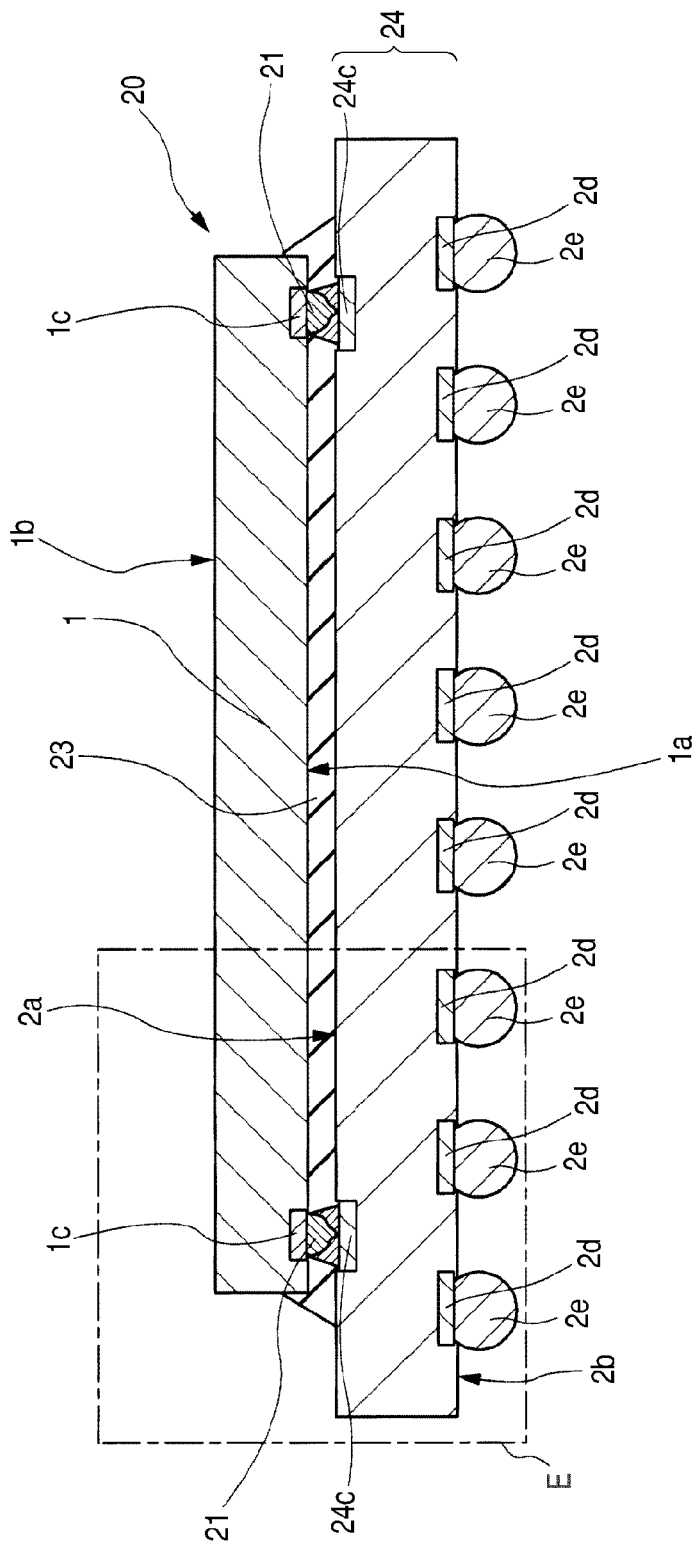
FIG. 38 is a sectional view taken along line D-D of FIG. 36.

The semiconductor device 20 in the second embodiment is configured as illustrated in FIG. 38. That is, the multiple bonding leads 24c of a wiring substrate 24 and the multiple pads 1c of a semiconductor chip 1 are respectively electrically coupled together through multiple bump electrodes 21 as conductive members. The bonding leads and the pads are electrically coupled together so that the main surface 1a of the semiconductor chip 1 is opposed to the upper surface 2a of the wiring substrate 24.

Hereafter, description will be given to features of the semiconductor device 20 in the second embodiment. However, with respect to the same configuration, effect, and the like as in the first embodiment, the description thereof will be omitted.

Figure 36:
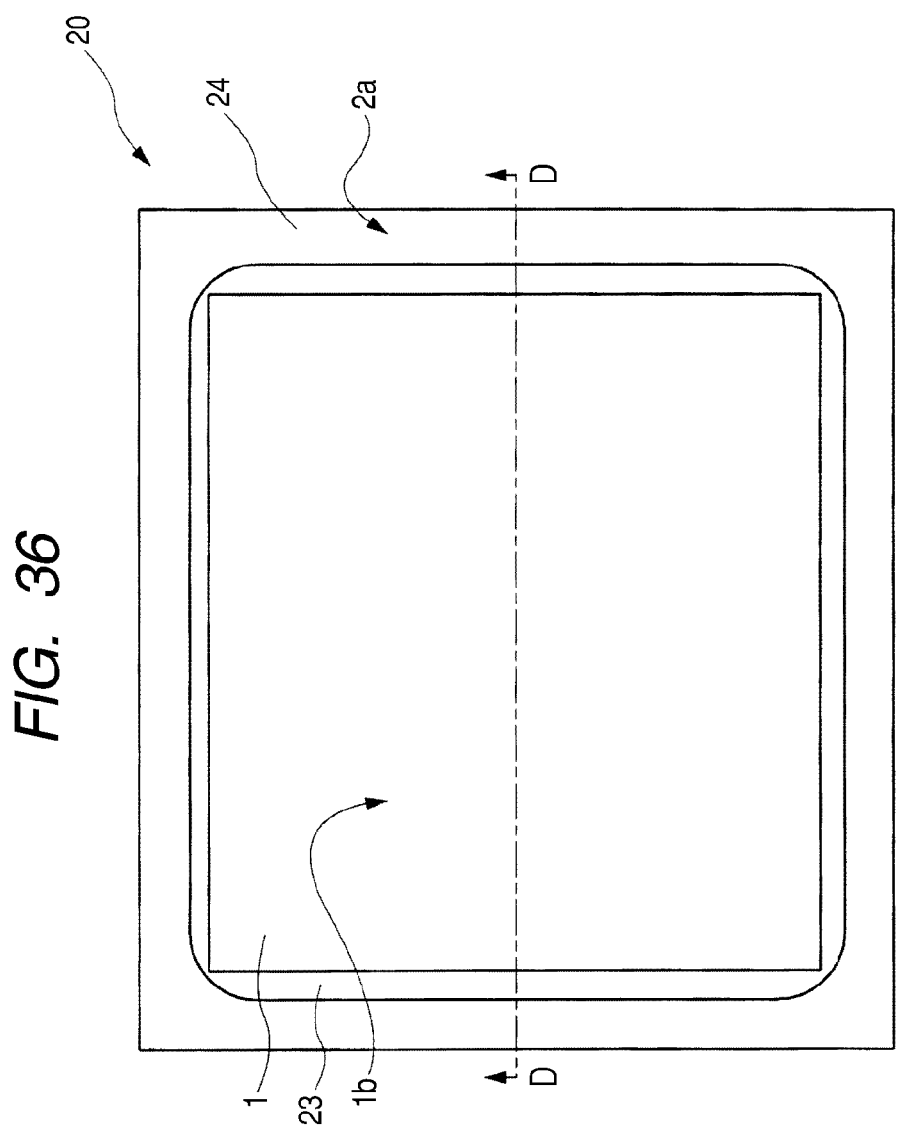
FIG. 36 is a plan view of a semiconductor device in a second embodiment of the invention as viewed from the upper surface side of a wiring substrate where a semiconductor chip is mounted.
Figure 37:
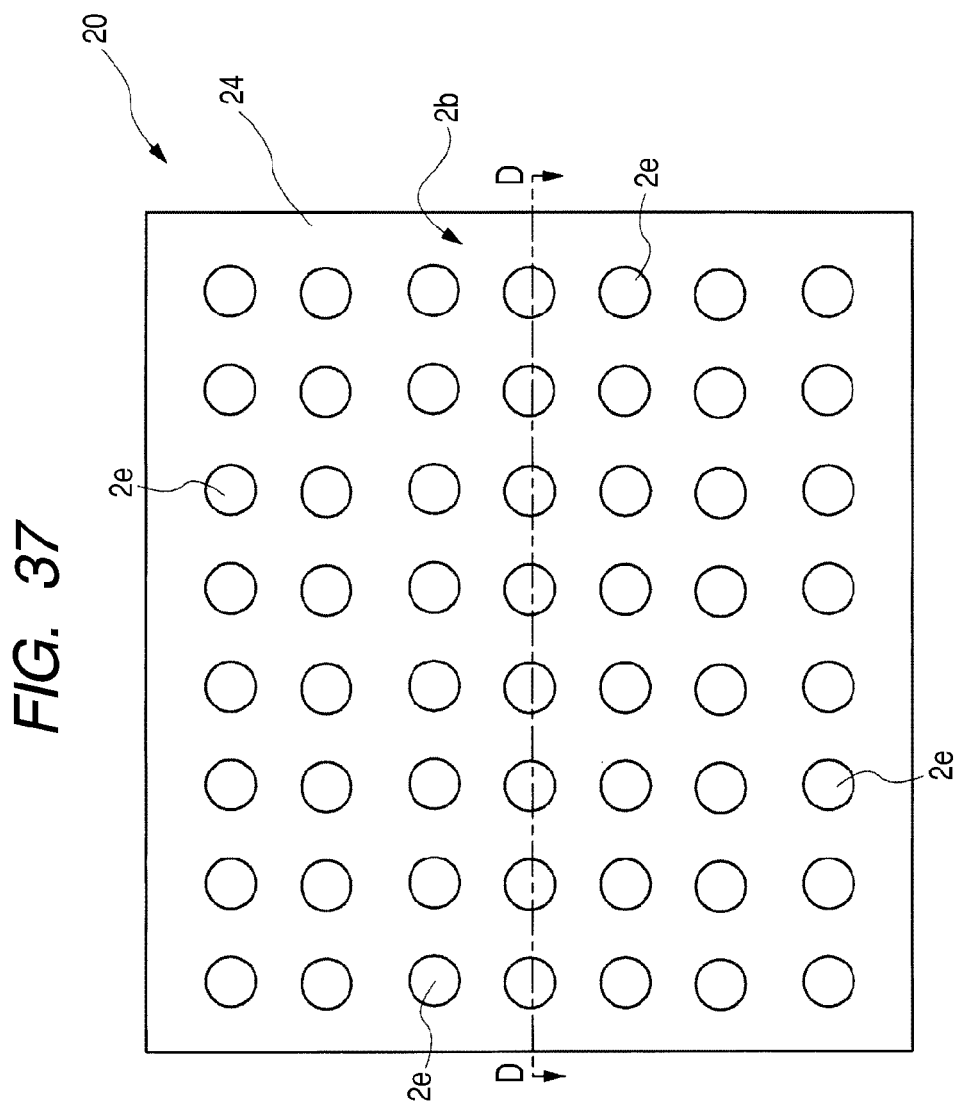
FIG. 37 is a plan view of the wiring substrate illustrated in FIG. 36 as viewed from the lower surface side.

FIG. 36 is a plan view of a wiring substrate (board) mounted with a semiconductor chip as viewed from the upper surface (front face, first face) side; FIG. 37 is a plan view of the wiring substrate as viewed from the lower surface (rear surface, second face) side opposite the upper surface side; and FIG. 38 is a sectional view taken along line D-D of FIG. 36.

As illustrated in FIG. 38, the semiconductor chip 1 is mounted over the upper surface 2a of the wiring substrate 24 so that the main surface 1a of the semiconductor chip 1 is opposed to the upper surface (front face, first face) 2a of the wiring substrate 24. The following are respectively electrically coupled together through the multiple bump electrodes (bump-like electrodes) 21 as conductive members: the pads (electrodes) is formed in the main surface 1a of the semiconductor chip 1 and the bonding leads (electrodes) 24c formed in the upper surface 2a of the wiring substrate 24. That is, face-down mounting (flip-chip bonding) is implemented. The pads 1c of the semiconductor chip 1 are formed along each side of the main surface 1a having a rectangular planar shape in the direction intersecting the direction of thickness as in the first embodiment. (Refer to FIG. 1 for the planar arrangement of the pads 1c in the main surface 1a.) The bump electrodes is are respectively provided over the pads 1c of the semiconductor chip 1 before the semiconductor chip 1 is mounted over the wiring substrate 24.

Figure 39:
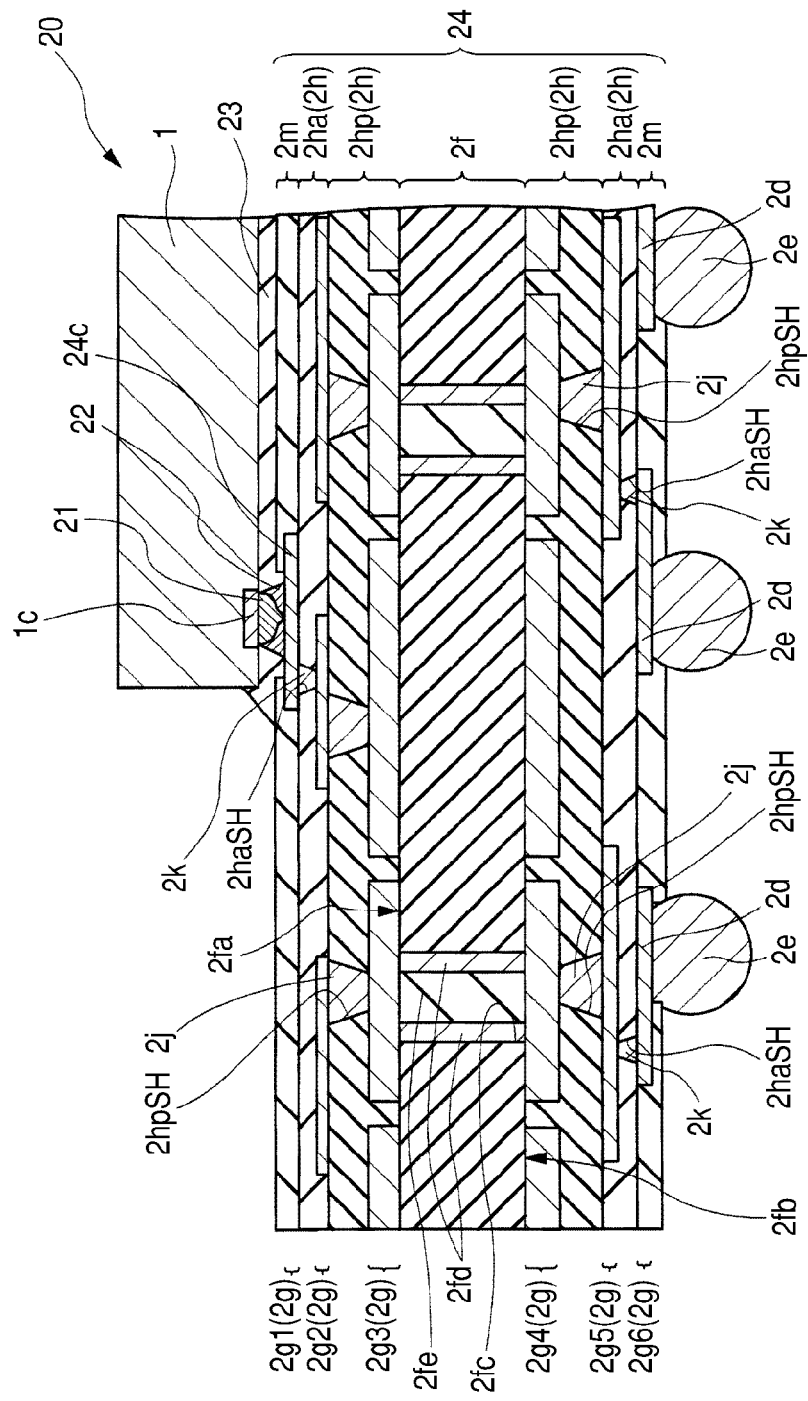
FIG. 39 is an enlarged sectional view of E site in FIG. 38.

FIG. 39 is an enlarged sectional view of E site in FIG. 38. The bump electrodes 21 in the second embodiment are comprised of, for example, gold (Au). The electrical coupling between the pads 1c of the semiconductor chip 1 and the bonding leads 24c of the wiring substrate 24 is implemented by so-called gold-solder joining. That is, solder (conductive member) 22 as jointing material formed over the bonding leads 24c of the wiring substrate 24 and the bump electrodes 21 comprised of gold are joined with each other as illustrated in FIG. 39.

Between the main surface 1a of the semiconductor chip 1 and the upper surface 2a of the wiring substrate 24, underfill resin (encapsulation resin) is placed. This enhances the reliability of joint between the bump electrodes 21 and the bonding leads 24c.

The wiring substrate 24 used in the second embodiment is substantially the same as in the first embodiment as illustrated in FIG. 39 with the exception that the pitch (arrangement pitch) of the bonding leads (flip-chip bonding leads) 24c is smaller than the pitch of the bonding leads 2c in the first embodiment. The bonding leads 24c are part of the first wiring layer 2g1 and used for flip-chip bonding and the bonding leads 2c are part of the first wiring layer 2g1 and used for wire bonding.

The reason for this is as follows. When wire bonding is carried out as described in relation to the first embodiment, the pads is of the semiconductor chip 1 and the bonding leads 2c of the wiring substrate 2 are electrically coupled together through wires 4. Therefore, it is unnecessary to match the pitch of the bonding leads 2c of the wiring substrate 2 with the pitch of the pads 1c of the semiconductor chip 1. When flip-chip bonding is carried out as in the second embodiment, meanwhile, the bonding leads 24c of the wiring substrate 24 and the pads 1c of the semiconductor chip 1 are electrically coupled together through bump electrodes 21. Therefore, it is required to arrange the bonding leads 24c of the wiring substrate 24 with substantially the same pitch as the pitch of the pads 1c of the semiconductor chip 1.

However, in the wiring substrate 24 of the semiconductor device 20 in the second embodiment, the following is implemented as described in relation to the first embodiment: for the insulating layer 2h directly under the wiring layer 2g1 that is the uppermost wiring layer 2g and has wiring patterns with the bonding leads 24c formed therein, an insulating layer (third insulating layer 2ha) that does substantially not contain fiber and is comprised substantially only of resin is used. Therefore, reduction in pitch can be coped with.

In the semiconductor device 20 in the second embodiment, as mentioned above, the semiconductor chip 1 is mounted over the wiring substrate 24 by flip-chip bonding. Therefore, the thickness of the semiconductor device 20 (or the mounting height of the semiconductor device 20) can be made smaller than in the first embodiment by an amount equivalent to the following: the loop height of the wires 4 (FIG. 1 to FIG. 4) and the thickness of the encapsulating body 5 (FIG. 1 to FIG. 4) covering these wires 4.

In the semiconductor device 20 in the second embodiment, the semiconductor chip 1 is mounted over the wiring substrate 24 by flip-chip bonding. Therefore, the outer dimensions of the semiconductor device 20 can be further reduced as compared with the semiconductor device 10 in the first embodiment in which the bonding leads 2c are placed in the peripheral area of the semiconductor chip 1. (The peripheral area of the semiconductor chip 1 is the area around the chip placement area 11e in each wiring substrate 11 illustrated in FIG. 17.)

The following can be implemented in the second embodiment even though the pitch of the bonding leads 24c of the wiring substrate 24 is made smaller than in the first embodiment for carrying out flip-chip bonding: for the insulating layer 2h directly under the wiring layer 2g1 that is the uppermost wiring layer 2g and has wiring patterns with the bonding leads 24c formed therein, the same insulating layer as in the first embodiment is used. That is, an insulating layer (third insulating layer 2ha) that does substantially not contain fiber and is comprised substantially only of resin is used. Therefore, reduction in pitch can be coped with.

Further, the following is implemented in the semiconductor device 20 in the second embodiment: the computation circuit (not shown) formed in the main surface 1a of the semiconductor chip 1 is opposed to the upper surface 2a of the wiring substrate 24 and the main surface 1a of the semiconductor chip 1 is covered with the underfill resin 23. Therefore, it is unnecessary to further encapsulate the semiconductor chip 1 mounted over the wiring substrate 24 with the encapsulating body 5 described in relation to the first embodiment. As a result, it is possible to expose the rear surface 1b of the semiconductor chip 1 and enhance the heat radiation performance of the semiconductor device 20.

When the encapsulating body 5 is not formed on the upper surface 2a side of the wiring substrate 24 like the semiconductor device 20 in the second embodiment, the wiring substrate 24 becomes more prone to warp. Hereafter, description will be given to this.

When the wiring substrate 24 is manufactured using a material (epoxy resin in this embodiment) different from a material (silicon in this embodiment) configuring the semiconductor chip 1, as mentioned above, the following takes place: since a difference is produced in coefficient of thermal expansion between them, the wiring substrate 24 warps if heat treatment is carried out after the semiconductor chip 1 is mounted over the wiring substrate 24.

In the first embodiment, warpage can be reduced by forming the following encapsulating body 5 on the upper surface 2a side of the wiring substrate 2: an encapsulating body having a coefficient of expansion between the coefficient of thermal expansion of the semiconductor chip 1 and the coefficient of thermal expansion of the insulating layers 2h (including the core material 2f) of the wiring substrate 2.

Since the encapsulating body 5 is not formed in the semiconductor device 24 in the second embodiment, however, it is more difficult to reduce this warpage than in the semiconductor device 10 with the encapsulating body 5 formed thereover in the first embodiment.

To cope with this, in the semiconductor device in the second embodiment, the following wiring substrate described in relation to the first embodiment is used: a wiring substrate 24 comprising a first insulating layer (core material 2f) and second insulating layers 2hp comprised of prepreg material and third insulating layers 2ha comprised substantially only of resin. This makes it possible to enhance the strength (hardness) of the wiring substrate 24 and to reduce warpage in the wiring substrate 24 even in the semiconductor device 20 in which the encapsulating body 5 is not formed and the semiconductor chip 1 is flip-chip bonded to over the wiring substrate 24.

Figure 40:
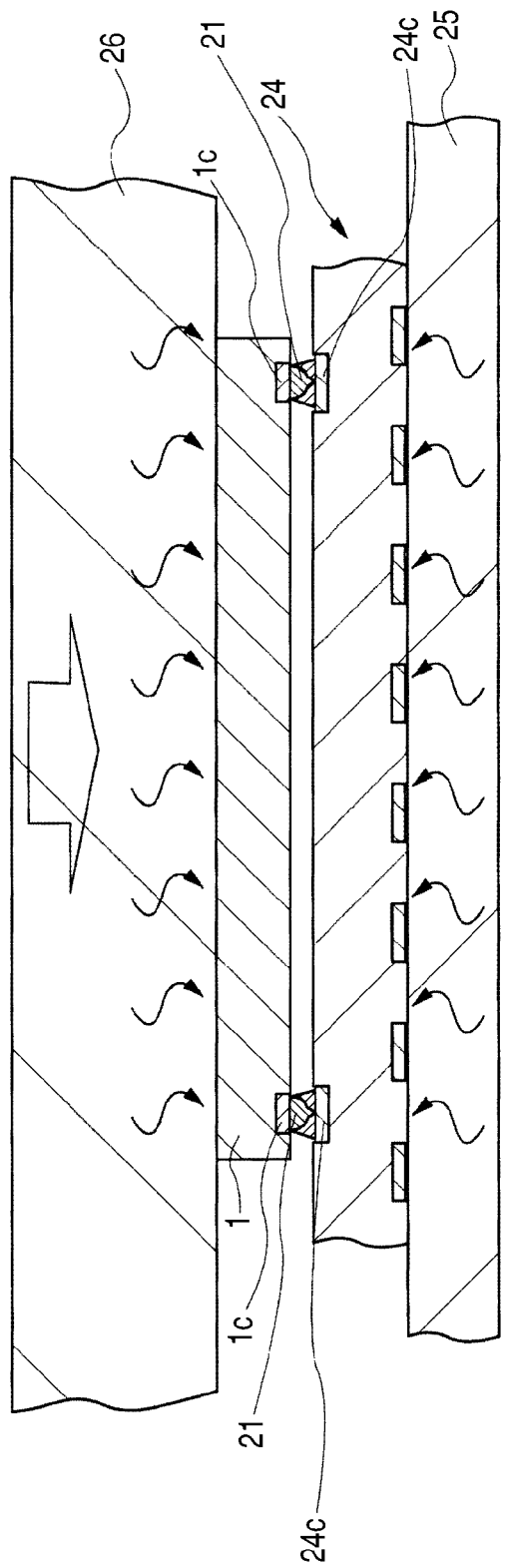
FIG. 40 is a sectional view illustrating a semiconductor chip is flip-chip bonded to over the wiring substrate in a manufacturing method for the semiconductor device in the second embodiment of the invention.

FIG. 40 is a sectional view illustrating how a semiconductor chip is flip-chip bonded to over a wiring substrate in the second embodiment. In the description of the manufacturing method for the semiconductor device in the second embodiment, the description of a process common to the manufacturing method for the semiconductor device 10 in the first embodiment will be omitted. When the semiconductor chip 1 is flip-chip bonded to over the wiring substrate 24, the following procedure is taken: as illustrated in FIG. 40, the wiring substrate 24 is placed over a heat stage 25; while heat (indicated by thin arrows in FIG. 40) is applied to joints between the bump electrodes 21 and the bonding leads 24c, a tool (jig) 26 (indicated by a thick arrow in FIG. 40) is pressed against the rear surface of the semiconductor chip. The bump electrodes 21 and the bonding leads 24c are thereby electrically coupled together. In the example illustrated in FIG. 40, heat is applied both from the heat stage 25 side and from the pressing tool 26 side. That is, the tool 26 has the functions of a pressing jig and the functions of a heating jig. This is for efficiently transmitting heat to the joints between the bump electrodes 21 and the bonding leads 24c.

For this reason, load produced by pressing by the tool 26 is applied to the third insulating layer 2ha directly under the bonding leads 24c that are part of the first wiring layer 2g1 through the semiconductor chip 1 and the bump electrodes 21.

If a prepreg material (for example, such a material as the second insulating layers 2hp) harder than the third insulating layers 2ha comprised substantially only of resin is formed directly under the bonding leads 24c, there is the following possibility: cracking can be caused by this load at this time.

In the second embodiment, however, the third insulating layer 2ha directly under the bonding leads 24c does substantially not contain fiber and is comprised substantially only of resin. Therefore, this load can be absorbed and cracking in the wiring substrate 24 can be suppressed even though the thickness of the wiring substrate 24 is reduced.

Third Embodiment

In the description of the first and second embodiments, semiconductor devices 10, 20 with one semiconductor chip 1 mounted over the upper surface 2a of a wiring substrate 2, 24 have been taken as examples. In conjunction with the enhancement of functionality of semiconductor devices, SIP (System In Package) type semiconductor devices have been discussed in recent years. In the SIP type semiconductor device, a microcomputer semiconductor chip (microcomputer chip) having a computation circuit and a memory semiconductor chip (memory chip) having a memory circuit are mounted together in one semiconductor device to build one system.

Consequently, the present inventors examined such a SIP type semiconductor device.

Figure 41:
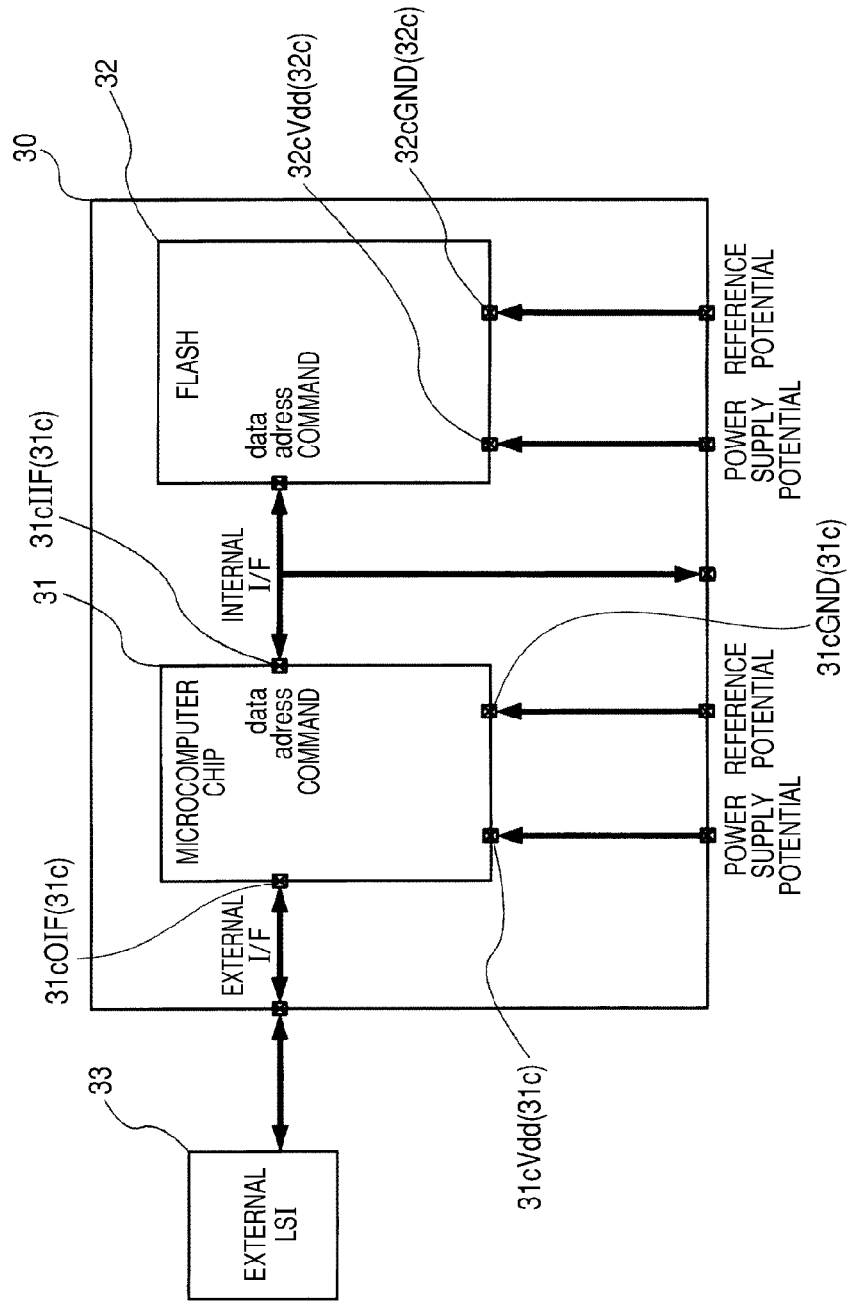
FIG. 41 is a circuit block diagram explaining the interior of a semiconductor device in a third embodiment of the invention and the circuit operation between this semiconductor device and an external device.

Before the configuration of the semiconductor device 30 in the third embodiment is described, description will be given to the circuit operation of the SIP type semiconductor device in the third embodiment with reference to the circuit block diagram in FIG. 41. FIG. 41 is a circuit block diagram explaining the interior of the semiconductor device in the third embodiment and the circuit operation carried out between this semiconductor device and an external device. Here, the following case will be taken as an example in accordance with the third embodiment: a case where a memory chip (second semiconductor chip) 32 in which a FLASH memory is formed is provided as a memory chip and a microcomputer chip (first semiconductor chip) 31 for controlling its operation and the like is provided. However, the number of memory chips 32 and their types are not limited to this example and a DRAM type memory chip may be adopted. Also with respect to the features of the semiconductor device 30 in the third embodiment, the description of the same configuration, effect, and the like as in the first embodiment will be omitted as in the description of the second embodiment.

One of the major roles of the microcomputer chip 31 is to carry out the following processing to input/output data between an external device (external LSI) 33 external to the system built of a microcomputer and a memory and the memory chip 32 internal to the system: converting a logical address (external address) for external interface to a physical address of the FLASH memory. For this purpose, the microcomputer chip 31 for subjecting inputted signals to computation has an internal interfacing (internal I/F) pad 31cIIF as an interface for the FLASH memory. The microcomputer chip also has the following pads: a pad (power supply potential pad) 31cVdd for inputting power supply potential for the microcomputer chip 31 to the computation circuit; and a pad (reference potential pad) 31cGND for inputting reference potential for the microcomputer chip 31 to the computation circuit.

When the microcomputer chip 31 undertakes this role, the microcomputer chip 31 also requires a pad (electrode) 31cOIF configuring an external interface (external I/F), aside from pads required for interfacing between it and the memory chip 32. In the microcomputer chip 31, therefore, the number of pads (electrodes) 31c, 32c is larger than in the memory chip 32 by an amount equivalent to the number of external interfacing pads (electrodes) 31cOIF required for external interface. Each of the above-mentioned pads 31c is electrically coupled with the computation circuit though not shown in the drawing.

Data outputted through the external interface is converted into varied information at the external device 33 and outputted to network equipment, human interface equipment, or the like.

Meanwhile, the memory chip 32 has a chip select terminal (not shown) in addition to the interface with the microcomputer chip 31. Data can be written to or read from the FLASH memory by enabling or disabling this chip select terminal. Further, the memory chip has a power-on reset terminal (not shown) for detecting specific addresses. In addition, the memory chip has the following pads: a pad (power supply potential pad) 32cVdd for inputting power supply potential for the memory chip to the memory circuit and a pad (reference potential pad) 32cGND for inputting reference potential for the memory chip to the memory circuit.

Figure 42:
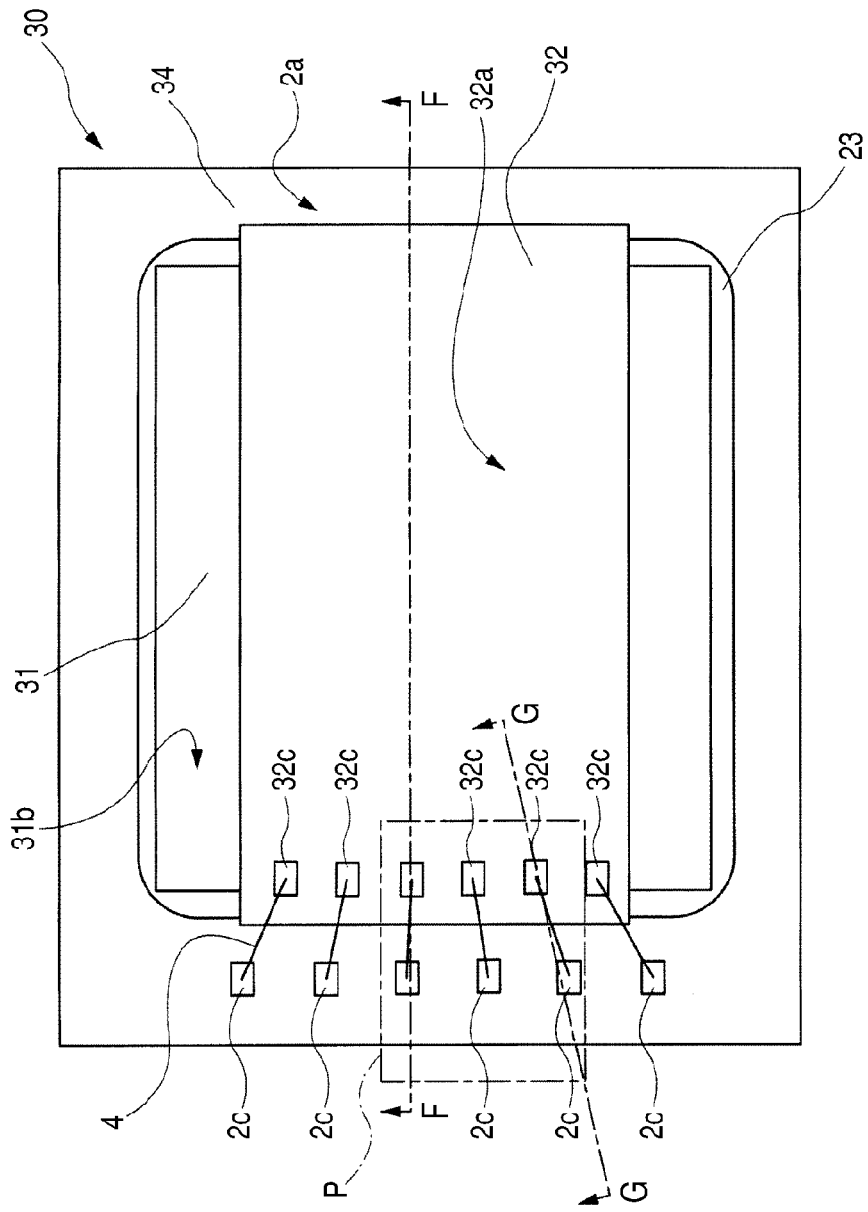
FIG. 42 is a plan view of the semiconductor device in the third embodiment of the invention as viewed from the upper surface side of a wiring substrate where semiconductor chips are mounted.
Figure 43:
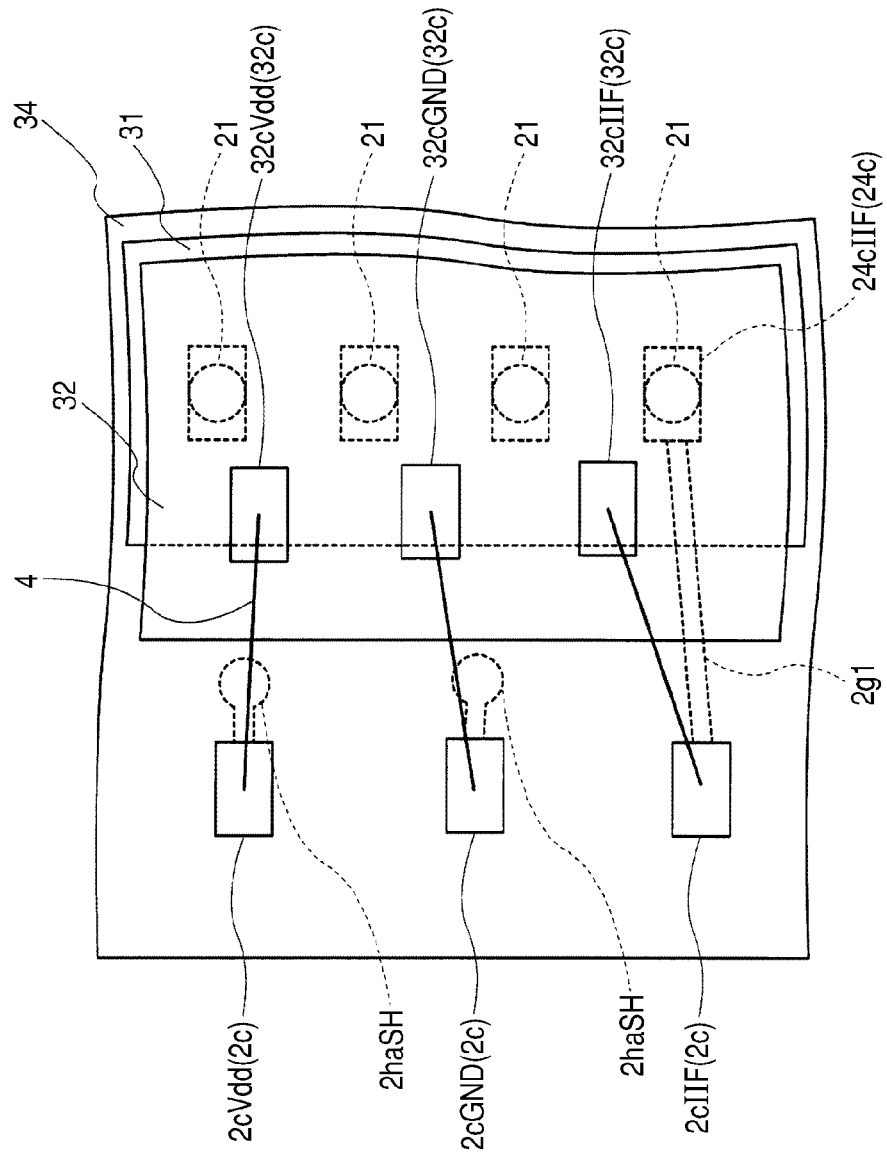
FIG. 43 is an enlarged substantial part plan view illustrating P site in the wiring substrate illustrated in FIG. 42.
Figure 44:
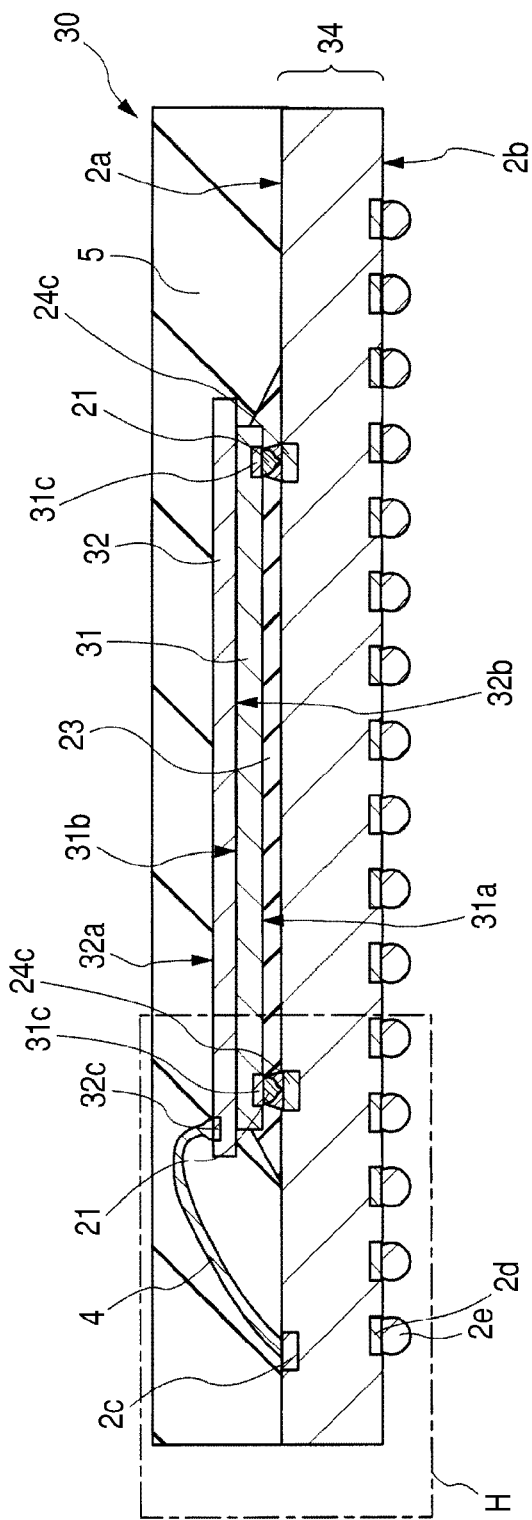
FIG. 44 is a sectional view taken along line F-F of FIG. 42.
Figure 45:
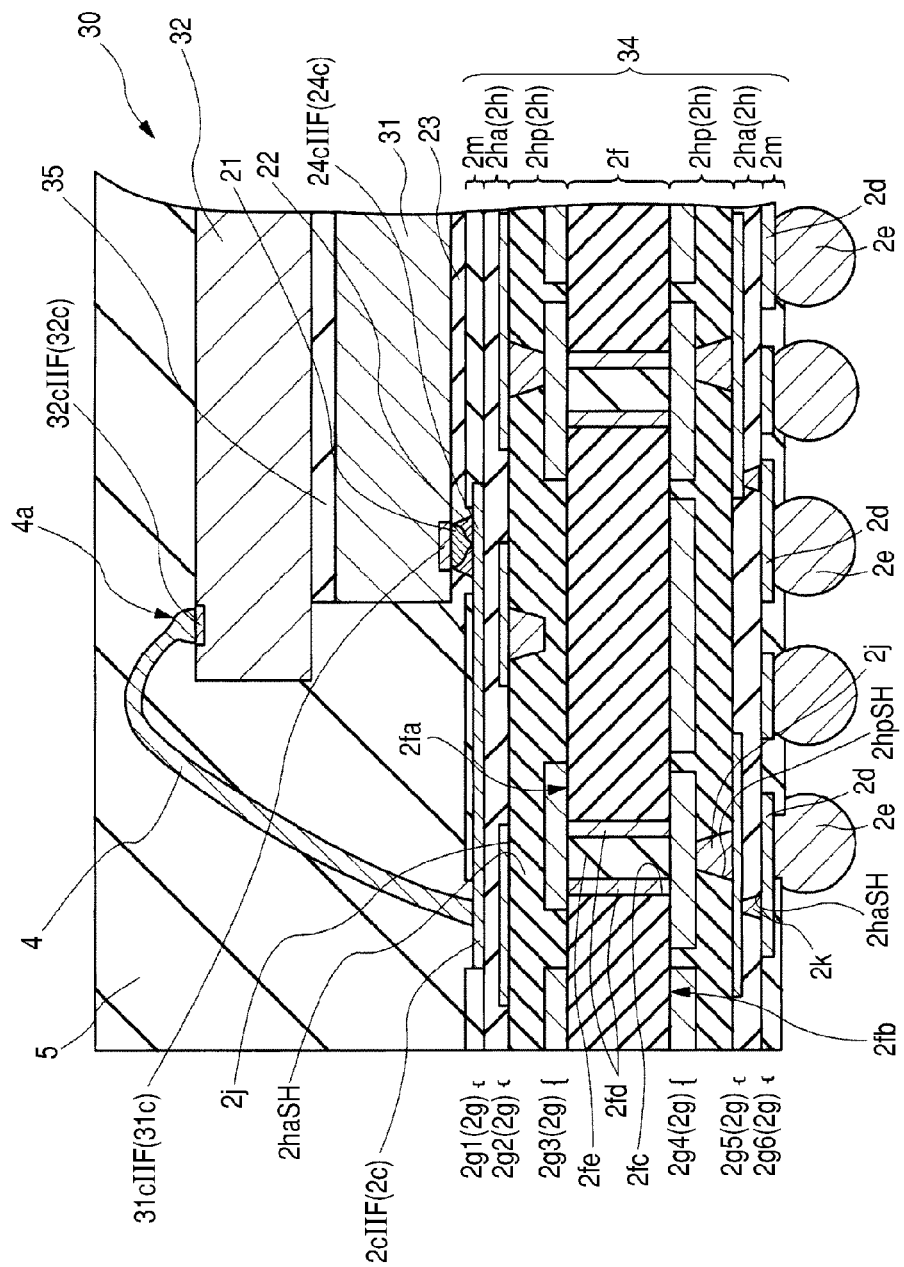
FIG. 45 is an enlarged sectional view of H site in FIG. 44.
Figure 46:
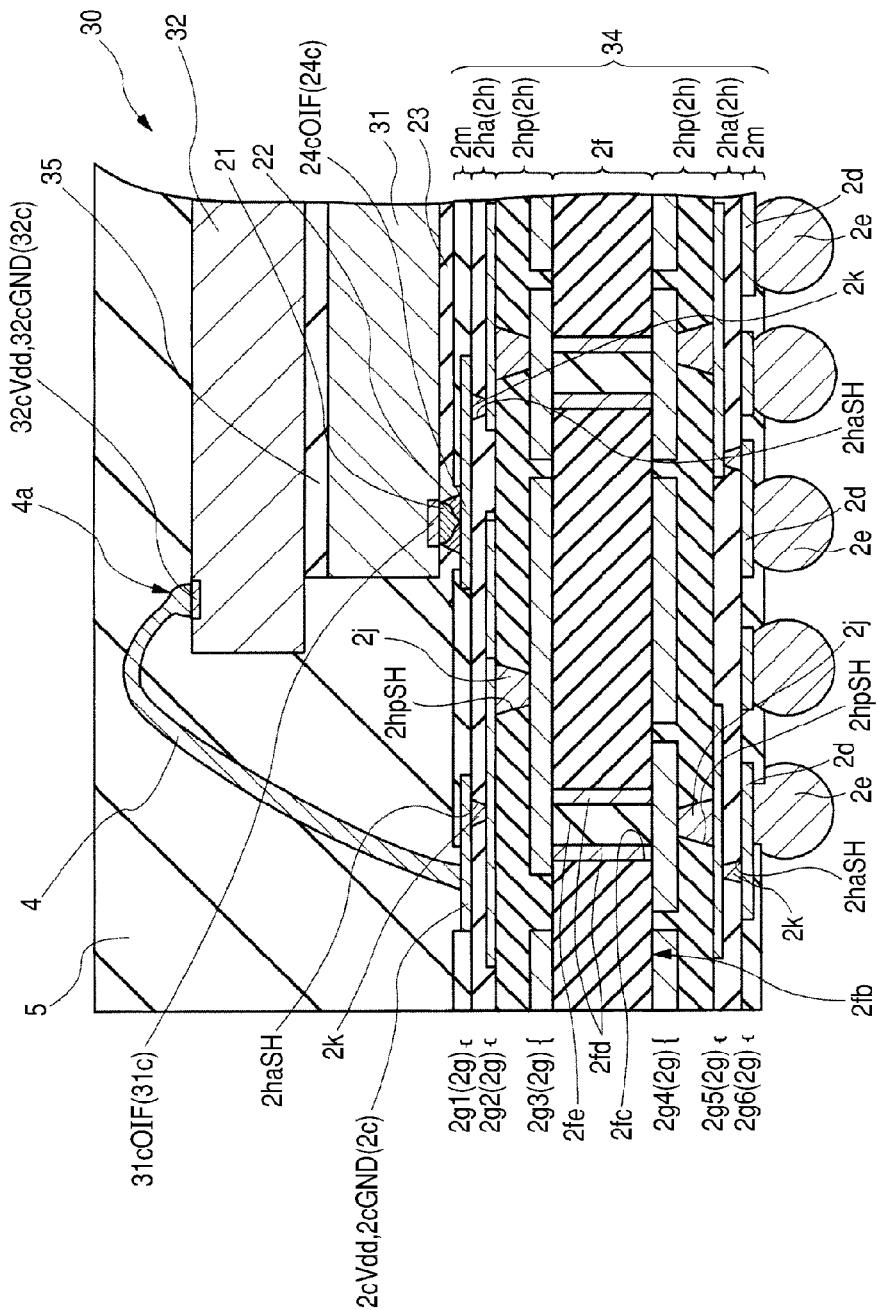
FIG. 46 is an enlarged sectional view taken along line G-G of FIG. 42.

FIG. 42 is a plan view of the wiring substrate mounted with the semiconductor chips in the third embodiment as viewed from the upper surface side. FIG. 43 is an enlarged substantial part plan view of P site in FIG. 42. FIG. 44 is a sectional view taken along line F-F of FIG. 42. FIG. 45 is an enlarged sectional view of H site in FIG. 44. FIG. 46 is an enlarged sectional view taken along line G-G of FIG. 42. The planar arrangement of the pads 31c in the main surface 32 of the microcomputer chip 31 illustrated in FIG. 42 is the same as the planar arrangement of the pads 1c in the semiconductor chip 1 illustrated in FIG. 1. Therefore, the drawing thereof will be omitted.

In the semiconductor device 30 in the third embodiment, the following is implemented: the multiple lands formed in the lower surface of the wiring substrate include testing lands 2d for checking the electrical coupling between the microcomputer chip 31 and memory chip 32 mounted over the wiring substrate.

In the SIP type semiconductor device 30 in the third embodiment, as mentioned above, the following takes place: the number of the semiconductor chips (microcomputer chip 31, memory chip 32) mounted over the wiring substrate 34 is increased as compared with the first and second embodiments and the total number of the pads (pads 31c, 32c) of the semiconductor chips is also increased. Therefore, more wiring patterns (wiring layers) are formed in the wiring substrate.

To reduce the outer dimensions of the semiconductor device 30, the following measure is preferable to mounting semiconductor chips side by side over the upper surface 2a of the wiring substrate 34: one semiconductor chip is stacked over another semiconductor chip.

In the third embodiment, the microcomputer chip 31 is mounted over the wiring substrate 34 and the memory chip 32 is mounted over this microcomputer chip 31.

More detailed description will be given. As illustrated in FIG. 42 and FIG. 44, the microcomputer chip (first semiconductor chip) 31 includes: a main surface (first main surface) 31a where multiple pads (first pads) 31c are formed; and a rear surface (first rear surface) 31b positioned on the opposite side to the main surface 31a. The microcomputer chip is mounted over the upper surface 2a of the wiring substrate 34 so that the main surface 31a of the microcomputer chip 31 is opposed to the upper surface 2a of the wiring substrate 34. In other words, the microcomputer chip 31 is face-down mounted over the wiring substrate 34.

The memory chip (second semiconductor chip) 32 includes: a main surface (second main surface) 32a where multiple pads (second pads) 32c are formed; and a rear surface (second rear surface) 32b positioned on the opposite side to the main surface 32a. The memory chip 32 is stacked over the microcomputer chip 31 so that the rear surface 32b of the memory chip 32 is opposed to the rear surface 31b of the microcomputer chip 31. In other words, the memory chip 32 is face-up mounted over the microcomputer chip 31. As illustrated in FIG. 45, the memory chip 32 is mounted over the microcomputer chip 31 with a film-like adhesive 35 in-between.

The wiring substrate 34 over which the semiconductor chips (microcomputer chip 31 and memory chip 32) are mounted includes an upper surface 2a and a lower surface 2b. The wiring substrate 34 has the following leads on the upper surface 2a side: bonding leads (first bonding leads, flip bonding leads) 24c electrically coupled with the pads 31c of the microcomputer chip 31; and bonding leads (second bonding leads, wire bonding leads) 2c placed around (on the peripheral side of) the bonding leads 24c and electrically coupled with the pads 32c of the memory chip 32. As illustrated in FIG. 44, the pads (first pads) 31c of the microcomputer chip 31 and the bonding leads 24c of the wiring substrate 34 are electrically coupled together like the bonding leads 24*c* in the second embodiment. That is, the pads and the bonding leads are electrically coupled together through bump electrodes (bump-like electrodes) 21 as conductive members (first conductive members) formed over the pads 31*c* of the microcomputer chip 31. These bump electrodes 21 are encapsulated with underfill resin (first encapsulating body) 23 formed between the main surface 31*a* of the microcomputer chip 31 and the upper surface 2*a* of the wiring substrate 34.

As illustrated in FIG. 42 and FIG. 44, the pads 32*c* of the memory chip 32 and the bonding leads 2*c* of the wiring substrate 34 are electrically coupled together through wires 4 as conductive members (second conductive members) as in the first embodiment. The microcomputer chip 31, memory chip 32, and wires 4 are encapsulated with an encapsulating body (second encapsulating body) 5 formed over the upper surface 2*a* of the wiring substrate 34.

Of the pads 31*c*, 32*c* of the microcomputer chip 31 and the memory chip 32, pads 31*c*, 32*c* used to input/output data are electrically coupled with each other through a wiring layer 2*g* in the wiring substrate 34 as illustrated in FIG. 45. In the description of the third embodiment, a case where they are coupled together in the first wiring layer 2*g*1 is taken as an example. More detailed description will be given. In the example illustrated in FIG. 43 and FIG. 45, the following is implemented with respect to an internal interfacing bonding lead 2*c*IIF electrically coupled with an internal interfacing pad 32*c*IIF of the memory chip 32 among the bonding leads 2*c* of the wiring substrate 34: it is electrically coupled with an internal interfacing bonding lead 24*c*IIF, electrically coupled with an internal interfacing pad 31*c*IIF of the microcomputer chip 31, in the wiring substrate 34. FIG. 43 is an enlarged plan view of P site in FIG. 42 and illustrates the relation of coupling as seen through the protective film formed over the first wiring layer 2*g*1. This state of coupling corresponds to the relation of coupling between the memory chip (FLASH) 32 and the microcomputer chip 31 illustrated in FIG. 41.

The internal interfacing pads 31*c*IIF of the microcomputer chip 31 are electrically coupled with the external interfacing pads 31*c*OIF of the microcomputer chip 31 through the computation circuit formed in the microcomputer chip. The external interfacing pads 31*c*OIF of the microcomputer chip 31 are electrically coupled to the bump electrodes 2*e* as external terminals of the semiconductor device 30 through a wiring layer 2*g* in the wiring substrate 34 as illustrated in FIG. 46. The power supply potential pads 32*c*Vdd and the reference potential pads 32*c*GND of the memory chip 32 are routed from the bonding leads 2*c*Vdd (or 2*c*GND) to an internal layer of the wiring substrate 34 through wiring (metal film) 2*k*. Further, the pads 32*c*Vdd, 32*c*GND are respectively coupled to the bump electrodes 2*e* as external terminals of the semiconductor device 30 through a wiring layer 2*g* in the wiring substrate 34. At this time, the power supply potential pads 32*c*Vdd and reference potential pads 32*c*GND of the memory chip 32 are not used for power supply potential or reference potential of the microcomputer chip 31 and are independently provided as illustrated in FIG. 41. For this reason, current paths are directly routed from the bonding leads 2*c*Vdd (or 2*c*GND) of the wiring substrate 34 to corresponding lands 2*d*, not by way of the pads 31*c* of the microcomputer chip 31. The power supply potential pads 31*c* and reference potential pads 31*c* of the microcomputer chip 31 are also respectively electrically coupled to the bump electrodes 2*e* as external terminals of the semiconductor device 30. This electrical coupling is also carried out through a wiring layer 2*g* in the wiring substrate 34 though not shown in the drawings.

The reason why the microcomputer chip 31 is mounted under the memory chip 32 is that: the total number of the pads 31*c* of the microcomputer chip 31 is larger than the total number of the pads 32*c* of the memory chip 32 as mentioned above. There is a possibility that the following can take place in the subsequent process of forming the encapsulating body (second encapsulating body) 5 (molding process): a wire 4 can be swept by the pressure of supplied resin and wires 4 formed prior to the molding process can be short-circuited together. For this reason, it is required to take the following measure if the microcomputer chip 31 is face-up mounted on the upper side: the pitch of bonding leads (wire bonding leads) 2*c* to which wires 4 of the wiring substrate 34 are coupled must be made larger than the pitch of bonding leads (flip bonding leads) 24*c* to which bump electrodes are coupled. If the microcomputer chip 31 larger in the total number of pads than the memory chip 32 is stacked on the upper side, the outer dimensions of the wiring substrate 34 will be increased. To cope with this, in the third embodiment, the microcomputer chip 31 is mounted under the memory chip 32.

In the SIP type semiconductor device in the third embodiment, as mentioned above, the microcomputer chip 31 is mounted under the memory chip 32; therefore, downsizing of the semiconductor device 30 can be achieved.

In the SIP type semiconductor device 30 in the third embodiment, the number of semiconductor chips mounted (stacked) over the wiring substrate 34 is larger than in the first and second embodiments. When the number of semiconductor chips mounted over a wiring substrate 34 is increased, the amount of silicon (Si) placed over the wiring substrate 34 is also larger than in the first and second embodiments. As a result, the problem of warpage more prominently arises. To cope with this, the thickness of the wiring substrate 34 used in a SIP type semiconductor device 30 must be made larger than the thickness of the wiring substrates 2, 24 used when a single semiconductor chip is mounted to ensure strength (hardness). In the SIP type semiconductor device 30, for this reason, reduction of the mounting height of the semiconductor device 30 is a more significant challenge than in the first and second embodiments.

Also in the semiconductor device 30 in the third embodiment as well as the first and second embodiments, however, the following is implemented: a wiring substrate configuring a first insulating layer (core material 2*f*) and second insulating layers 2*hp* comprised of prepreg material and third insulating layers 2*ha* comprised substantially only of resin is used. For this reason, the strength (hardness) of the wiring substrate can be ensured even though the thickness of the wiring substrate 34 is reduced to reduce the thickness of the semiconductor device 30.

In the wiring substrate 34 in the third embodiment, substantially the same level of strength (hardness) as that of a wiring substrate in a comparative example. In this wiring substrate in the comparative example, a prepreg material is not used for the second insulating layers 2*hp* unlike the example in FIG. 45 and the second insulating layers 2*hp* and the third insulating layers 2*ha* are comprised of insulating layers that do substantially not contain fiber and are comprised substantially only of resin. The above level of strength (hardness) can be ensured even though the thickness of the wiring substrate is reduced to approximately ⅔ of the thickness of the wiring substrate in the comparative example.

In case of the SIP type semiconductor device 30 in the third embodiment, it is possible not only to reduce the area occupied by the semiconductor device 30 over a mother board (mounting board). It is also possible to shorten the transmission paths for signals inputted/outputted between the microcomputer chip 31 and the memory chip 32 as compared with cases where the microcomputer chip 31 and the memory chip 32 are manufactured as separate semiconductor devices 30. This makes it possible to cope with the enhancement of speed of the semiconductor devices 30.

Figure 47:
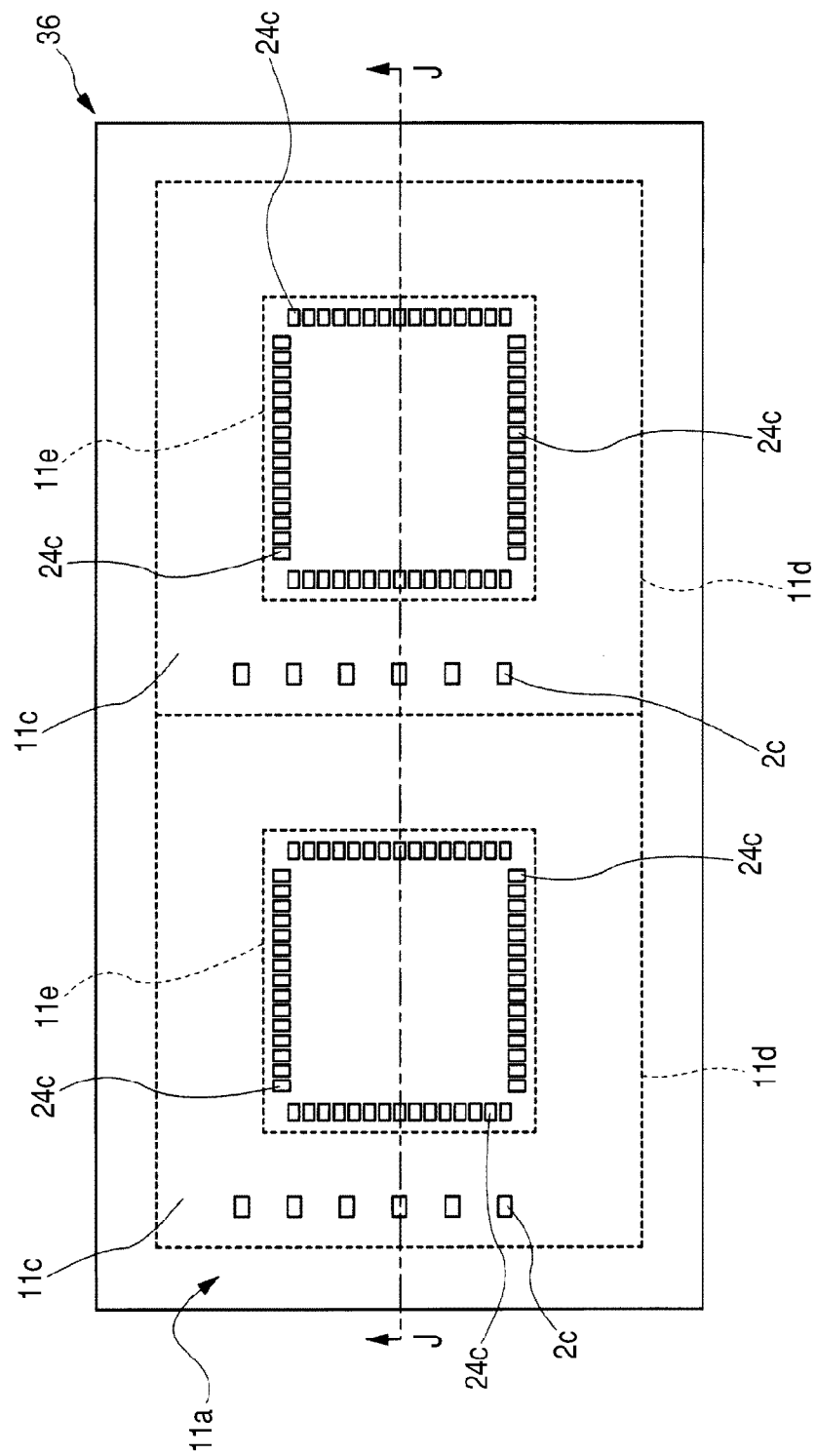
FIG. 47 is a plan view illustrating the upper surface side of wiring substrates prepared for multiple cavity molding in a manufacturing method for the semiconductor device in the third embodiment of the invention.
Figure 48:
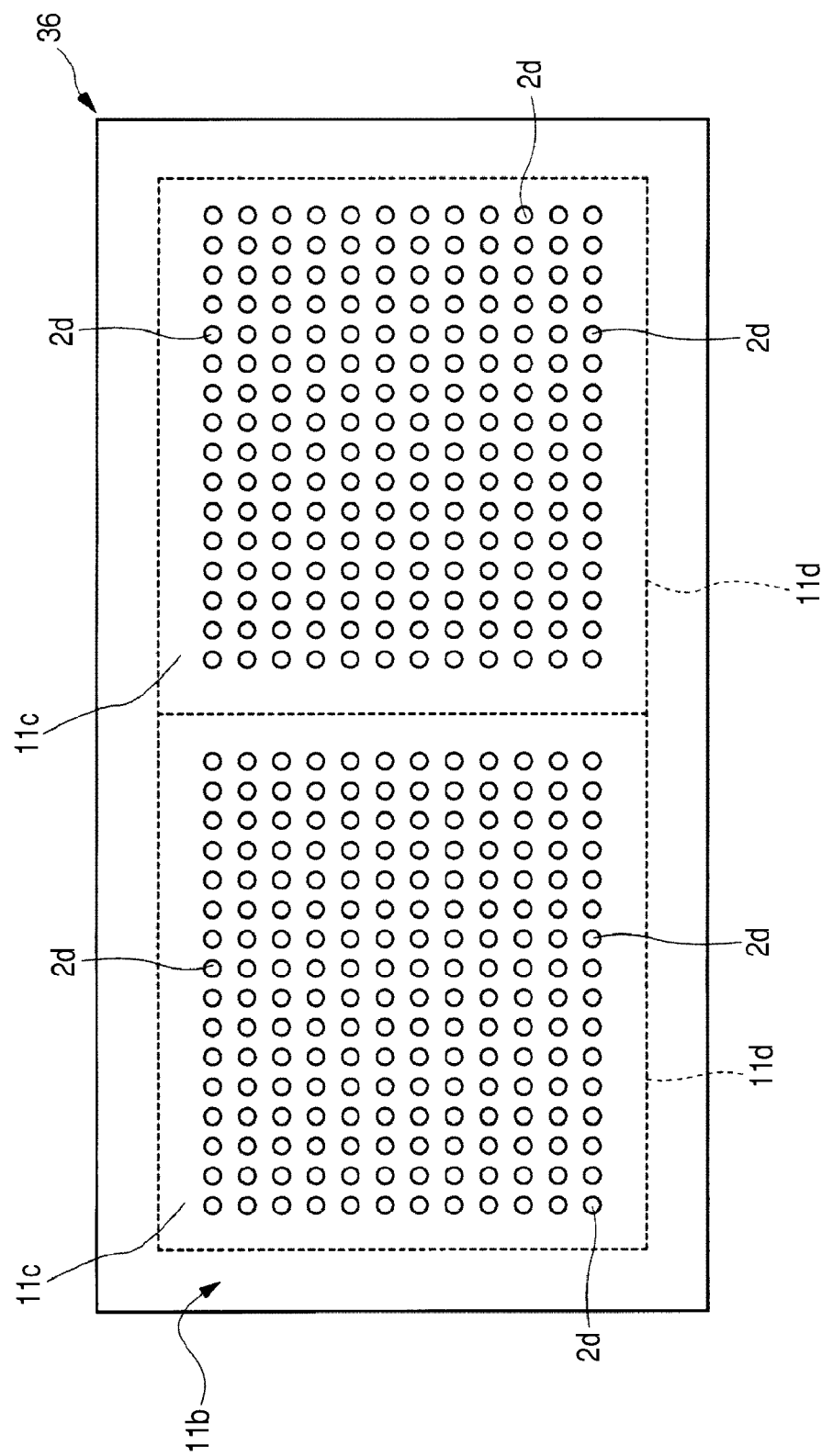
FIG. 48 is a plan view illustrating the lower surface side of the wiring substrates for multiple cavity molding illustrated in FIG. 47.
Figure 49:
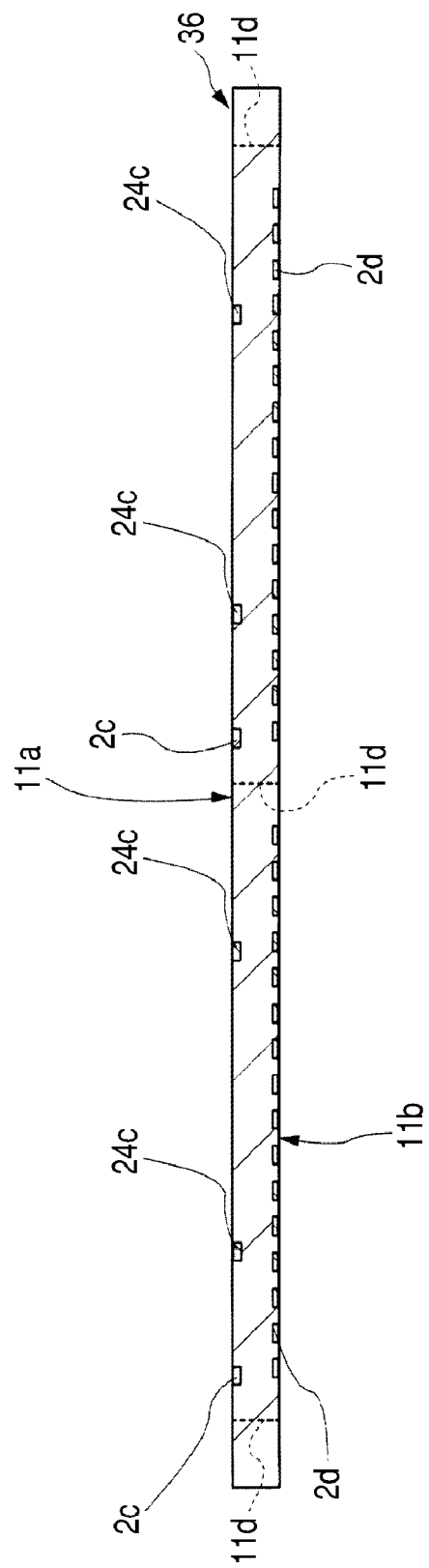
FIG. 49 is a sectional view taken along line J-J of FIG. 47.
Figure 50:
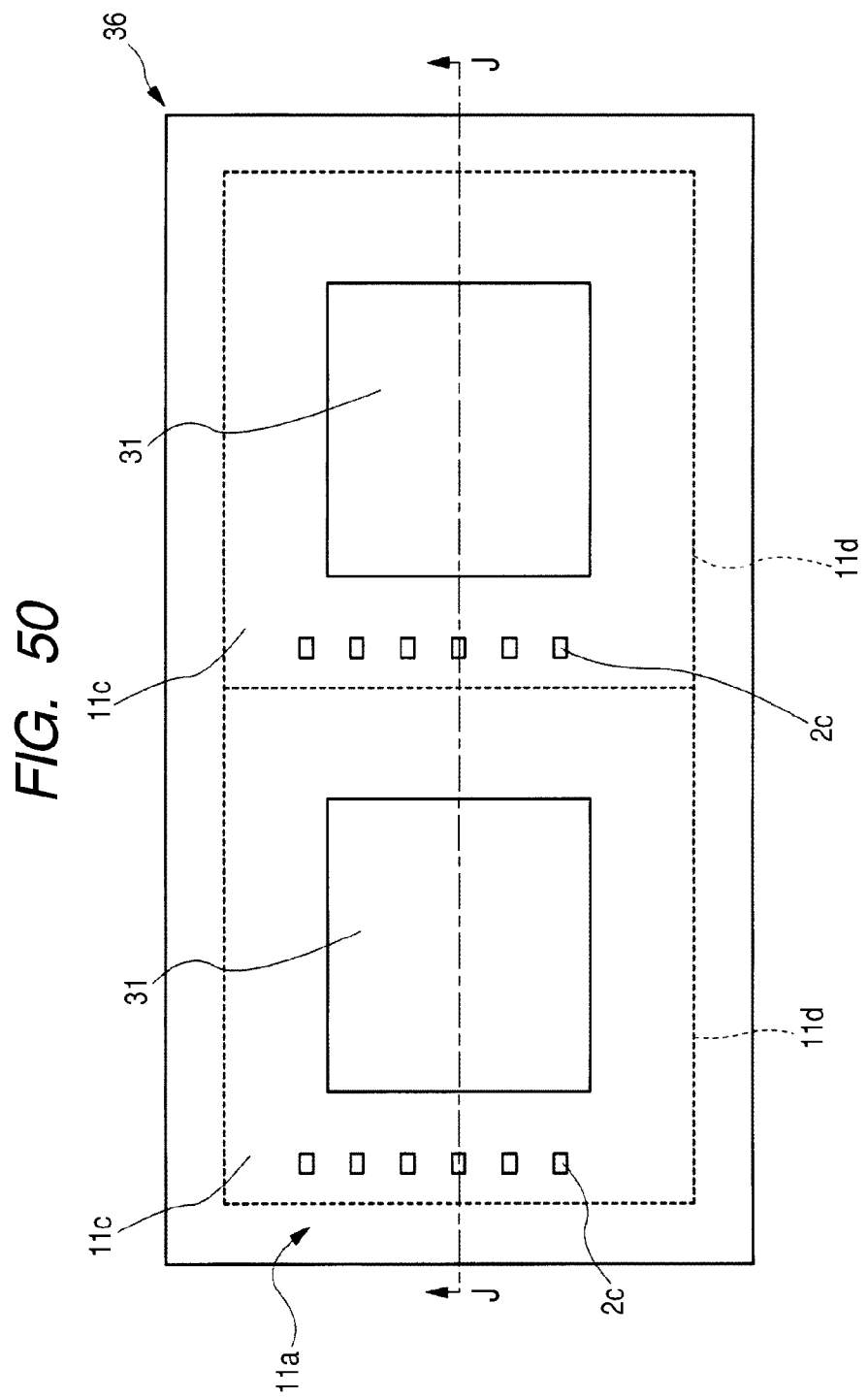
FIG. 50 is a plan view of the wiring substrates illustrated in FIG. 47 with microcomputer chips flip-chip bonded thereto as viewed from the upper surface side of the wiring substrates.
Figure 51:
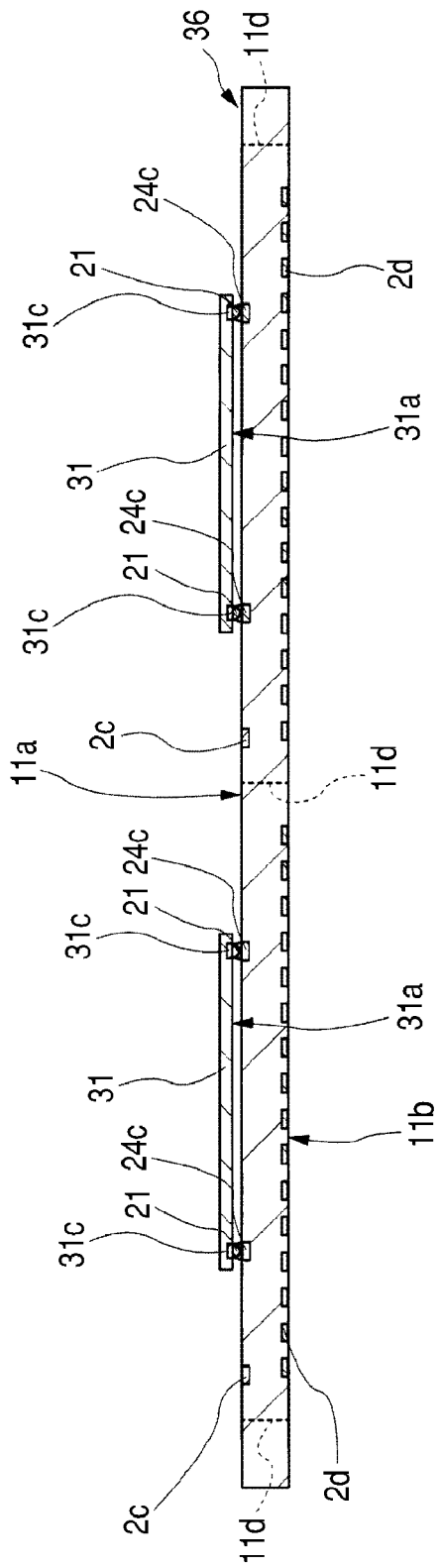
FIG. 51 is a sectional view taken along line J-J of FIG. 50.
Figure 52:
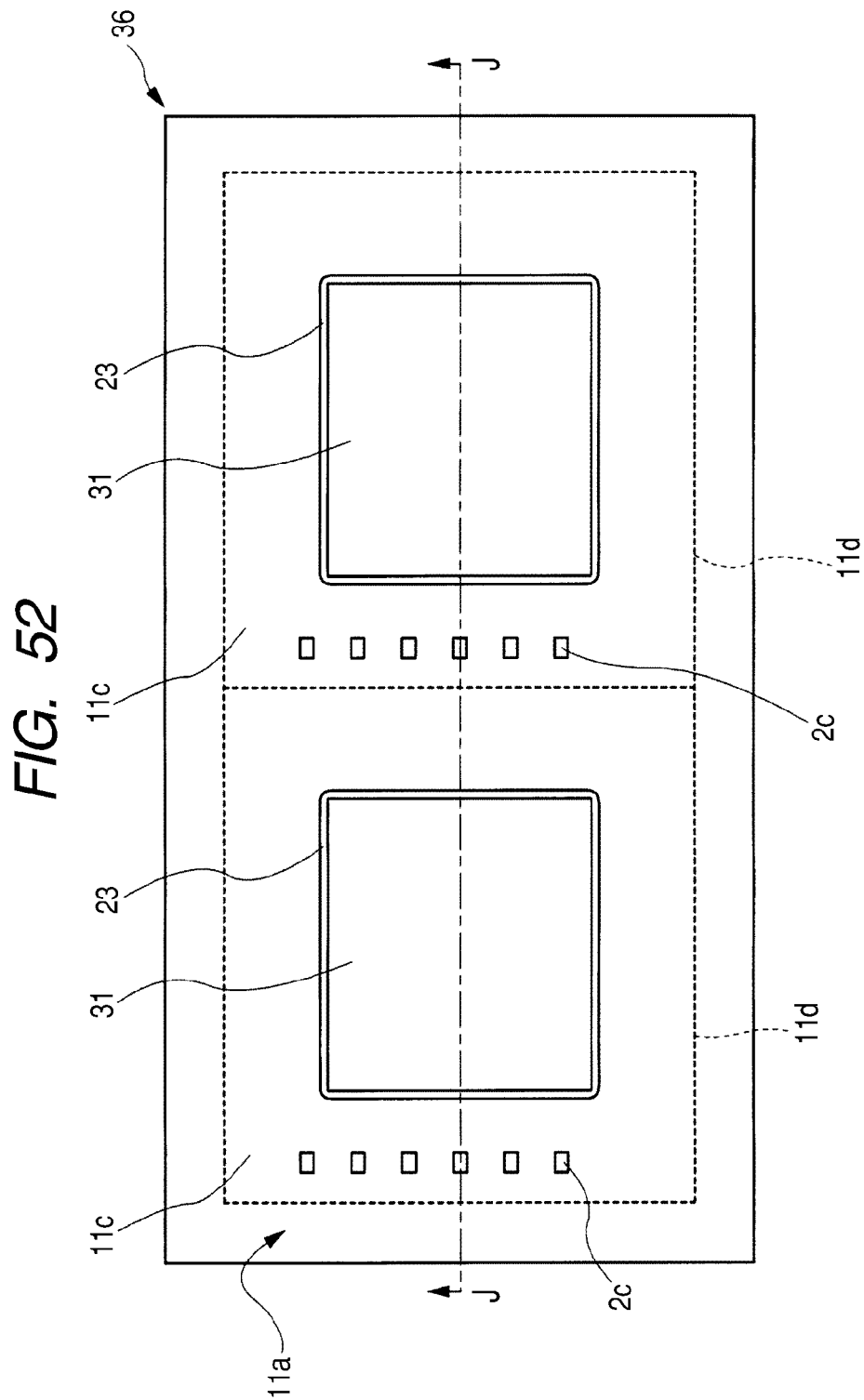
FIG. 52 is a plan view of the wiring substrates for multiple cavity molding with underfill resin supplied between the microcomputer chips and the wiring substrates illustrated in FIG. 50 as viewed from the upper surface side.
Figure 53:
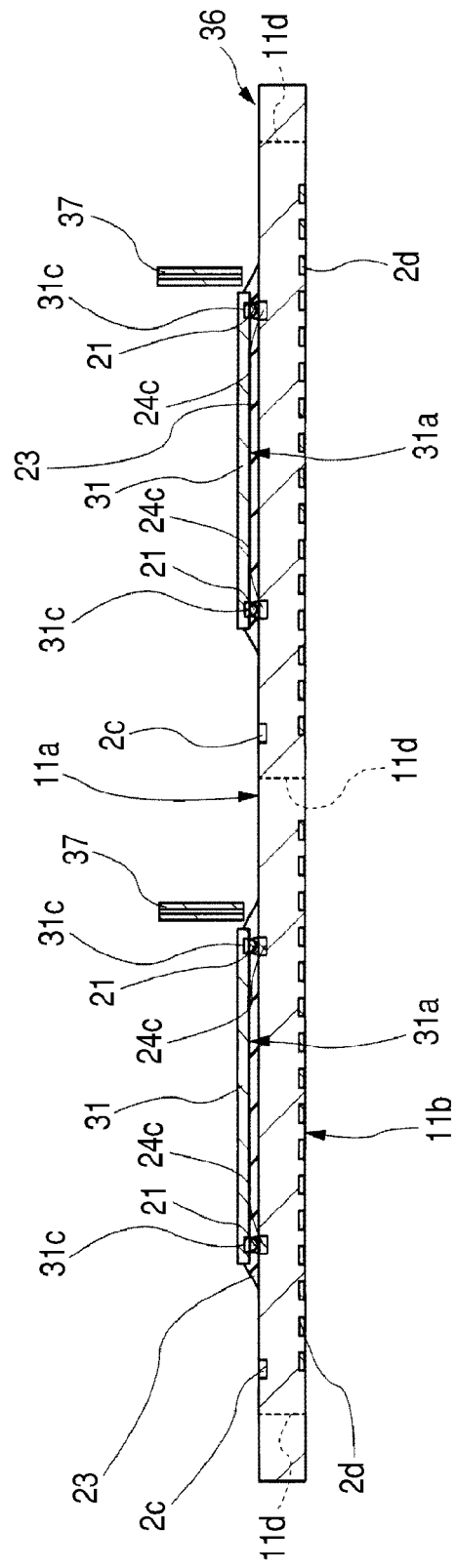
FIG. 53 is a sectional view taken along line J-J of FIG. 52.
Figure 54:
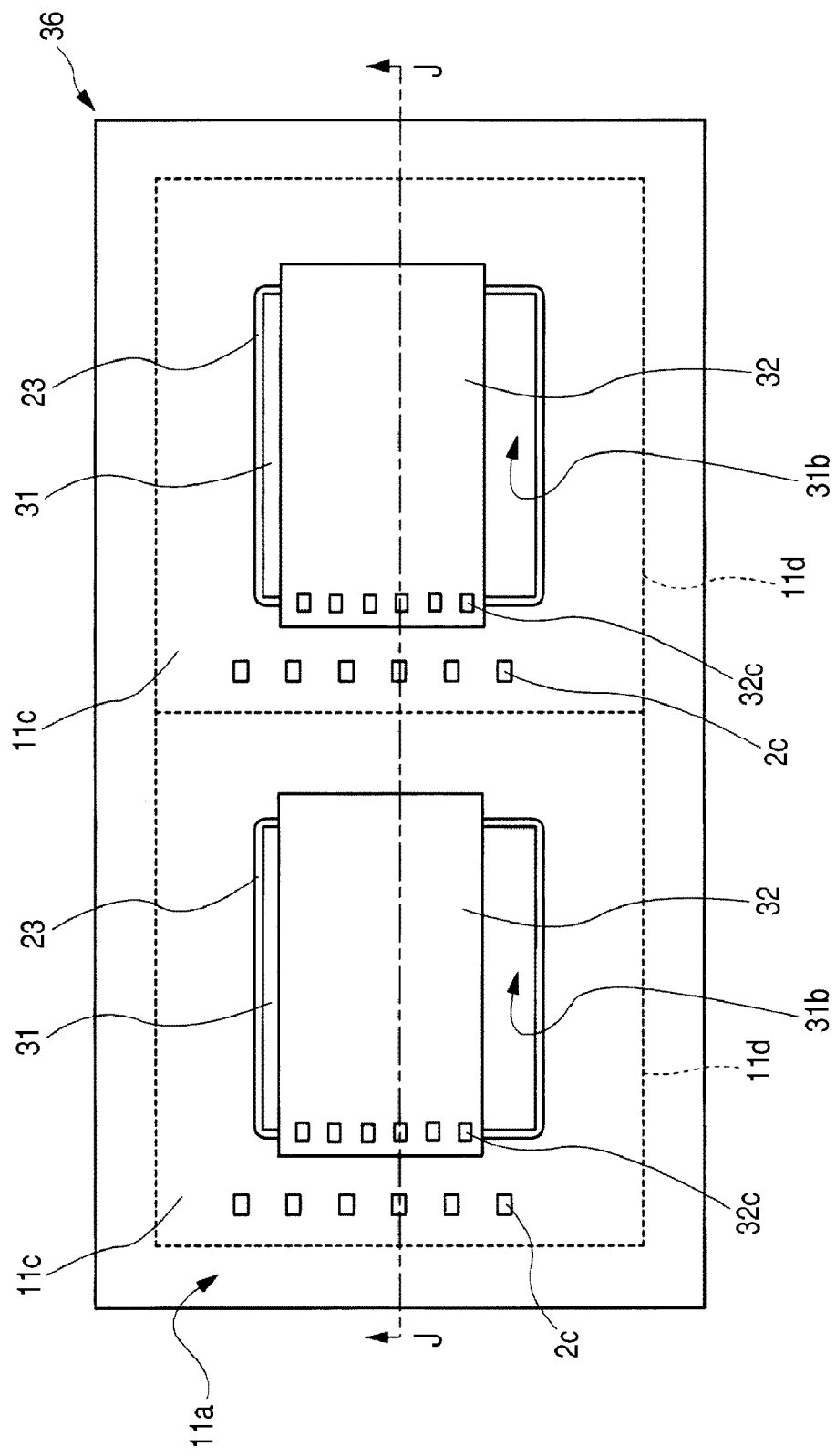
FIG. 54 is a plan view of the wiring substrates for multiple cavity molding with memory chips stacked over the microcomputer chips illustrated in FIG. 52 as viewed from the upper surface side.
Figure 55:
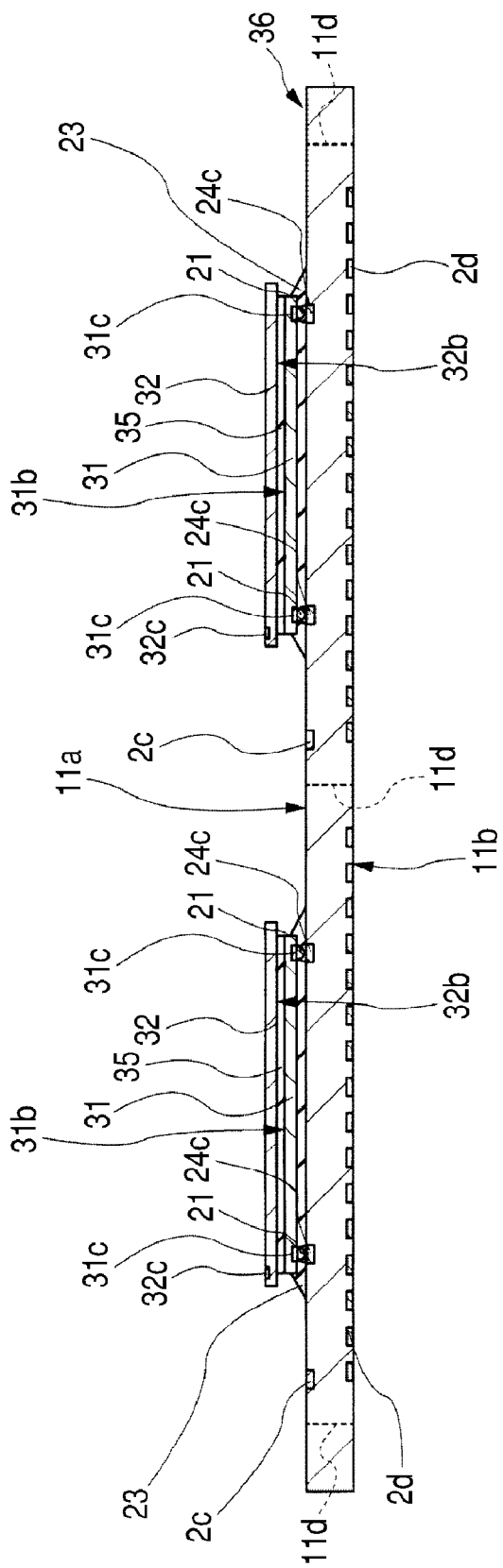
FIG. 55 is a sectional view taken along line J-J of FIG. 54.
Figure 56:
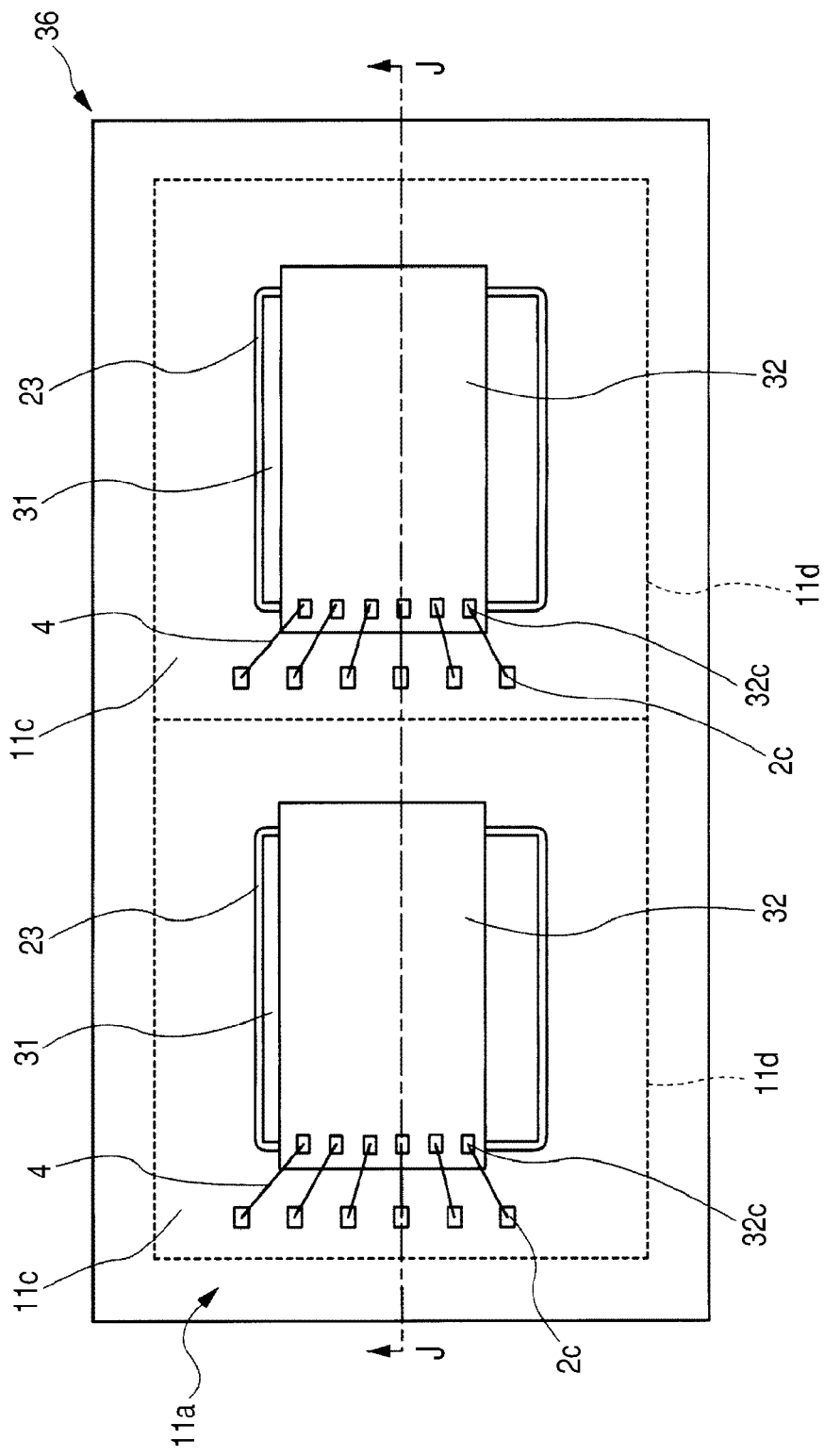
FIG. 56 is a plan view of the wiring substrates for multiple cavity molding with the memory chips and the wiring substrates illustrated in FIG. 54 electrically coupled together through wires as viewed from the upper surface side.
Figure 57:
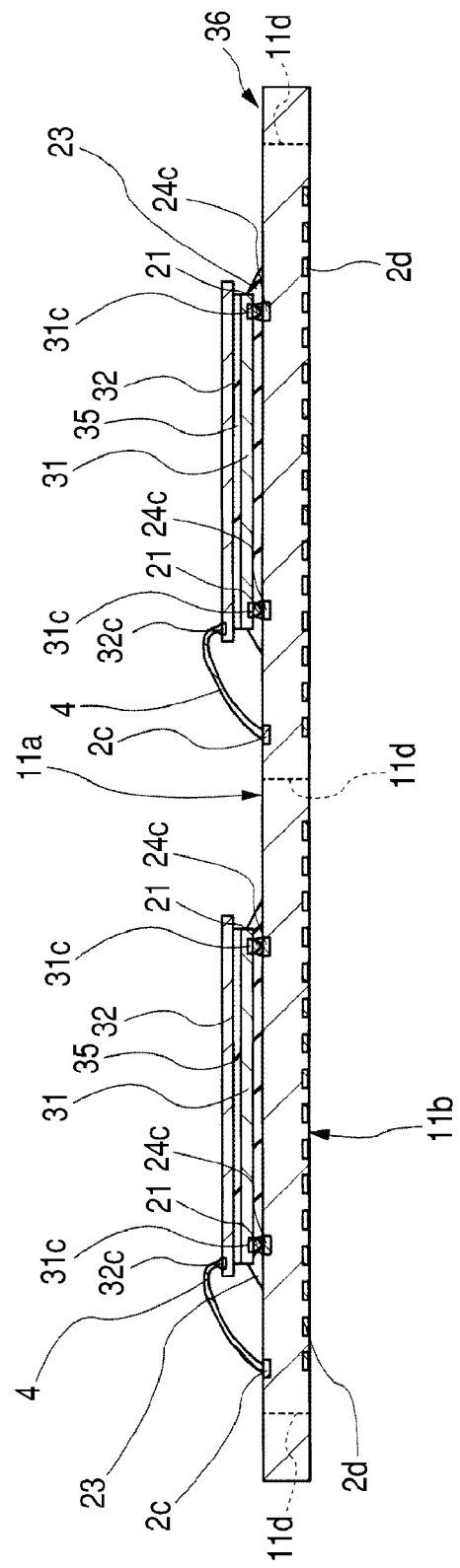
FIG. 57 is a sectional view taken along line J-J of FIG. 56.
Figure 58:
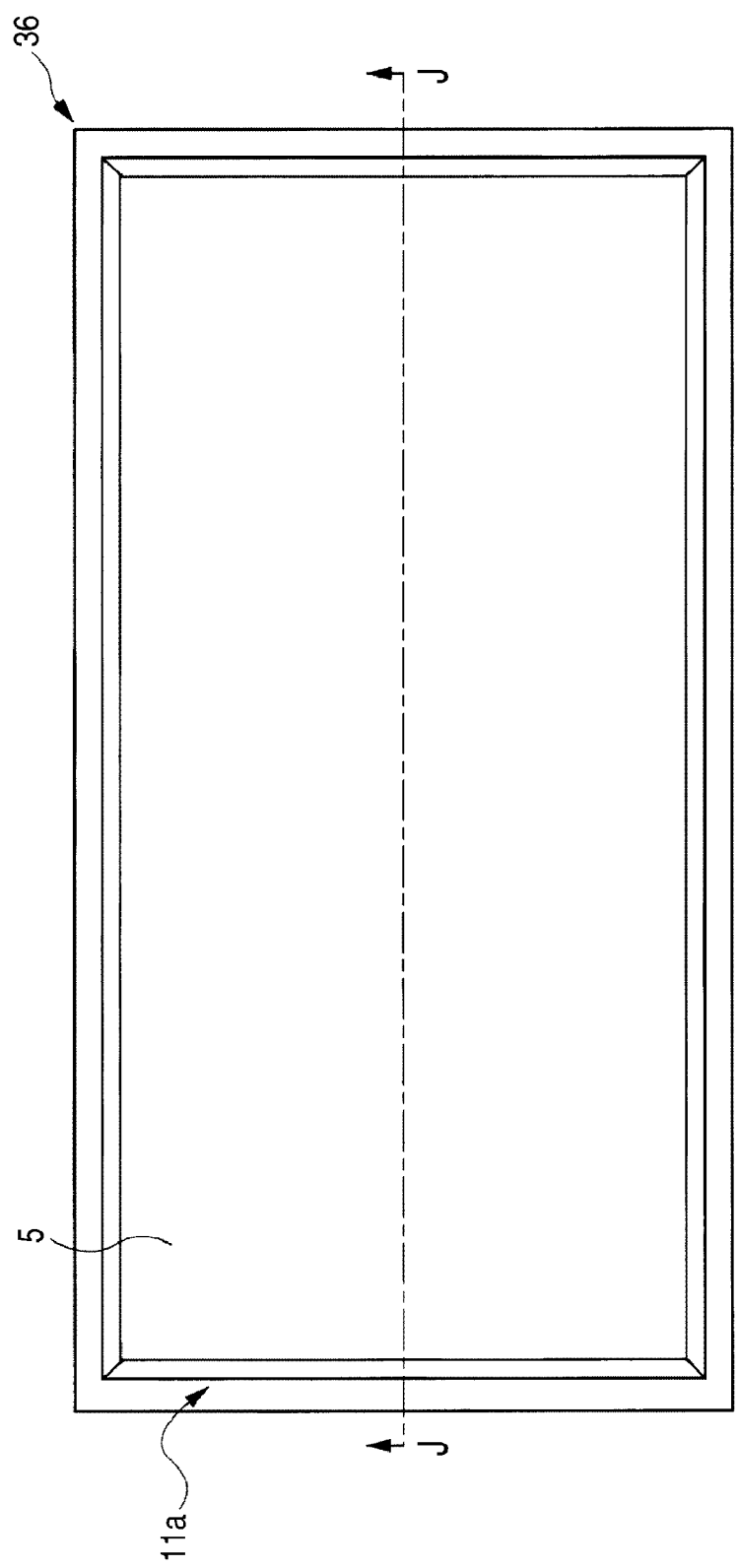
FIG. 58 is a plan view of the wiring substrates for multiple cavity molding illustrated in FIG. 56 with an encapsulating body formed over the wiring substrates as viewed from the upper surface side.
Figure 59:
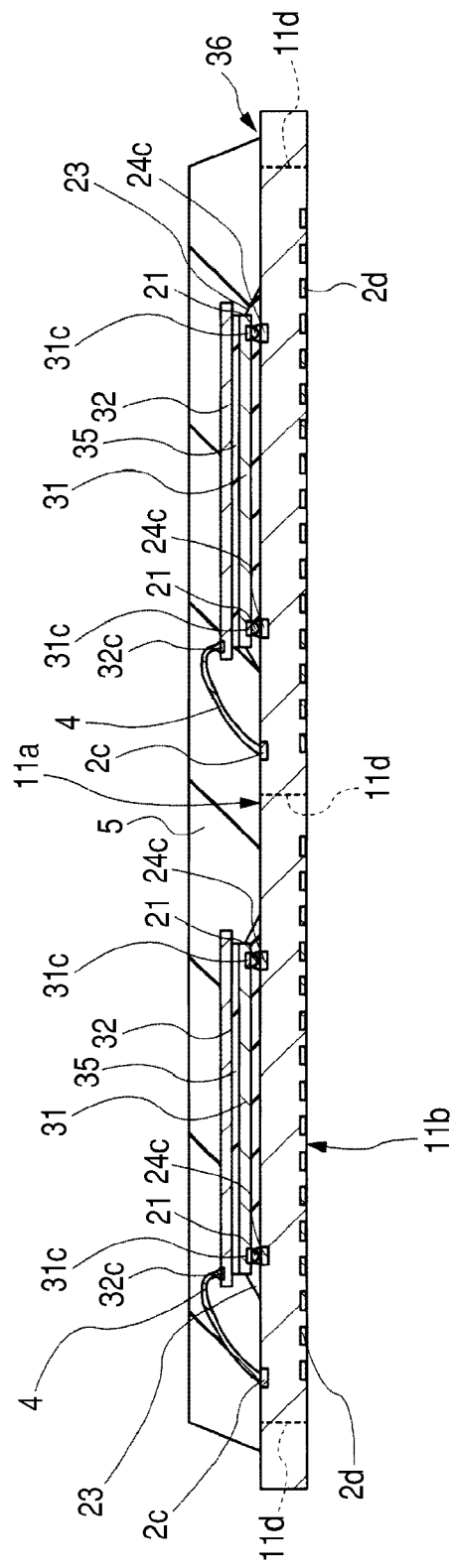
FIG. 59 is a sectional view taken along line J-J of FIG. 58.

Description will be given to a manufacturing method for the semiconductor device in the third embodiment with reference to FIG. 47 to FIG. 59. The drawings from FIG. 47 to FIG. 59 explain the manufacturing method for the semiconductor device in the third embodiment. FIG. 47 is a plan view illustrating the upper surface side of wiring substrates prepared for multiple cavity molding in the third embodiment. FIG. 48 is a plan view illustrating the lower surface side of the wiring substrates for multiple cavity molding illustrated in FIG. 47. FIG. 49 is a sectional view taken along line J-J of FIG. 47. FIG. 50 is a plan view illustrating the wiring substrates for multiple cavity molding with microcomputer chips flip-chip bonded to thereover in the third embodiment as viewed from the upper surface side of the wiring substrates for multiple cavity molding. FIG. 51 is a sectional view taken along line J-J of FIG. 50. FIG. 52 is a plan view of the wiring substrates for multiple cavity molding with underfill resin supplied between the microcomputer chips and the wiring substrates in the third embodiment as viewed from the upper surface side. FIG. 53 is a sectional view taken along line J-J of FIG. 52. FIG. 54 is a plan view of the wiring substrates for multiple cavity molding with memory chips stacked over the microcomputer chips in the third embodiment as viewed from the upper surface side. FIG. 55 is a sectional view taken along line J-J of FIG. 54. FIG. 56 is a plan view illustrating how the memory chips and the wiring substrates are electrically coupled together through wires in the third embodiment as viewed from the upper surface side of the wiring substrates for multiple cavity molding. FIG. 57 is a sectional view taken along line J-J of FIG. 56. FIG. 58 is a plan view illustrating how an encapsulating body is formed over the wiring substrates in the third embodiment as viewed from the upper surface side of the wiring substrates for multiple cavity molding. FIG. 59 is a sectional view taken along line J-J of FIG. 58.

First, wiring substrates 36, illustrated in FIG. 47 to FIG. 49, for multiple cavity molding having multiple product formation regions (device formation regions) 11c and a dicing area (indicated by broken line in FIG. 47) 11d positioned between the product formation regions 11c are prepared. In each product formation region 11c, there are formed multiple bonding leads 2c, 24c. The bonding leads 2c, 24c include the following bonding leads: bonding leads (first bonding leads) 24c for flip-chip bonding electrically coupled to the pads (electrodes, microcomputer chip pads) 31c of each microcomputer chip 31 with bump electrodes 21 in-between; and bonding leads (second bonding leads) 2c for wire bonding that are formed between the bonding leads 24c for flip-chip bonding and one side of each wiring substrate 36 and electrically coupled with the pads (electrodes, memory chip pads) 32c of each memory chip 32 through wires 4.

In the upper surface 11a of each wiring substrate 36, a chip placement area 11e that is an area where a semiconductor chip (microcomputer chip 31) is mounted in the subsequent process is formed as illustrated in FIG. 47. The bonding leads 24c are formed in each chip placement area 11e along each side configuring the outline of the chip placement area 11e. The bonding leads 2c are formed between each chip placement area 11e and one side configuring the outline of the corresponding product formation region 11c. The total number of the bonding leads 24c, 2c is larger than the number of the bonding leads 2c or bonding leads 24c described in relation to the first embodiment. In the lower surface 11b of each wiring substrate 36, multiple lands 2d are formed in a matrix pattern as illustrated in FIG. 48. The number of the lands 2d is larger than the number of the lands 2d described in relation to the first and second embodiments.

As illustrated in FIG. 50 and FIG. 51, subsequently, the microcomputer chip 31 is flip-chip bonded to each of the product formation regions 11c of the wiring substrates 36 (gold-solder joining). The details of the flip-chip bonding process carried out at this time is the same as illustrated in FIG. 40 referred to in relation to the second embodiment and the description thereof will be omitted here. The configuration of the microcomputer chip 31 is also the same as that of the semiconductor chip 1 described in relation to the second embodiment and the description thereof will be omitted here.

Subsequently, the following process is carried out while heat applied during the above-mentioned gold-solder joining process is continuously applied: underfill resin 23 is filled (supplied) between the main surface of each microcomputer chip 31 and the upper surface 11a of each wiring substrate 36 as illustrated in FIG. 52 and FIG. 53. When the underfill resin 23 is supplied, a nozzle 37 is placed on the side face side of each microcomputer chip (semiconductor chip) 31 as illustrated in FIG. 53. The underfill resin is supplied between the main surface 31a of each microcomputer chip 31 and the upper surface 11a of each wiring substrate 36 through these nozzles 37.

As illustrated in FIG. 54 and FIG. 55, subsequently, the memory chip 32 is stacked over the rear surface 31b of each microcomputer chip 31 with adhesive 35 in-between. The memory chip is so stacked that the rear surface 32b of the memory chip 32 is opposed to the rear surface 31b of the microcomputer chip 31. The memory chip 32 has a rectangular planar shape in the direction intersecting the direction of thickness. As illustrated in FIG. 54, for example, the above planar shape is a rectangle comprised of a pair of long side opposed to each other and a pair of short sides that are extended in the direction in which they intersect the long sides and opposed to each other. The pads 32c (electrodes, memory chip pads) are formed along one of the two short sides of each memory chip 32. The adhesive 35 in the third embodiment is a film-like adhesive designated as DAF (Die Attach Film). This adhesive 35 is stuck to the rear surface of a semiconductor wafer (the rear surface of each semiconductor chip) when the semiconductor chips are in the stage of semiconductor wafer. For this reason, this adhesive 35 is so formed as to cover the entire rear surface 32b of each memory chip 32.

As illustrated in FIG. 56 and FIG. 57, subsequently, the pads 32b of each memory chip 32 and the bonding leads (wire bonding lead) 2c of the corresponding wiring substrate 36 are electrically coupled together through wires 4. At this time, the wires 4 are formed by a normal bonding method as in the first embodiment.

As illustrated in FIG. 58 and FIG. 59, subsequently, an encapsulating body 5 is formed over the upper surfaces 11a of the wiring substrates 36 so that the microcomputer chips 31, underfill resin 23, memory chips 32, and wires 4 are covered. The process of forming the encapsulating body 5 is the same as in the first embodiment and the description thereof will be omitted here.

Processes subsequent to the formation of the encapsulating body 5 (the process of forming the bump electrodes 2e as external terminals and the dicing process) are the same as in the first embodiment and the description thereof will be omitted here.

The finished SIP type semiconductor device is mounted over the mother board (mounting board) of electronic equipment, such as personal computers and cellular phones, with the bump electrodes in-between as in the first and second embodiments.

Fourth Embodiment

In the description of the third embodiment, a SIP type semiconductor device 30 in which one system is built by mounting a microcomputer chip 31 and a memory chip 32 together in a single semiconductor device has been taken as an example. In the description of the fourth embodiment, a so-called POP (Package On Package) type semiconductor device 60 will be taken as an example. The POP type semiconductor device is manufactured as follows: a microcomputer chip 31 and a memory chip 32 are manufactured as separate semiconductor devices 40, 50 and finally, one semiconductor device 50 is stacked over the other semiconductor device 40 and they are electrically coupled together.

Figure 60:
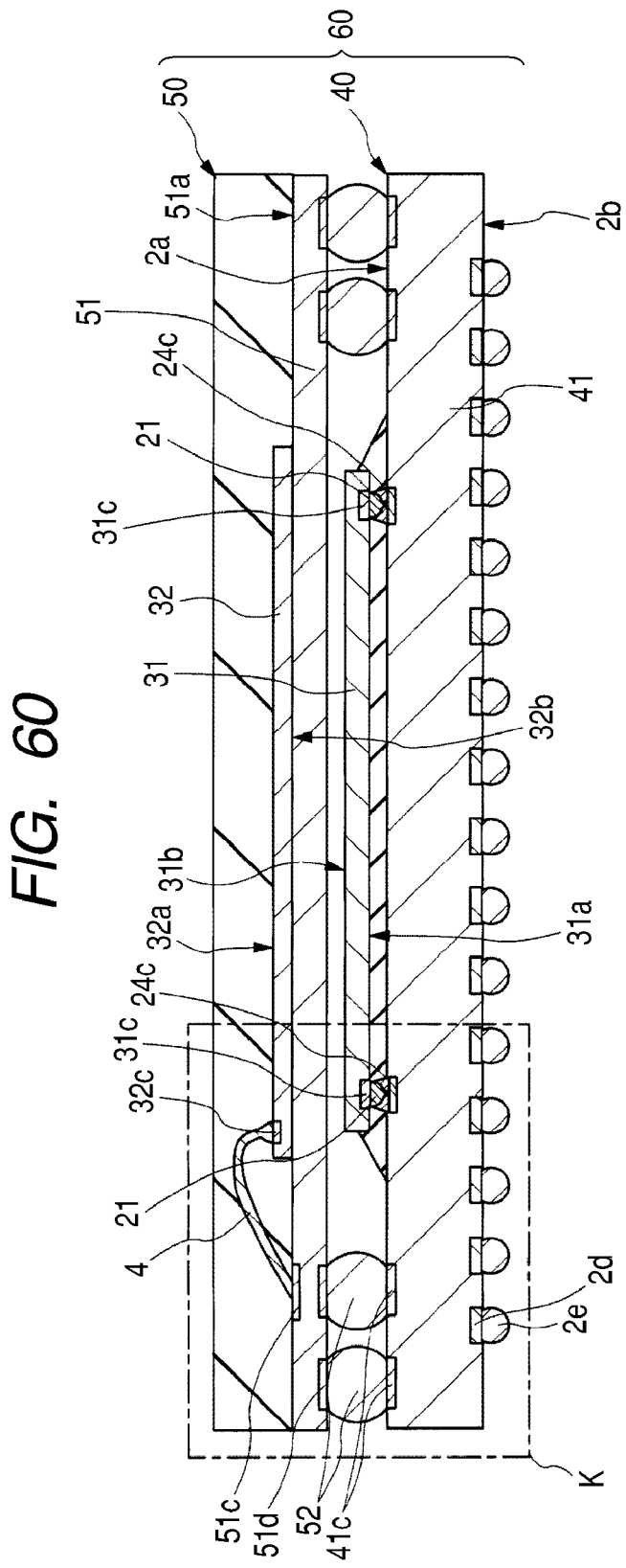
FIG. 60 is a sectional view of a POP type semiconductor device in a fourth embodiment of the invention.
Figure 61:
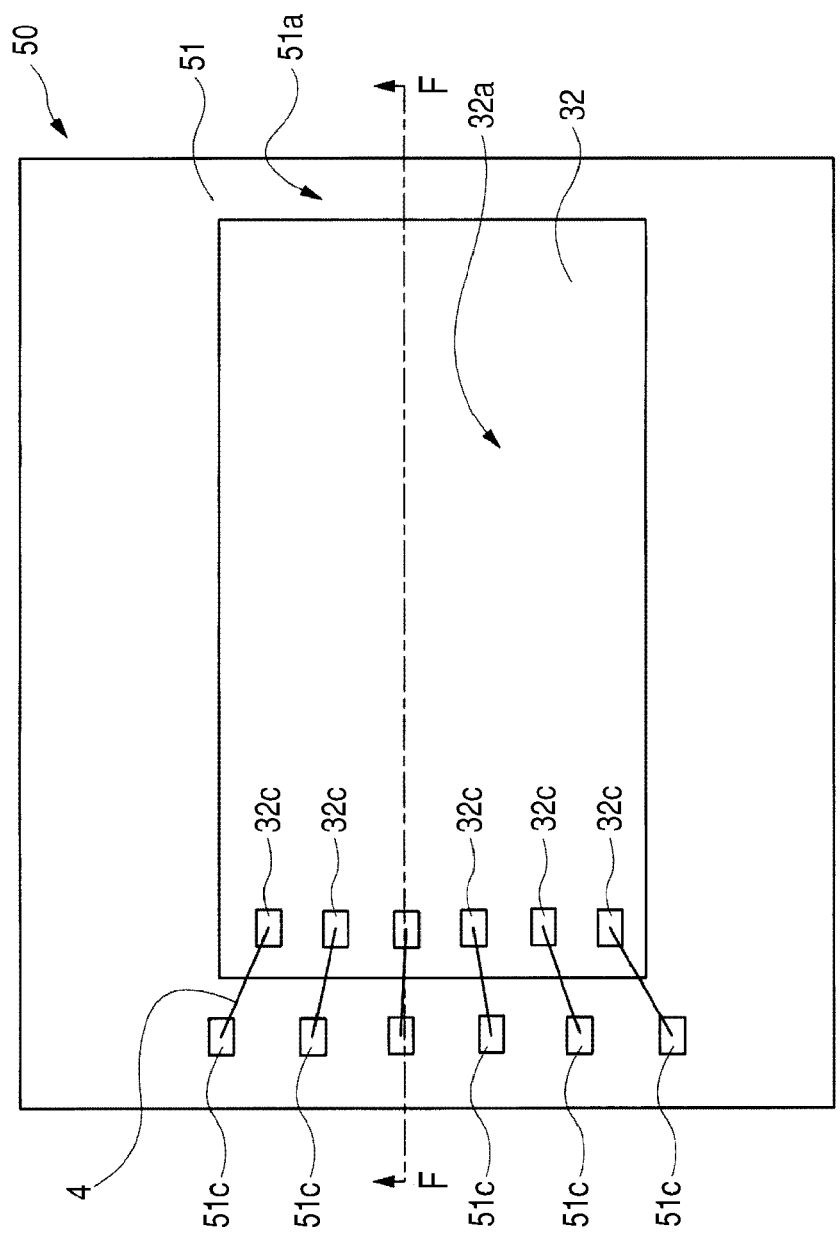
FIG. 61 is a plan view of the wiring substrate mounted with a memory chip in the semiconductor device placed in the upper layer illustrated in FIG. 60 as viewed from the upper surface side.
Figure 62:
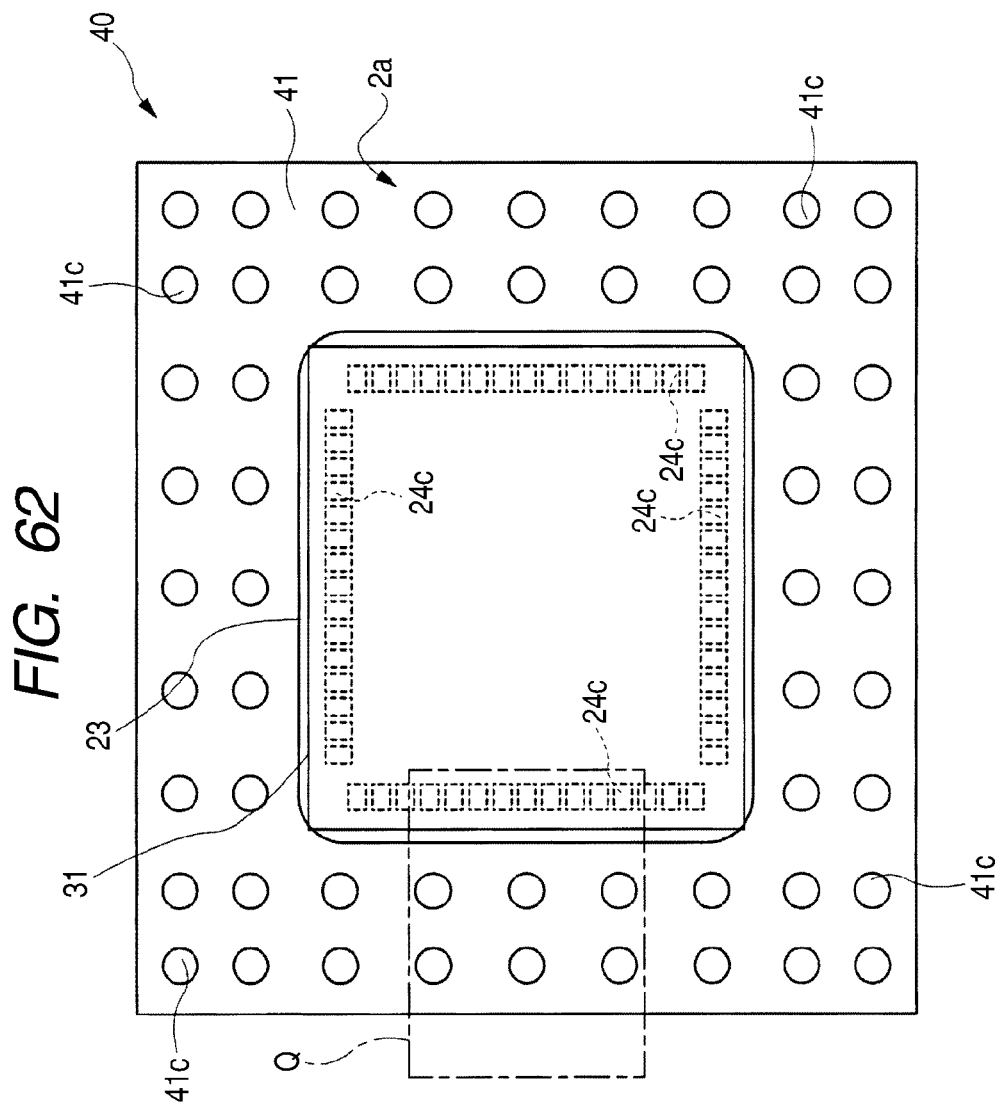
FIG. 62 is a plan view of the wiring substrate mounted with a microcomputer chip in the semiconductor device placed in the lower layer illustrated in FIG. 60 as viewed from the upper surface side.
Figure 63:
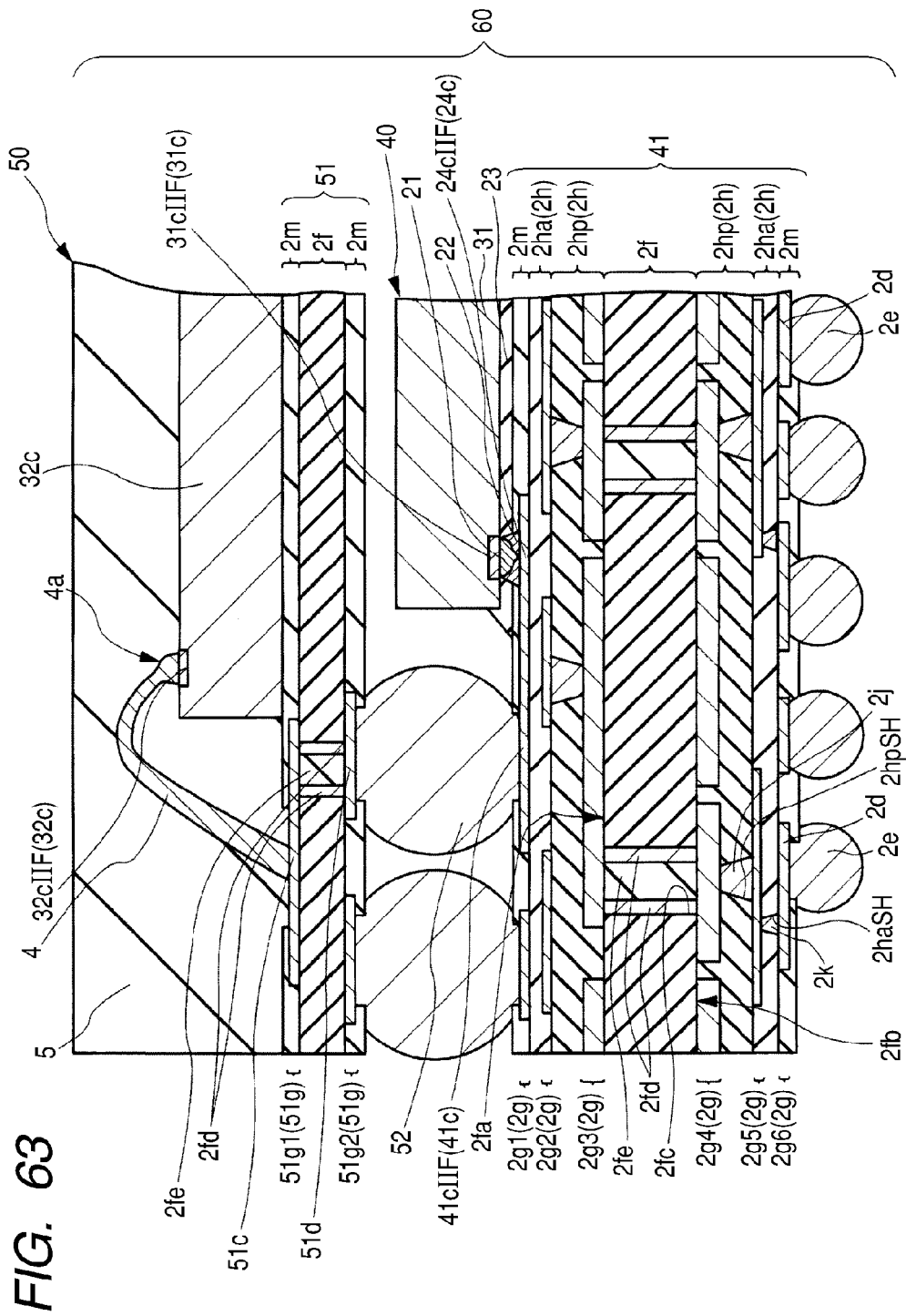
FIG. 63 is an enlarged sectional view of K site in FIG. 60.
Figure 64:
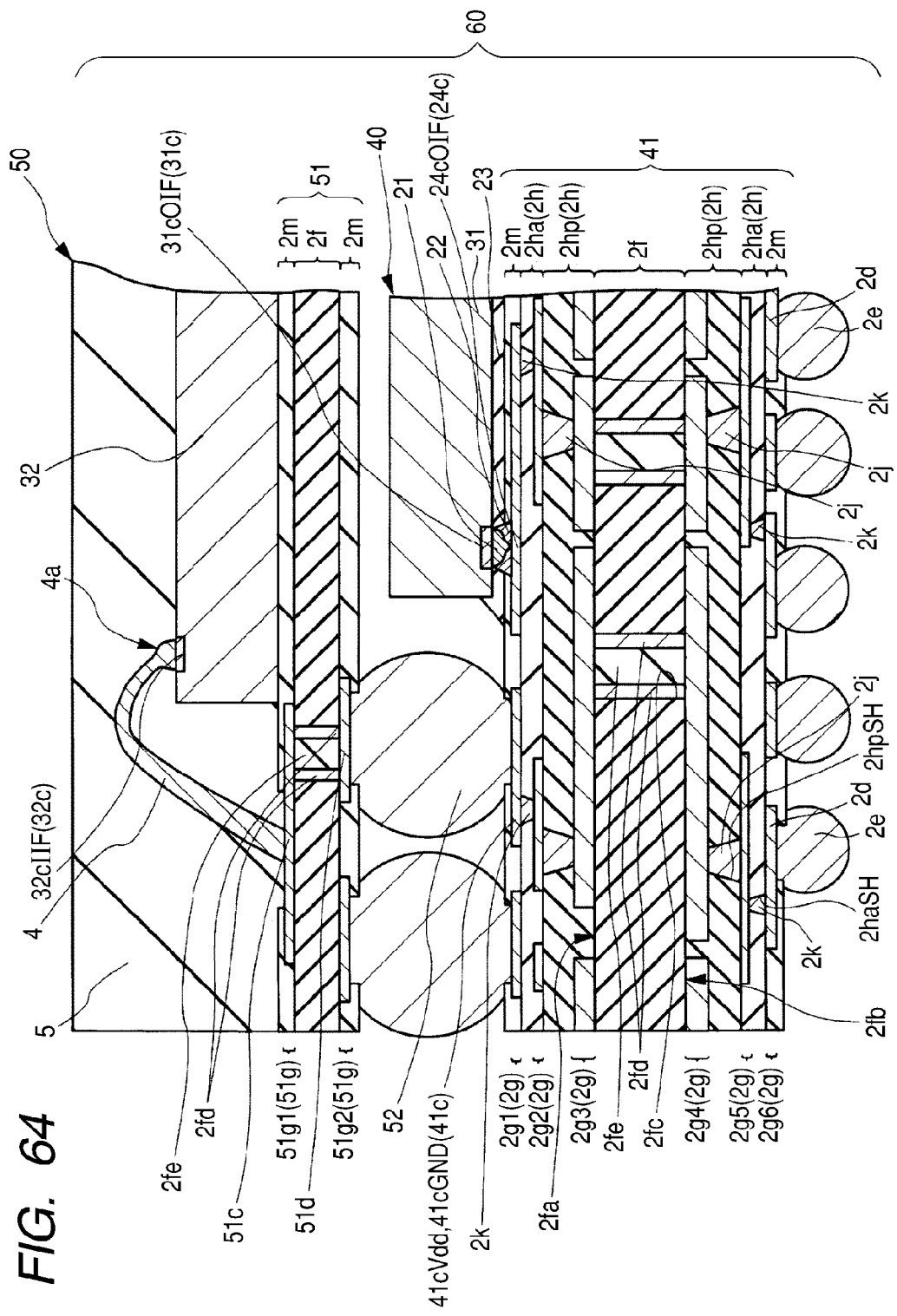
FIG. 64 is an enlarged sectional view of a section different from the section illustrated in FIG. 63.
Figure 65:
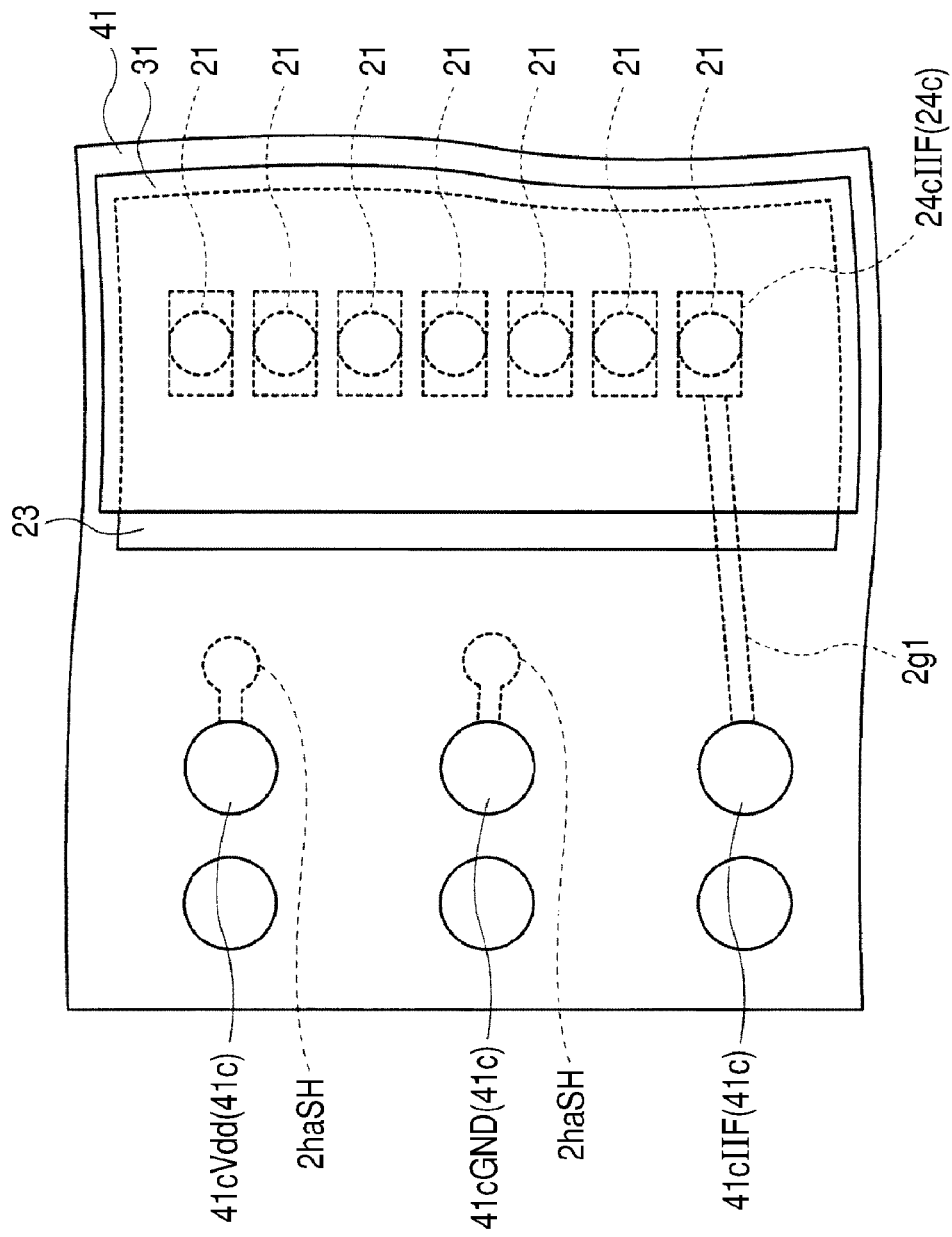
FIG. 65 is an enlarged substantial part plan view of Q site in FIG. 62.

FIG. 60 is a sectional view of a POP type semiconductor device in the fourth embodiment. FIG. 61 is a plan view of the wiring substrate mounted with a memory chip of the semiconductor device placed on the upper side in FIG. 60 as viewed from the upper surface side. FIG. 62 is a plan view of the wiring substrate mounted with a microcomputer chip of the semiconductor device placed on the lower side in FIG. 60 as viewed from the upper surface side. FIG. 63 is an enlarged sectional view of K site in FIG. 60. FIG. 64 is an enlarged sectional view of a section different from the section illustrated in FIG. 63. FIG. 65 is an enlarged substantial part plan view of Q site in FIG. 62.

The POP type semiconductor device 60 is configured as illustrated in FIG. 60 as follows. A semiconductor device (first semiconductor device) 40 includes a wiring substrate (first wiring substrate, microcomputer chip wiring substrate) 41 mounted with a microcomputer chip 31. Another semiconductor device (second semiconductor device) 50 includes a wiring substrate (second wiring substrate, memory chip wiring substrate) 51 mounted with a memory chip 32. The semiconductor device 50 is stacked over the semiconductor device 40 through multiple bump electrodes (semiconductor device coupling conductive members) 52. The lands (second lands) 51d of the semiconductor device 50 and the lands (electrodes, second bonding leads) 41c of the semiconductor device 40 are electrically coupled together with the bump electrodes 52 in-between. The bump electrodes 52 in the fourth embodiment are formed of the same material as that of the bump electrodes (external terminals, first lands) 2e described in relation to the first embodiment.

In the semiconductor device (first semiconductor device) 40 positioned on the lower side, the microcomputer chip 31 is flip-chip bonded to over the upper surface 2a of the wiring substrate 41 as in the second and third embodiments. The electrical coupling between the following pads and bonding leads is the same as in the second and third embodiments: the pads 31c formed in the main surface 31a of the microcomputer chip 31 and the bonding leads (first bonding leads, flip-chip bonding leads) 24c formed in the upper surface 2a of the wiring substrate 41. Therefore, the description thereof will be omitted here.

In the semiconductor device (second semiconductor device) 50 positioned on the upper side, meanwhile, the memory chip 32 is face-up mounted over the upper surface 51a of the wiring substrate 51 as in the first embodiment. The electrical coupling between the following pads and bonding leads is the same as that between the wires 4 and bonding leads 2c described in relation to the first and third embodiments: the pads 32c formed in the main surface 32a of the memory chip 32 and the bonding leads (wire bonding leads) 51c formed in the upper surface 51a of the wiring substrate 51. Therefore, the description thereof will be omitted here.

The semiconductor device 50 is mounted with the memory chip 32 but not mounted with the microcomputer chip 31. As illustrated in FIG. 61 and FIG. 62, therefore, the following takes place: the number of the bonding leads 51c formed in the upper surface 51a of the wiring substrate 51 is smaller than that of the bonding leads 24c formed in the upper surface 2a of the wiring substrate 41. Since the semiconductor device 50 mounted with only the memory chip 32 as a semiconductor chip requires a smaller number of terminals, as mentioned above, a multilayer structure for routing wiring is unnecessary. As illustrated in FIG. 63 and FIG. 64 as an example, therefore, it can be comprised of two wiring layers 51g comprising a chip placement surface wiring layer 51g1 and a rear surface wiring layer 51g2. Since it is unnecessary to use a multilayer wiring substrate like the wiring substrate 41, therefore, the thickness of the wiring substrate can be reduced. That is, the semiconductor device 50 positioned on the upper side is thinner than the semiconductor device 40 positioned on the lower side.

The wiring substrate 41 of the semiconductor device (first semiconductor device) 40 positioned on the lower side is a multilayer wiring substrate like the wiring substrates 2, 24, described in relation to the first, second, and third embodiments as illustrated in FIG. 63. That is, the wiring substrate has three wiring layers 2g formed on the upper surface 2fa side and the lower surface 2fb side of a core material 2f, six wiring layers 2g in total. The structure of each insulating layer 2h of the wiring substrate 41 is also the same as the wiring substrates 2, 24, 34 described in relation to the first, second, and third embodiments. That is, the insulating layers 2h include: insulating layers (second insulating layers, second insulating films) 2hp that are formed above and under the core material (first insulating layer) 2f and designated as prepreg material containing fiber, such as glass cloth and filler, and resin; and insulating layers (third insulating layers, third insulating films) 2ha that are formed above and under the core material 2f with the second insulating layer 2hp in-between and do substantially not contain the above-mentioned fiber and is comprised only of resin.

The relation of electrical coupling between the semiconductor device 40 mounted with the microcomputer chip 31 and the semiconductor device 50 mounted with memory chip 32 is substantially the same as described in relation to the third embodiment.

More specific description will be given. Of the respective pads 31c, 32c of the microcomputer chip 31 and the memory chip 32, pads 31c, 32c used to input/output data are electrically coupled together through a wiring layer 2g in the wiring substrate 41 as illustrated in FIG. 63. In the description of the fourth embodiment, a case where they are coupled through the first wiring layer 2g1 is taken as an example. More specific description will be given. In the example in FIG. 63 and FIG. 65, the following is implemented: of the bonding leads 51c of the wiring substrate 51, those electrically coupled with the internal interfacing pads 32cIIF of the memory chip 32 are coupled to the lands 51d formed in the rear surface of the wiring substrate 51. This coupling is carried out through wiring (through hole wiring) 2fd formed in the wiring substrate 51. These lands 51d and the lands (internal interfacing second bonding leads) 41cIIF of the wiring substrate 41 are electrically coupled together through the bump electrodes 52. These lands (internal interfacing second bonding leads) 41cIIF are electrically coupled with the internal interfacing first bonding leads 24cIIF, electrically coupled with the internal interfacing pads 31cIIF of the microcomputer chip 31, in the wiring substrate 41. FIG. 65 is an enlarged plan view of Q site in FIG. 62 and illustrates this relation of coupling as seen through a protective film formed over the first wiring layer 2g1. This state of coupling is similar to the relation of coupling between the memory chip (FLASH) 32 and the microcomputer chip 31 illustrated in FIG. 41.

The internal interfacing pads 31cIIF of the microcomputer chip 31 are electrically coupled with the external interfacing pad 31cOIF of the microcomputer chip 31 through a computation circuit formed in the microcomputer chip 31. The external interfacing pads 31cOIF of the microcomputer chip 31 are electrically coupled to the bump electrodes 2e as external terminals of the semiconductor device 60 through a wiring layer 2g in the wiring substrate 41 as illustrated in FIG. 63.

The power supply potential pads 32cVdd and reference potential pads 32cGND of the memory chip 32 are electrically coupled to the bonding leads 51c of the wiring substrate 51 through wires 4 as conductive members. These bonding leads 51c are coupled to the lands 51d formed in the rear surface of the wiring substrate 51 through wiring (through hole wiring) 2fd formed in the wiring substrate 51. The lands 51d and the lands (power supply potential second bonding leads) 41cVdd (or the lands (reference potential second bonding leads) 41cGND) of the wiring substrate 41 are electrically coupled together through the bump electrodes 52. They are routed from the lands (power supply potential second bonding leads) 41cVdd (or the lands (reference potential second bonding leads) 41cGND) to an internal layer of the wiring substrate 41 through wiring (metal film) 2k. Further, they are respectively electrically coupled to the bump electrodes 2e as external terminals of the semiconductor device 60 through a wiring layer 2g in the wiring substrate 41. At this time, the power supply potential pads 32cVdd and reference potential pads 32cGND of the memory chip 32 are not used for power supply potential or reference potential of the microcomputer chip 31 and are independently provided as illustrated in FIG. 41. For this reason, current paths are directly routed from the lands (power supply potential second bonding leads) 41cVdd (or the lands (reference potential second bonding leads) 41cGND) of the wiring substrate 41 to corresponding lands 2d. The current paths are not routed by way of the pads 31c of the microcomputer chip 31. The power supply potential pads 31c and reference potential pads 31c of the microcomputer chip 31 are also respectively electrically coupled to the bump electrodes 2e as external terminals of the semiconductor device 60. This electrical coupling is also carried out through a wiring layer 2g in the wiring substrate 41 though not shown in the drawings.

The thickness of the POP type semiconductor device 60 is further larger than the thickness of the SIP type semiconductor device 30 described in relation to the third embodiment. As illustrated in FIG. 63, however, the following multilayer wiring substrate is used: a wiring substrate in which the first insulating layer (core material) 2f) and the second insulating layers 2hp are prepreg material and the third insulating layers 2ha do substantially not contain the above-mentioned fiber and are comprised substantially only of resin. Therefore, the strength (hardness) of the wiring substrate 41 can be ensured even though the thickness of the wiring substrate 41 is reduced. As a result, the thickness of the semiconductor device 40 can be reduced and thus the mounting height of the semiconductor device 60 can be reduced.

In the semiconductor device (first semiconductor device) 40 positioned on the lower side, the entire upper surface 2a of the wiring substrate 41 is not covered with the encapsulating body 5 as in the second embodiment. Therefore, the problem of warpage is more serious than in the first and third embodiments in which the upper surface of the wiring substrate is covered with the encapsulating body 5. Since such a wiring substrate 41 as illustrated in FIG. 63 is used, however, this warpage can be suppressed as in the second embodiment even though the thickness of the wiring substrate 41 is reduced to reduce the thickness of the semiconductor device 40.

In the POP type semiconductor device 60 in the fourth embodiment, as mentioned above, not only the problem of warpage described in relation to the second embodiment is serious in the semiconductor device (first semiconductor device) 40 positioned on the lower side. The POP type semiconductor device 60 in the fourth embodiment is larger in mounting height than the SIP type semiconductor device in the third embodiment. For this reason, it is most effective to use the following multilayer wiring substrate (wiring substrate 41) for such a semiconductor device 40: a wiring substrate in which the first insulating layer (core material) and the second insulating layers 2hp are prepreg material and the third insulating layers 2ha do substantially not contain the above-mentioned fiber and are comprised substantially only of resin.

In case of the POP type semiconductor device 60, the microcomputer chip 31 and the memory chip 32 are manufactured as separate semiconductor devices 40, 50. Therefore, only semiconductor devices 40, 50 judged as non-defective in the final inspection process can be combined and used. This makes it possible to enhance the yield of the semiconductor device 60 as compared with that of the SIP type semiconductor device 30.

Figure 66:
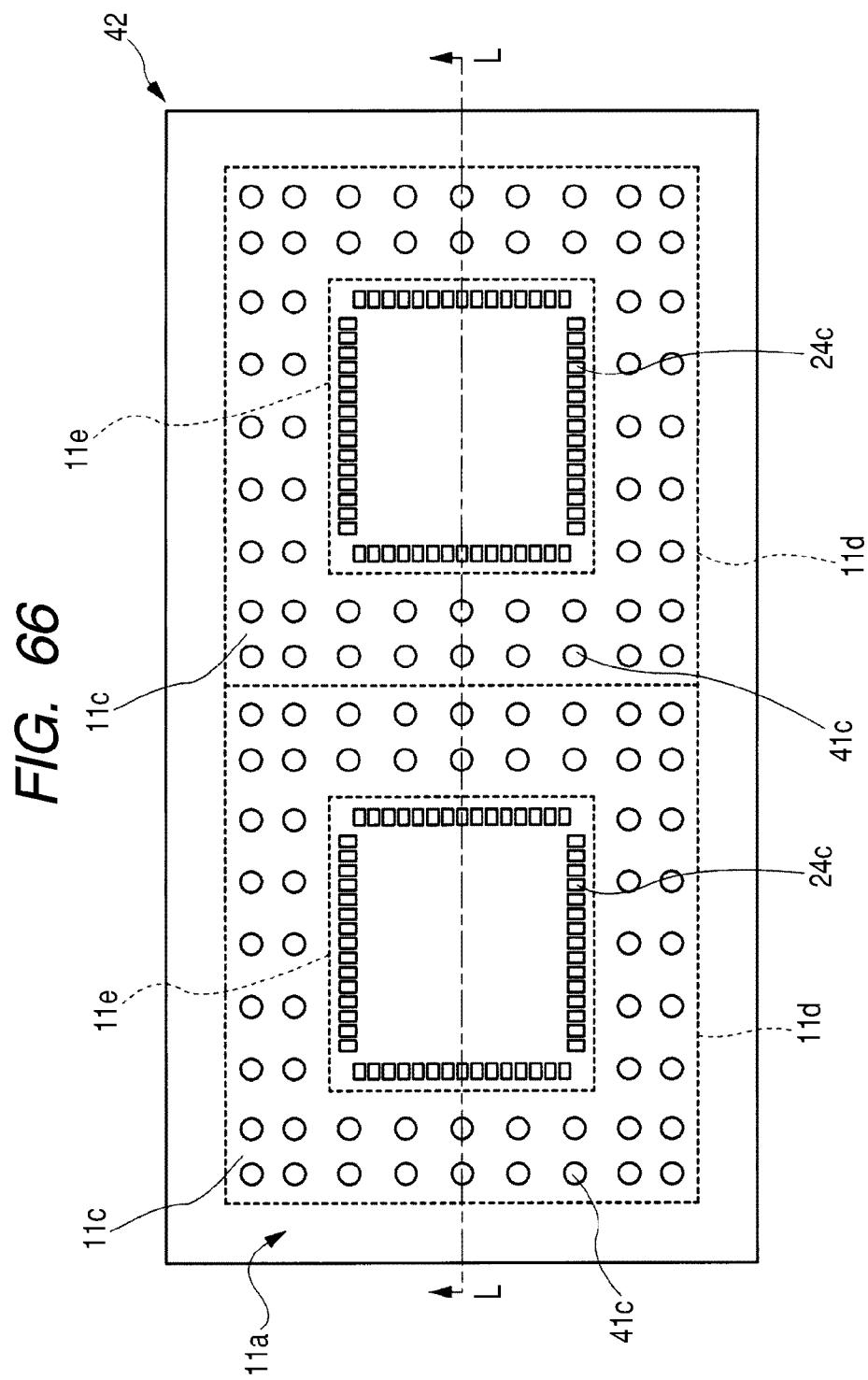
FIG. 66 is a plan view illustrating the upper surface side of the wiring substrates prepared for multiple cavity molding in a manufacturing method for the lower-layer semiconductor device in a manufacturing method for the semiconductor device in the fourth embodiment of the invention.
Figure 67:
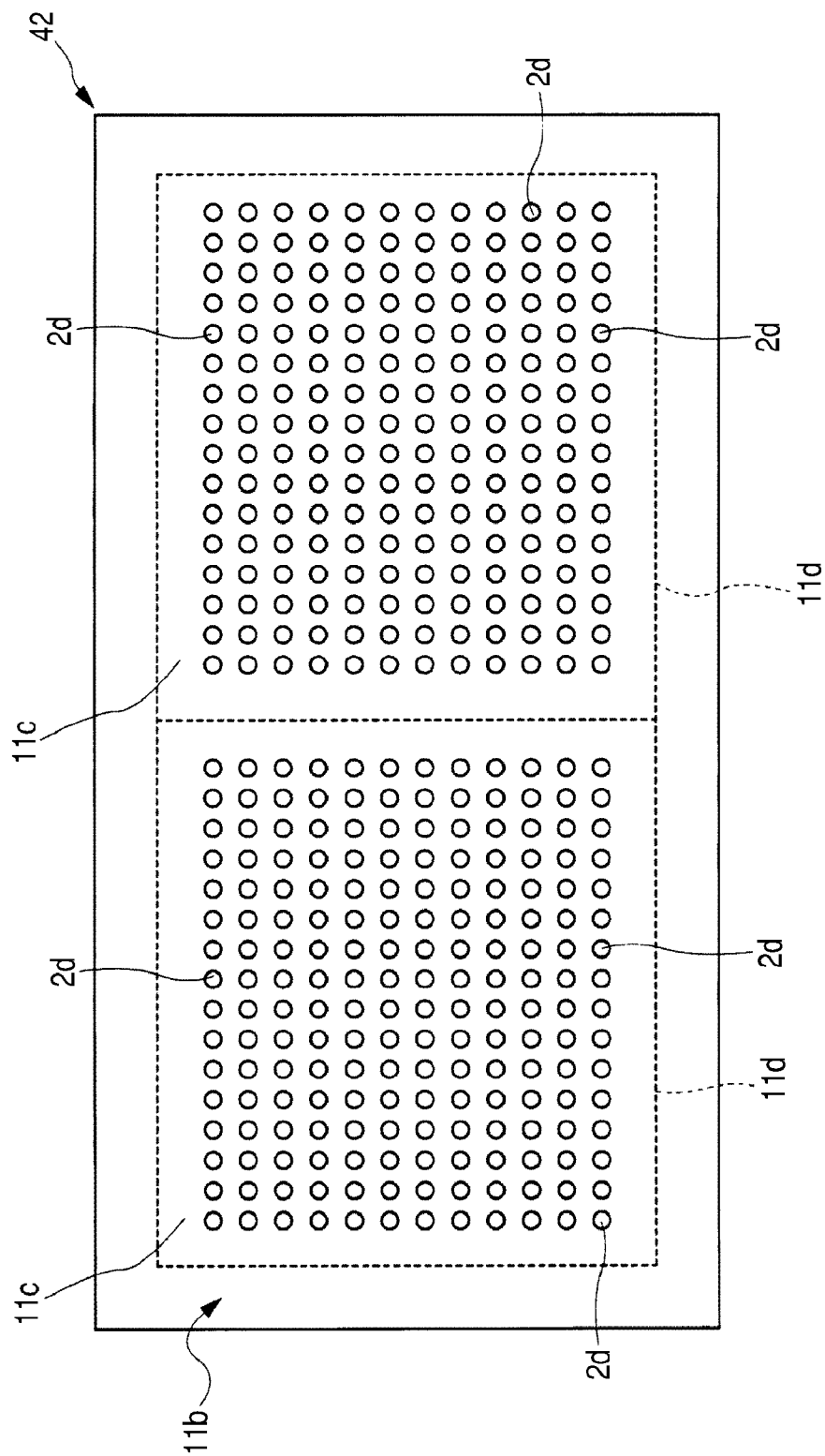
FIG. 67 is a plan view illustrating the lower surface side of the wiring substrates for multiple cavity molding illustrated in FIG. 66.
Figure 68:
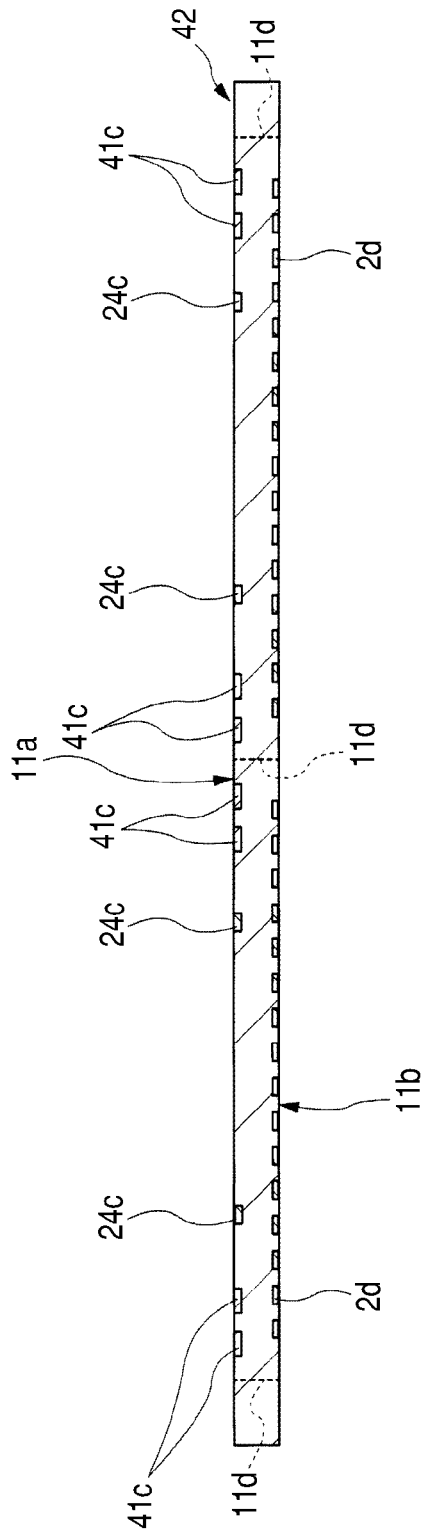
FIG. 68 is a sectional view taken along line L-L of FIG. 66.
Figure 69:
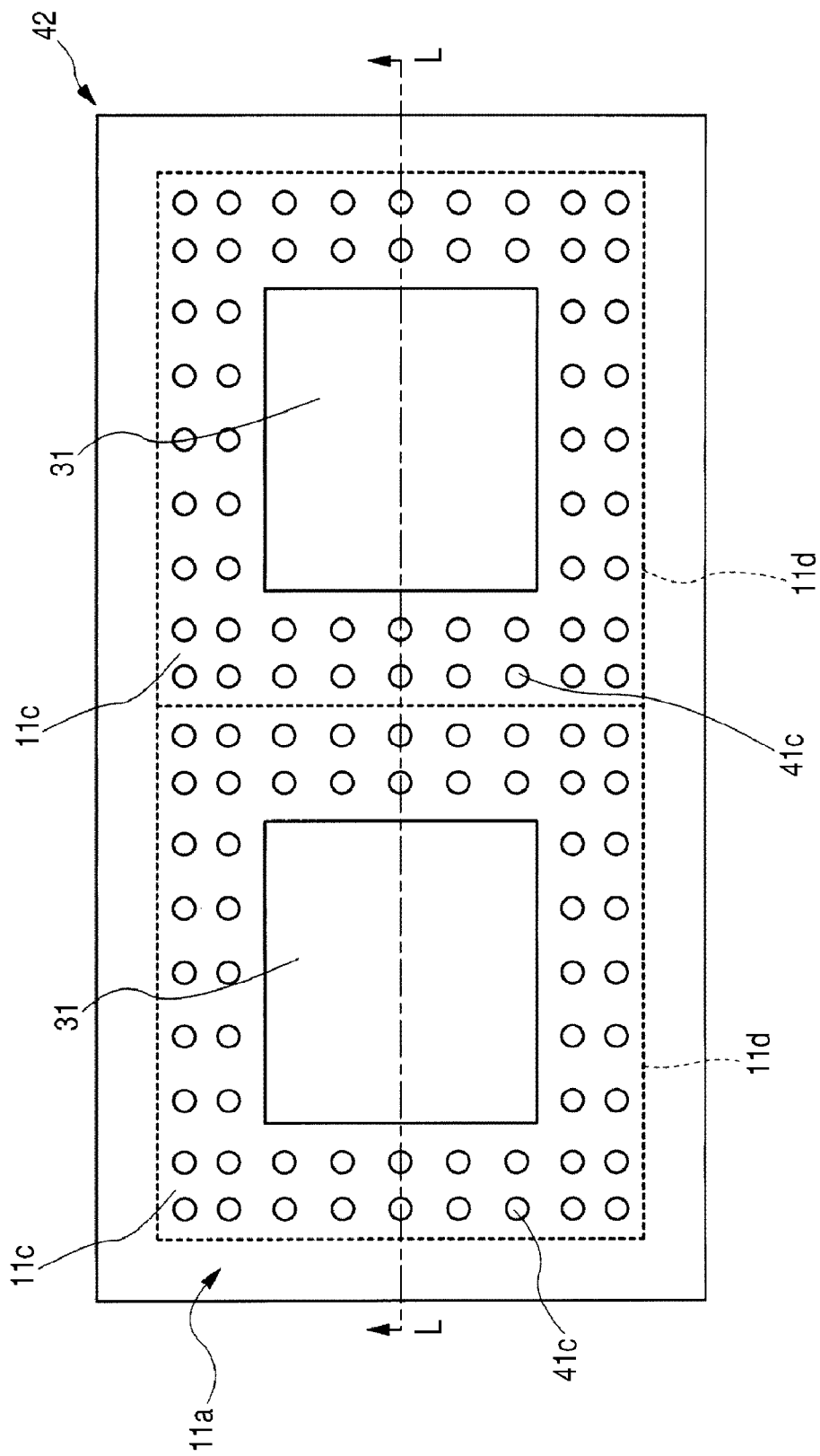
FIG. 69 is a plan view of the wiring substrates for multiple cavity molding illustrated in FIG. 66 with microcomputer chips flip-chip bonded to over the wiring substrates as viewed from the upper surface side.
Figure 70:
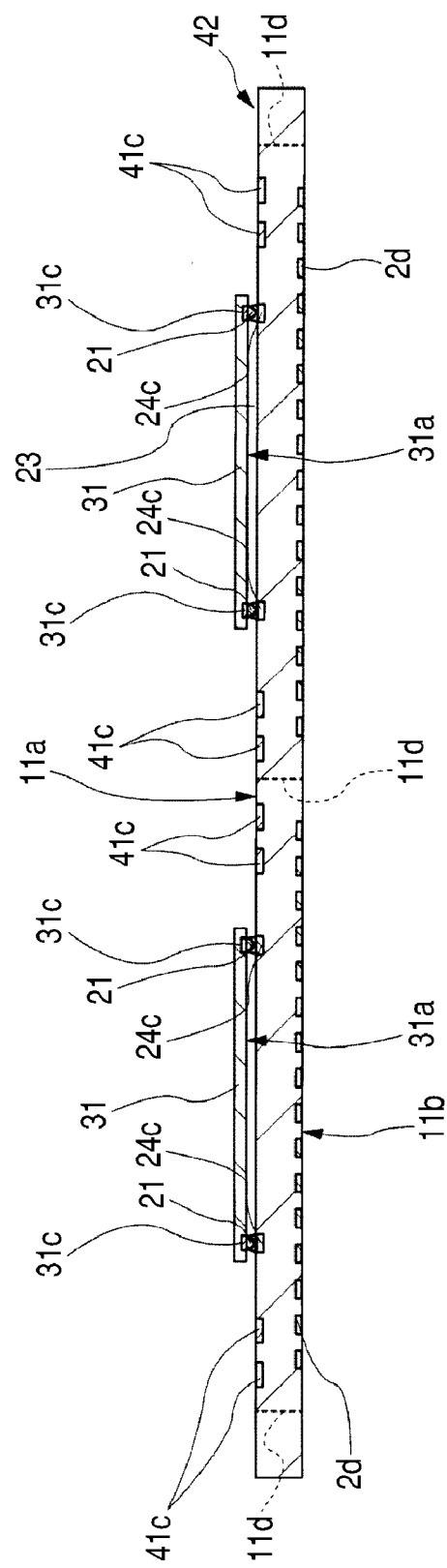
FIG. 70 is a sectional view taken along line L-L of FIG. 69.
Figure 71:
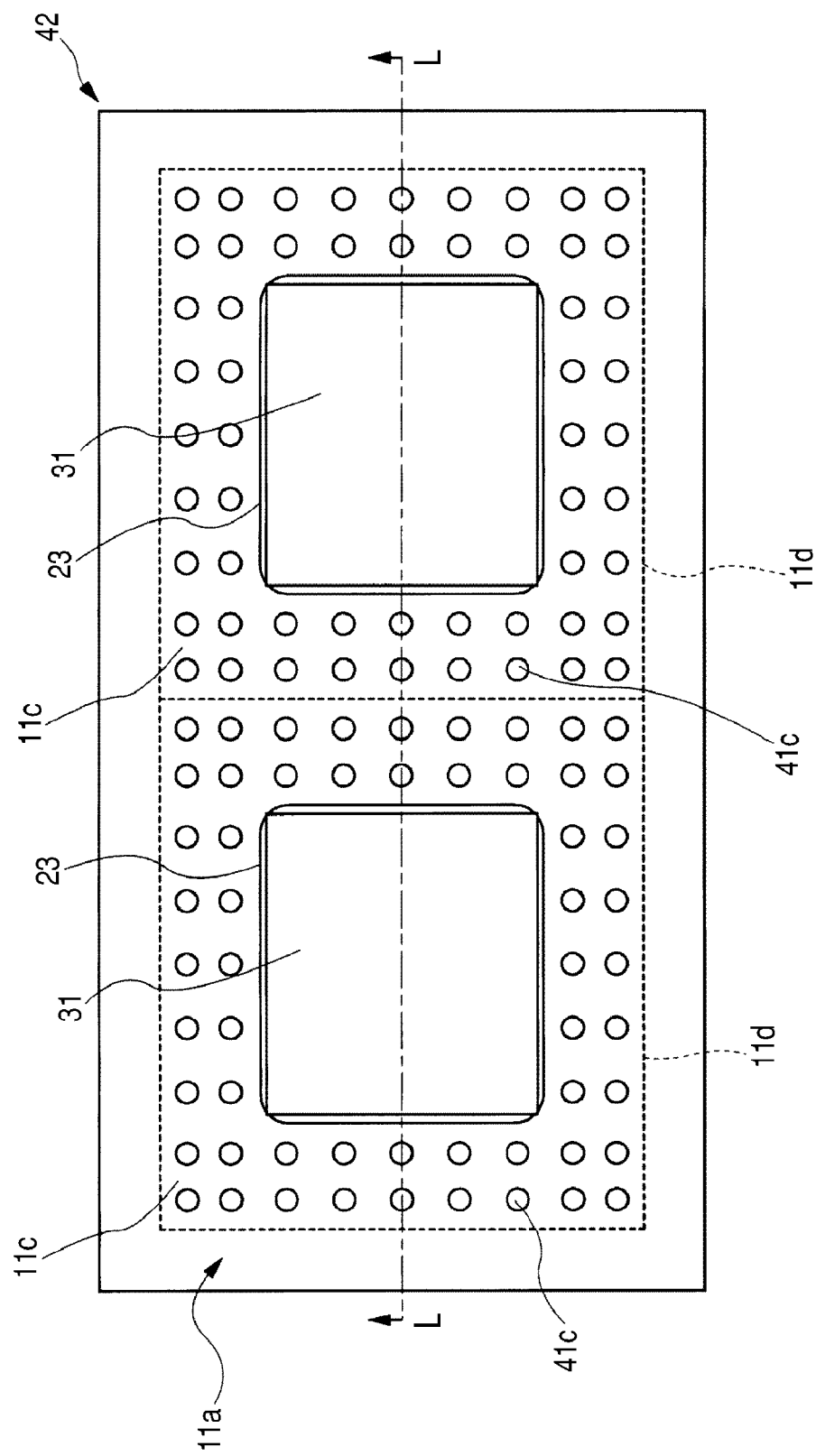
FIG. 71 is a plan view of the wiring substrates for multiple cavity molding illustrated in FIG. 69 with underfill resin supplied between the microcomputer chips and the wiring substrates as viewed from the upper surface side.
Figure 72:
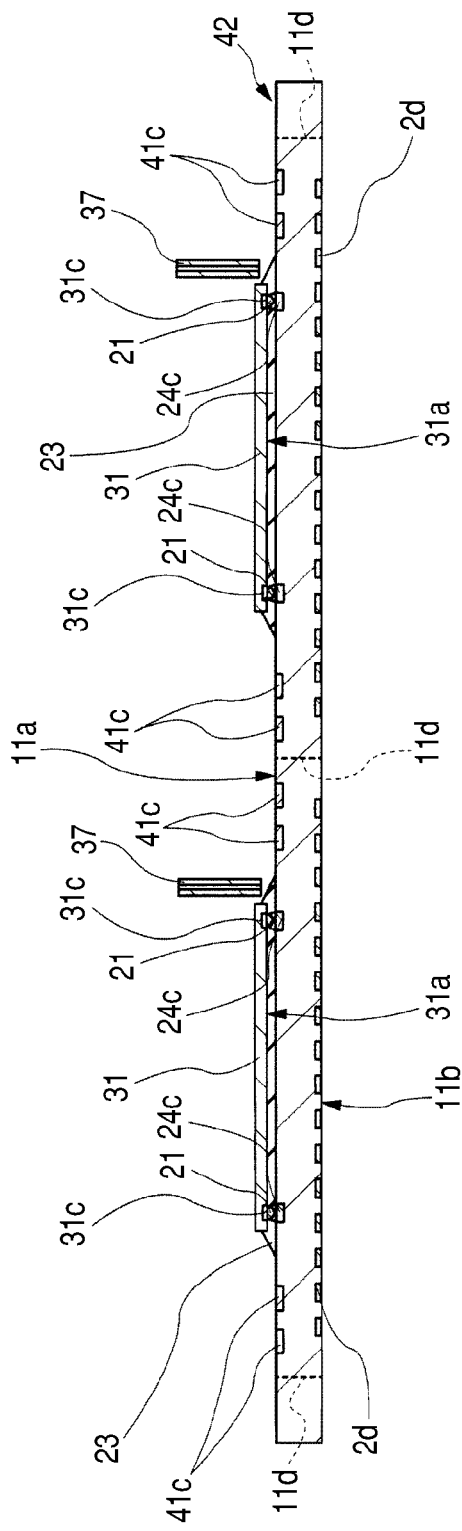
FIG. 72 is a sectional view taken along line L-L of FIG. 71.
Figure 73:
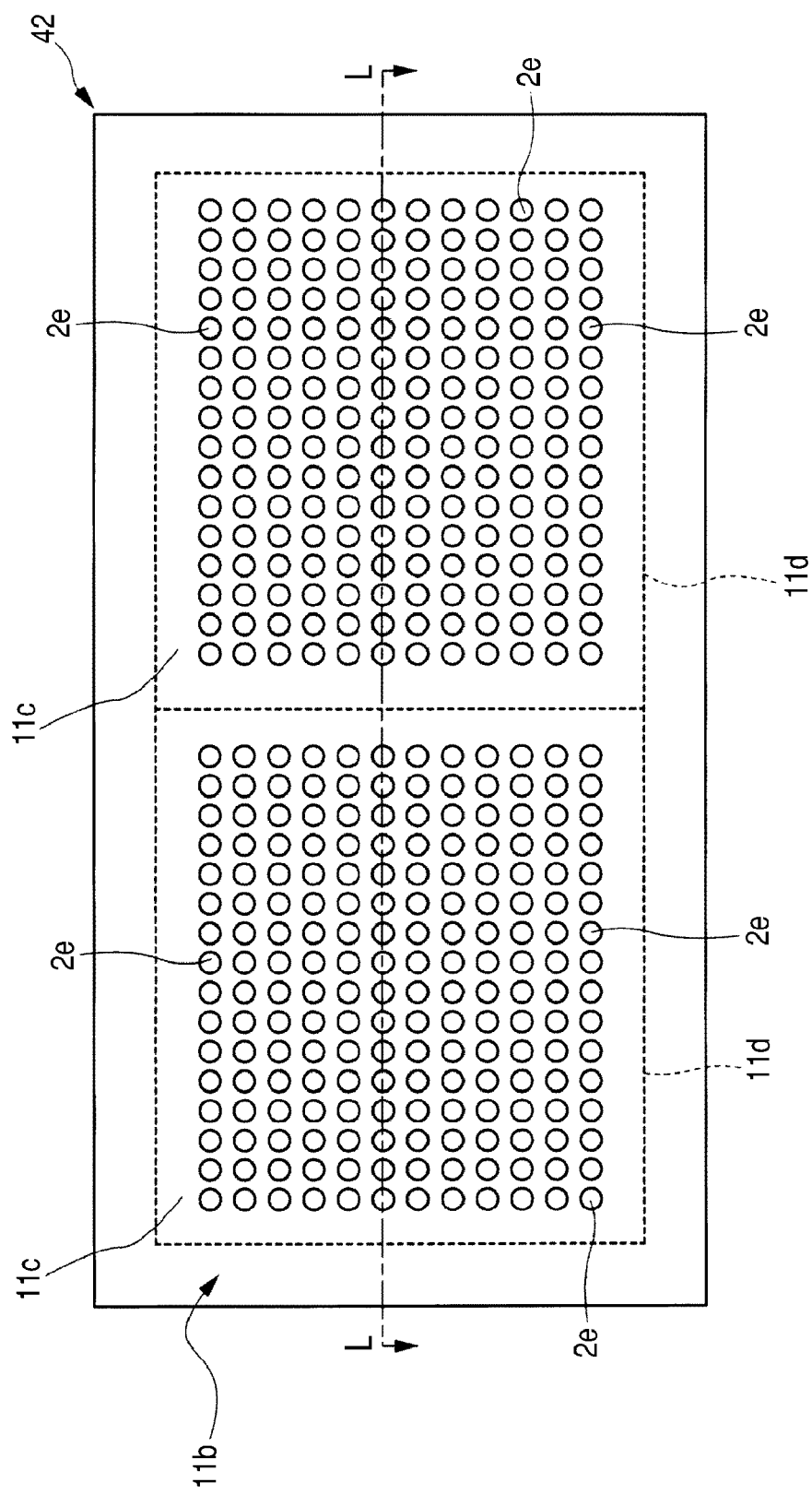
FIG. 73 is a plan view illustrating how bump electrodes are coupled to the lower surfaces of the wiring substrates for multiple cavity molding illustrated in FIG. 69.
Figure 74:
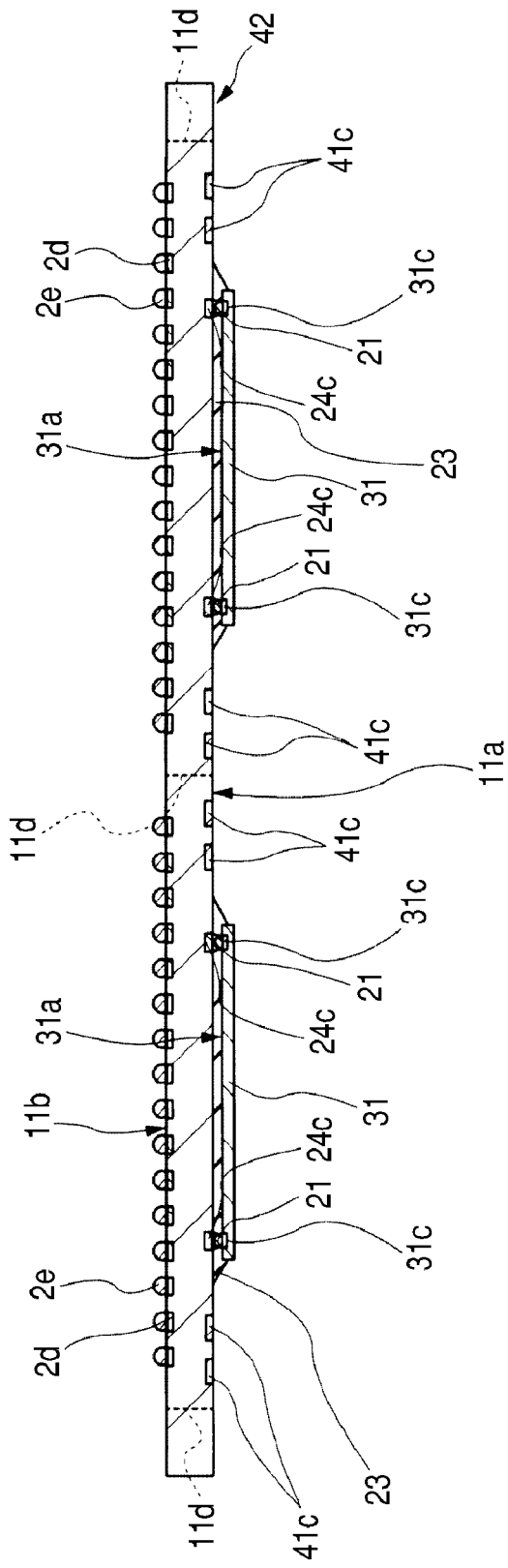
FIG. 74 is a sectional view taken alone line L-L of FIG. 73.
Figure 75:
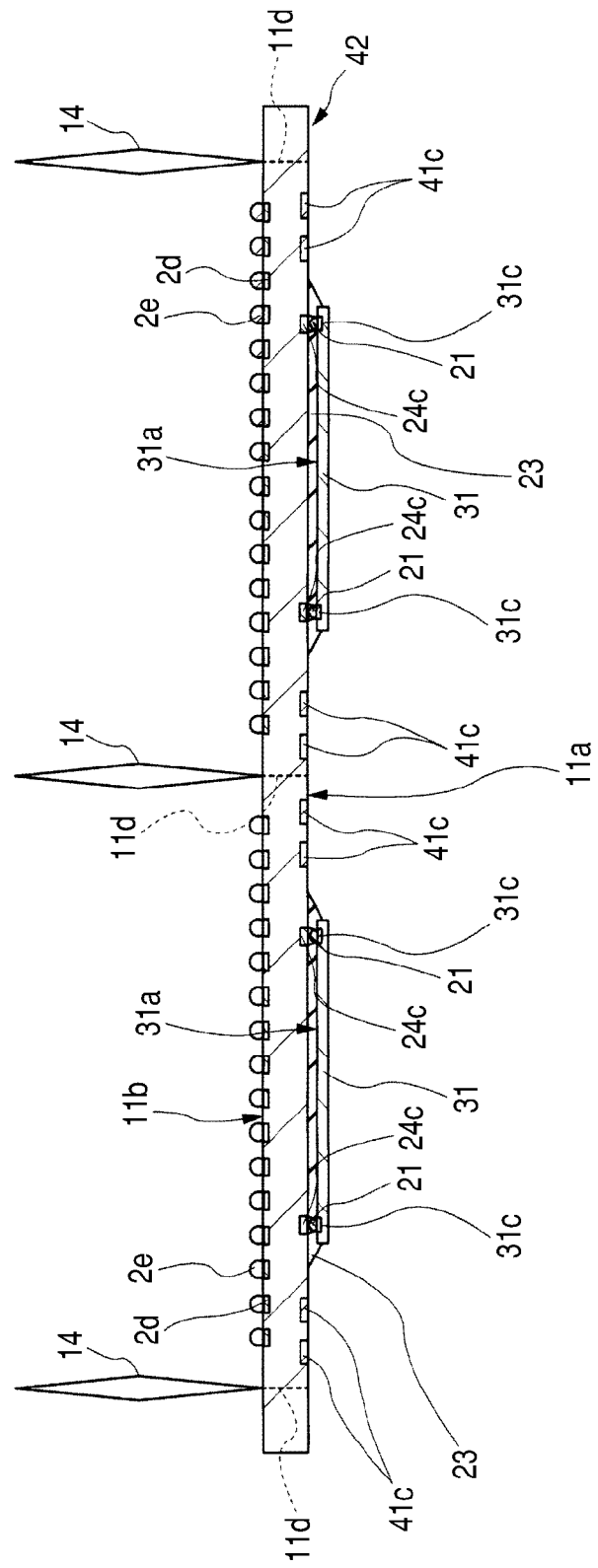
FIG. 75 is a sectional view of a dicing process in a manufacturing method for the lower-layer semiconductor device in the manufacturing method for the semiconductor device in the fourth embodiment of the invention.

Hereafter, description will be given to a manufacturing method for the POP type semiconductor device 60 in the fourth embodiment. However, the description of the same configurations as in the first to third embodiments will be omitted. FIG. 66 is a plan view illustrating the upper surface side of wiring substrates prepared for multiple cavity molding for the lower-side semiconductor devices in the fourth embodiment. FIG. 67 is a plan view illustrating the lower surface side of the wiring substrates for multiple cavity molding illustrated in FIG. 66. FIG. 68 is a sectional view taken along line L-L of FIG. 66. FIG. 69 is a plan view illustrating the lower-side semiconductor devices in the fourth embodiment with microcomputer chips flip-chip bonded to over the wiring substrates as viewed from the upper surface side of the wiring substrates for multiple cavity molding. FIG. 70 is a sectional view taken along line L-L of FIG. 69. FIG. 71 is a plan view illustrating the lower-side semiconductor devices in the fourth embodiment with underfill resin supplied between the microcomputer chips and the wiring substrates as viewed from the upper surface side of the wiring substrates for multiple cavity molding. FIG. 72 is a sectional view taken along line L-L of FIG. 71. FIG. 73 is a plan view illustrating the lower-side semiconductor devices in the fourth embodiment with bump electrodes joined with the lower surfaces of the wiring substrates for multiple cavity molding. FIG. 74 is a sectional view taken along line L-L of FIG. 73. FIG. 75 is a sectional view illustrating the lower-side semiconductor devices in the fourth embodiment in a dicing process.

First, the lower-side semiconductor devices (first semiconductor devices) 40 and the upper-side semiconductor devices (second semiconductor devices) 50 of the POP type semiconductor devices 60 are separately prepared.

The manufacturing method for the lower-side semiconductor device (first semiconductor device) 40 is as follows:

First, the wiring substrates 42 illustrated in FIG. 66 to FIG. 68 are prepared. These wiring substrates 42 are wiring substrates for multiple cavity molding having multiple product formation regions (device formation regions) 11c and a dicing area 11d positioned between the product formation regions 11c. In the upper surface 11a of each wiring substrate 42, the following are formed as illustrated in FIG. 66: an area (chip placement area 11e) where a semiconductor chip is placed in a subsequent process and multiple lands (electrodes, second bonding leads) 41c encircling this area (chip placement area 11e). The lands 41c are electrically coupled to the upper-side semiconductor device (second semiconductor device) 50 through bump electrodes 52 in a subsequent process. In the lower surface 41b of each wiring substrate 42, multiple lands 2d are formed as illustrated in FIG. 67 and FIG. 68.

As illustrated in FIG. 69 and FIG. 70, subsequently, a microcomputer chip 31 is mounted over the chip placement area in each of the product formation regions. At this time, the microcomputer chip 31 is flip-chip bonded to over the upper surface 11a of each wiring substrate 42 as described in relation to the second and third embodiments (gold-solder joining).

As illustrated in FIG. 71 and FIG. 72, subsequently, underfill resin 23 is filled into between the main surface 31a of each microcomputer chip 31 and the upper surface 11a of the corresponding wiring substrate 42. This process is also the same as in the second and third embodiments and the description thereof will be omitted here.

As illustrated in FIG. 73 and FIG. 74, subsequently, multiple bump electrodes 2e to be external terminals are respectively coupled to the lands 2d formed in the lower surface of each wiring substrate 42. The material of the bump electrode 2e is the same as in the first and third embodiments and is comprised of lead-free solder.

As illustrated in FIG. 75, thereafter, a dicing blade 14 is driven along the dicing area in the wiring substrates 42 and multiple semiconductor devices 40 are thereby obtained.

Description will be given to a manufacturing method for the upper-side semiconductor device (second semiconductor device) 50. The manufacturing method for the upper-side semiconductor device (second semiconductor device) 50 is substantially the same as the manufacturing method in the first embodiment. However, the used wiring substrate 51 is different and hereafter, description will be given only to this wiring substrate 51 (wiring substrates 53 for multiple cavity molding).

Figure 76:
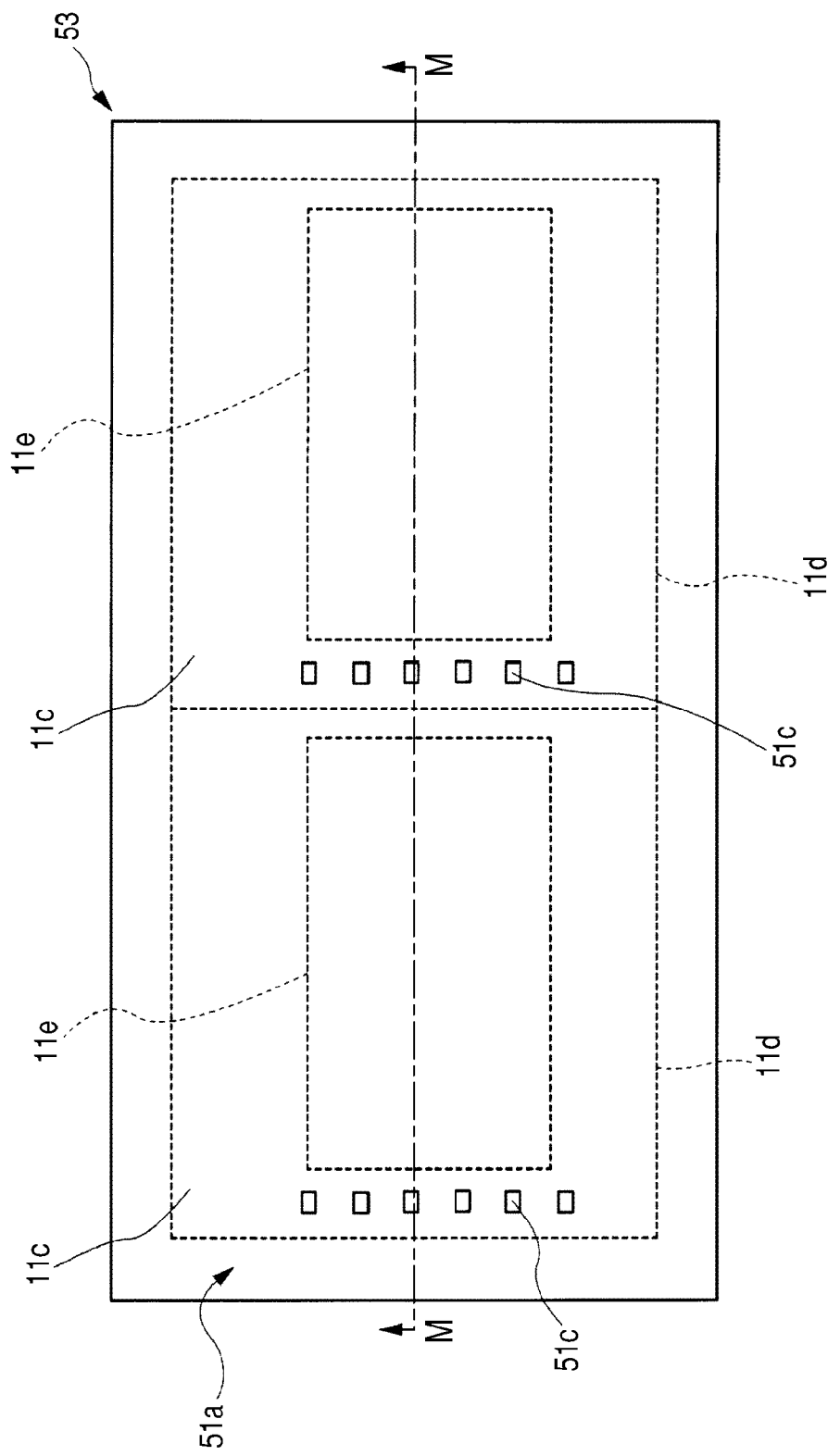
FIG. 76 is a plan view illustrating the upper surface side of the wiring substrates prepared for multiple cavity molding in the manufacturing method for the upper-layer semiconductor device in the manufacturing method for the semiconductor device in the fourth embodiment of the invention.
Figure 77:
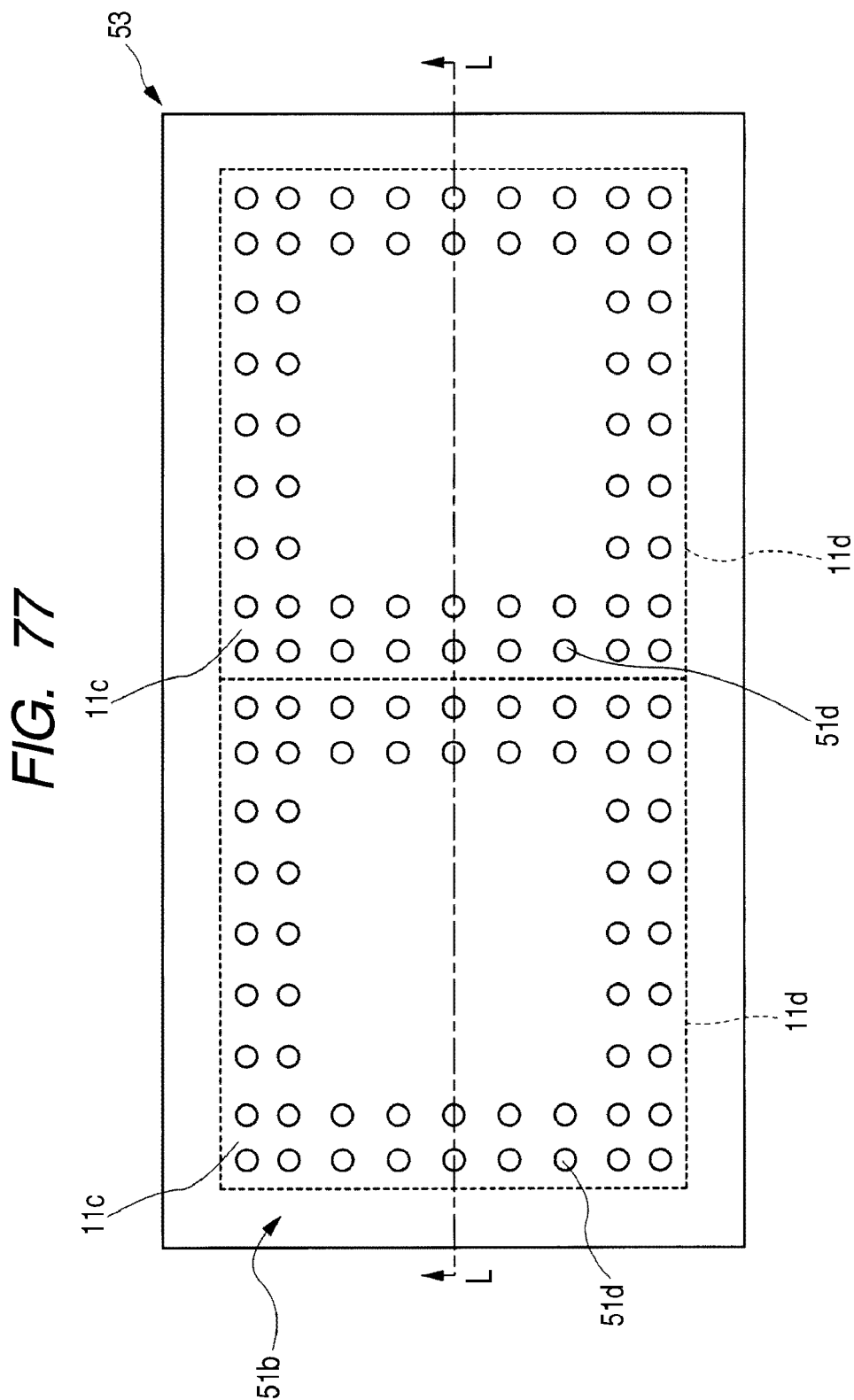
FIG. 77 is a plan view illustrating the lower surface side of the wiring substrates prepared for multiple cavity molding in the upper-layer semiconductor devices in the fourth embodiment.

FIG. 76 is a plan view of the upper surfaces (front faces) 51a of the wiring substrates 53 for multiple cavity molding; FIG. 77 is a plan view of the lower surfaces (rear surfaces) 51b of the wiring substrates 53 for multiple cavity molding; and FIG. 78 is a sectional view taken along line M-M of FIG. 76.

Figure 78:
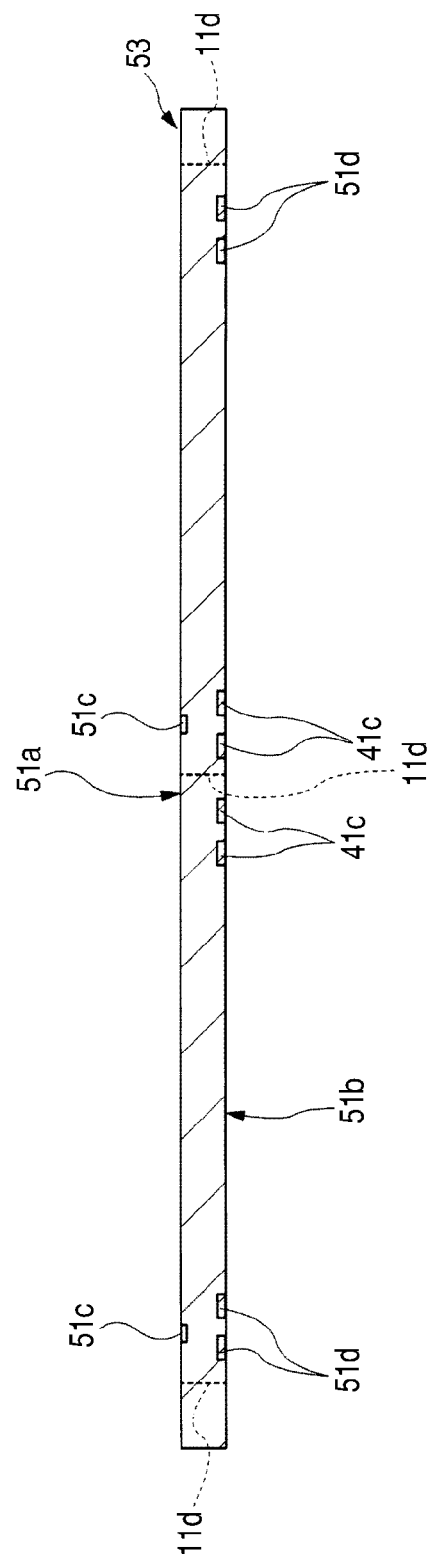
FIG. 78 is a sectional view taken along line M-M of FIG. 76.

As illustrated in FIG. 76 and FIG. 78, an area (chip placement area 11d) where a memory chip (semiconductor chip) 32 (FIG. 61) is to be mounted is provided in the center of the upper surface 51a of each wiring substrate 53. In the fourth embodiment, the memory chip 32 is mounted through adhesive (not shown). Multiple bonding leads 51c are formed between this area and one side of the corresponding wiring substrate along the side. These bonding leads 51c are to be electrically coupled with the pads 32c (FIG. 61) formed in the main surface of the corresponding memory chip through wires 4 (FIG. 61).

As illustrated in FIG. 77 and FIG. 78, multiple lands 51d are formed in multiple rows in the lower surface of each wiring substrate 53 along each side of the wiring substrate. In the fourth embodiment, the lands are arranged in two rows. This is because only one memory chip 32 is mounted in the upper-side semiconductor device 50 in the fourth embodiment. More detailed description will be given. As mentioned above, the number of pads 32c of the memory chip 32 is smaller than the number of pads 31c of the microcomputer chip 31 and the number of lands 51d for coupling the bump electrodes 52 to be external terminals is also small. That is, the number of the pads is smaller than the number of the lands 2d formed on the lower surface 2b side of the wiring substrate 41 in each lower-side semiconductor device 40. For this reason, no land 51d is formed in the center of the wiring substrate 51 of each upper-side semiconductor device 50. (The center of the wiring substrate 51 corresponds to the center of the product formation region 11c in each wiring substrate 53 for multiple cavity molding.)

Using these wiring substrates 53, the same processes as in the first embodiment are carried out to obtain the upper-side semiconductor devices 50.

The obtained lower-side semiconductor devices (first semiconductor devices) 40 are subjected to the final test appearance inspection process) to select non-defective items. Similarly, the upper-side semiconductor devices (second semiconductor devices) 50 are subjected to the final test (appearance inspection process) to select non-defective items. A non-defective upper-side semiconductor device is stacked over a non-defective lower-side semiconductor device with the bump electrodes 52 in-between.

Up to this point, concrete description has been given to the invention made by the present inventors based on embodiments. However, the invention is not limited to the above embodiments and can be variously modified without departing from the subject matter thereof, needless to add.

Figure 79:
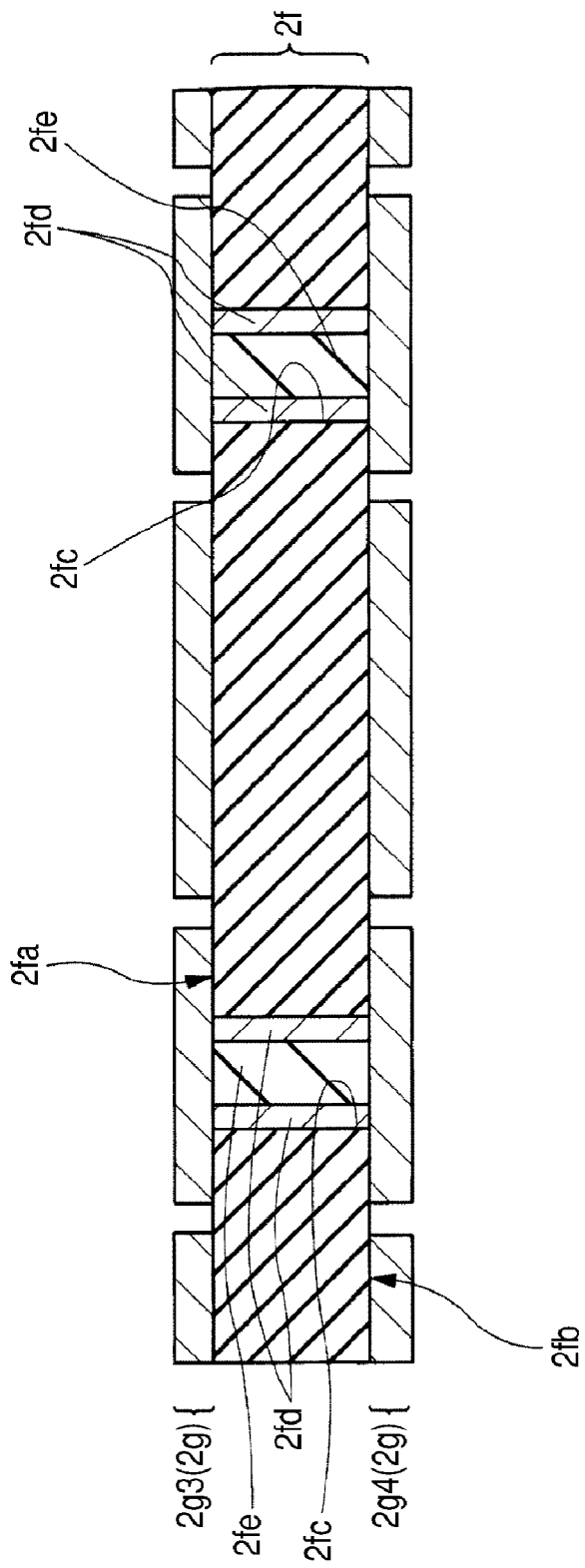
FIG. 79 is a partial sectional view illustrating how the third and fourth wiring layers are formed over the upper surface and the lower surface of a core material.
Figure 80:
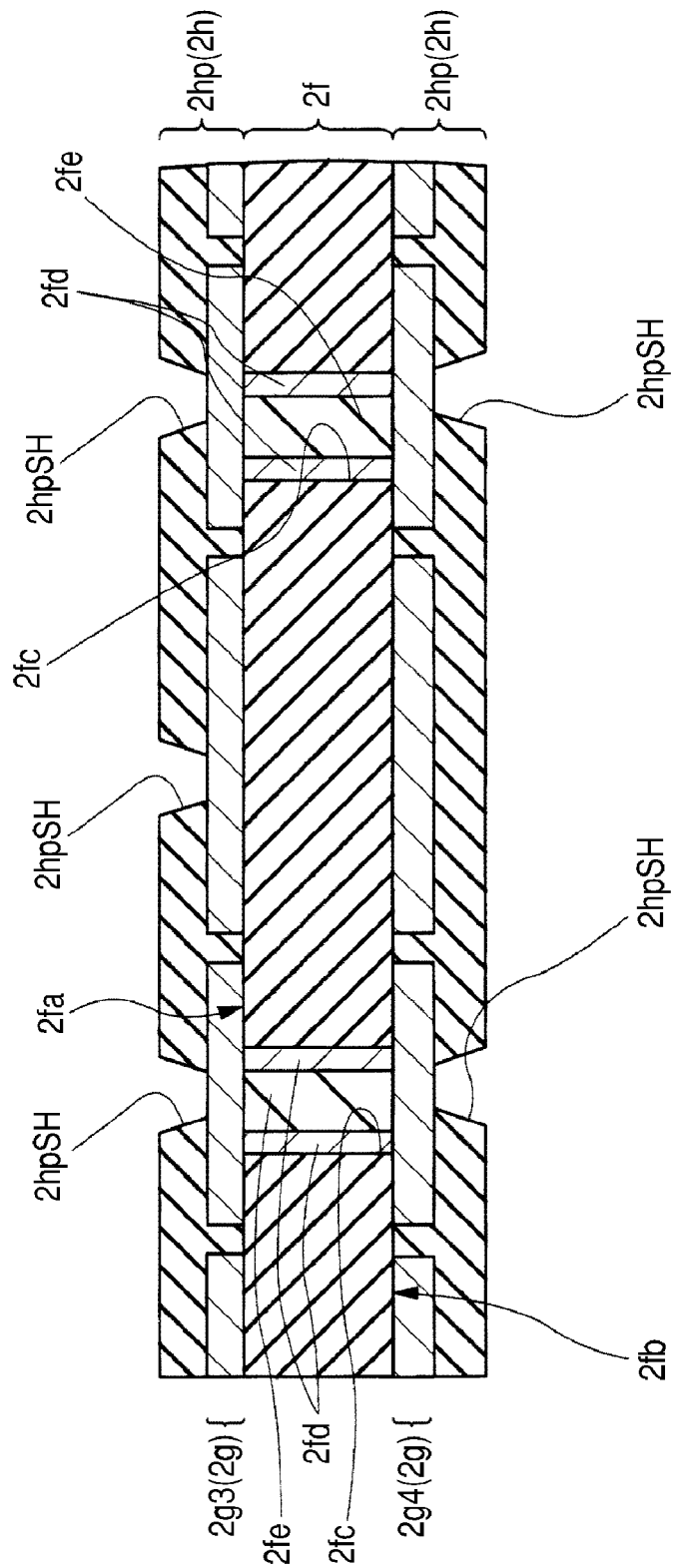
FIG. 80 is a partial sectional view illustrating how the second insulating layer is formed over the upper surface and the lower surface of the core material.
Figure 81:
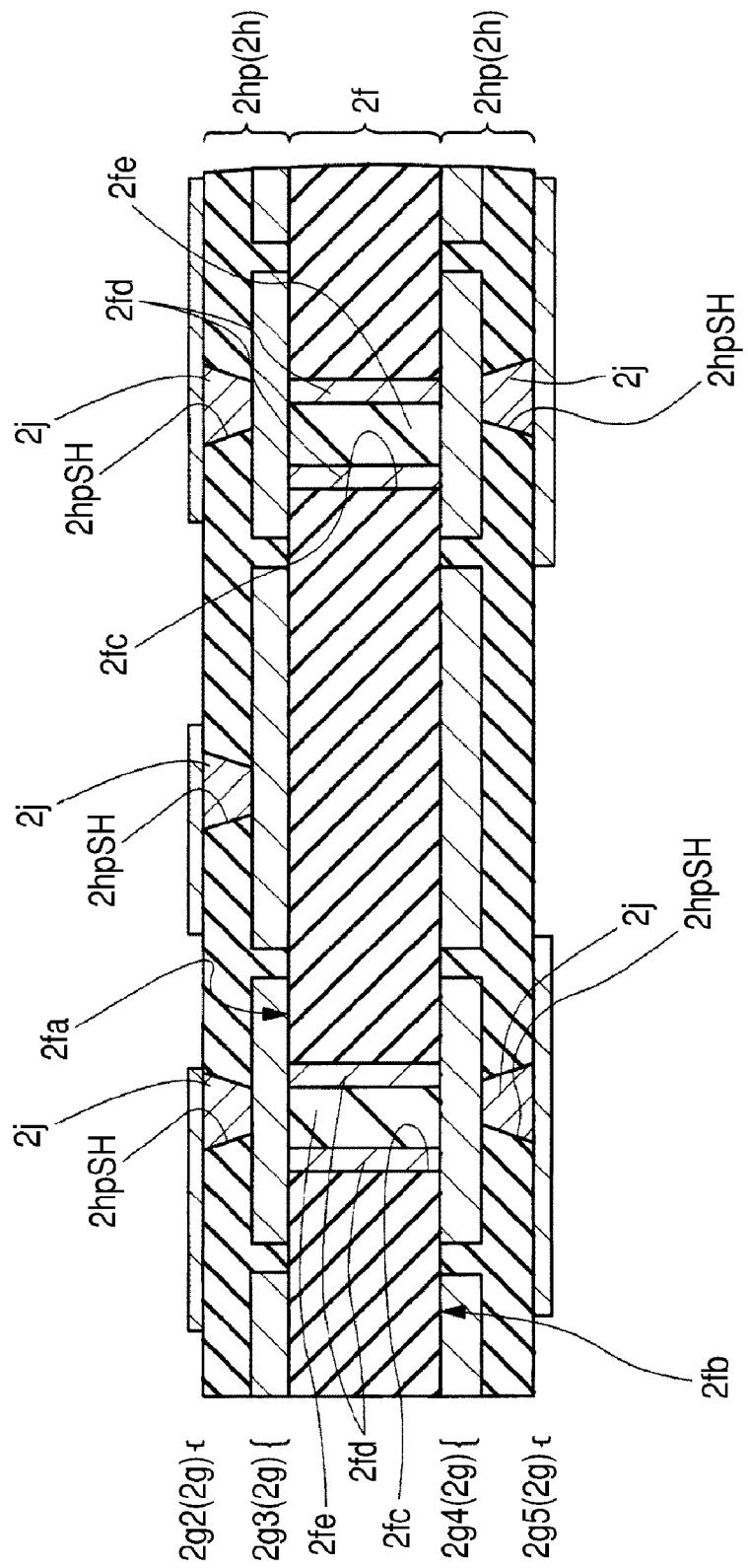
FIG. 81 is a partial sectional view illustrating how the second and fifth wiring layers are formed over the second insulating layers.
Figure 82:
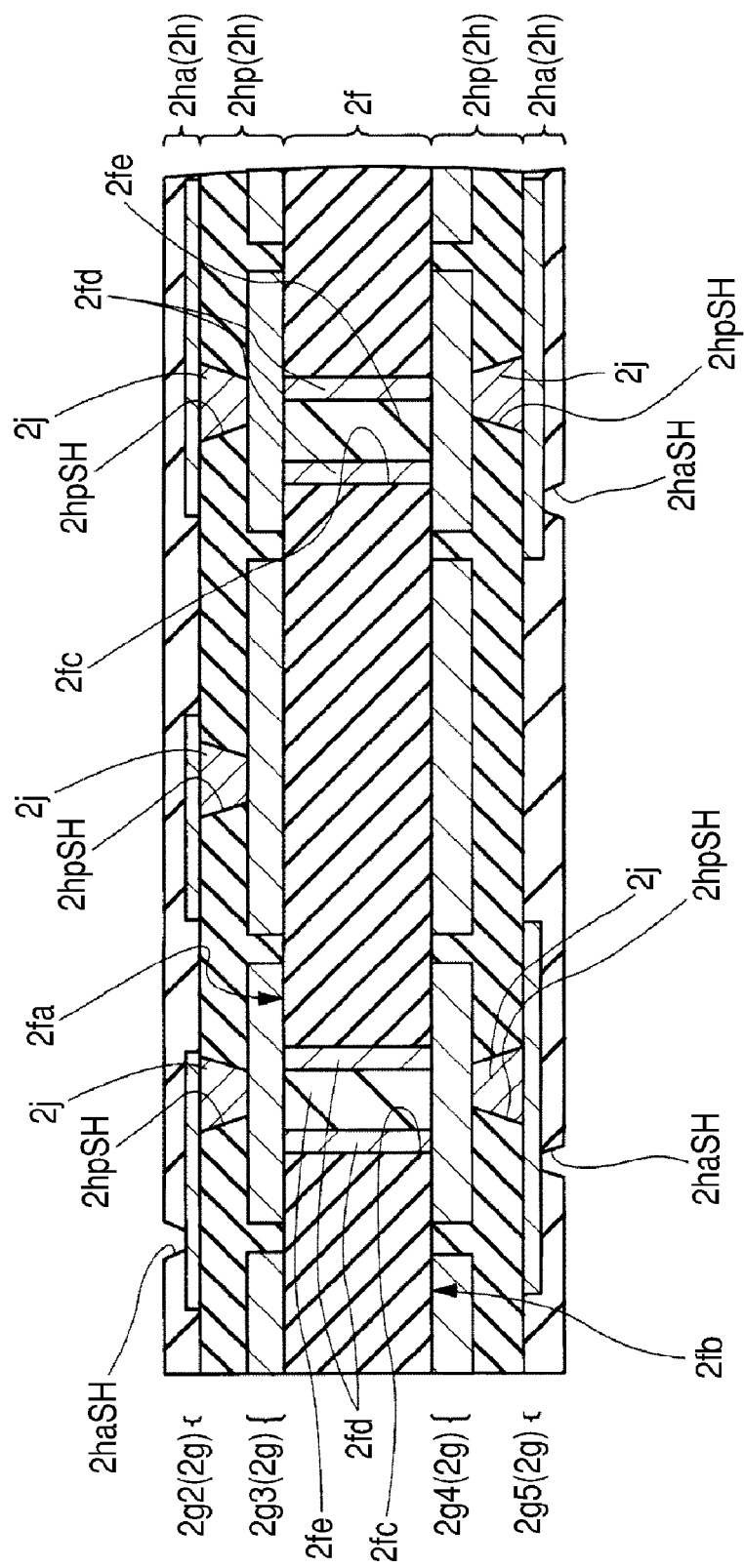
FIG. 82 is a partial sectional view illustrating how third insulating layers are formed so that the second and fifth wiring layers are respectively covered.
Figure 83:
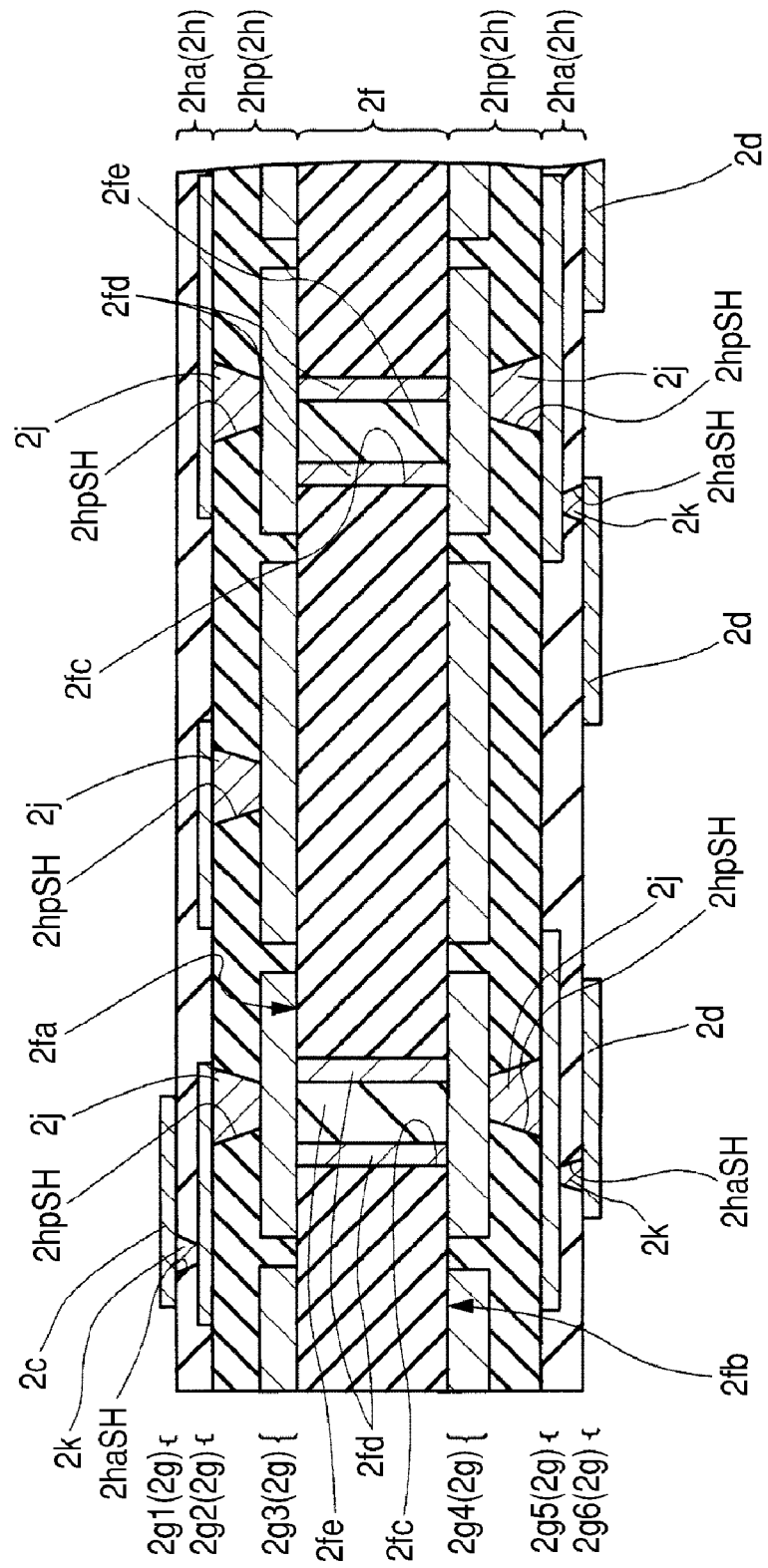
FIG. 83 is a partial sectional view illustrating how the first and sixth wiring layers are formed over the third insulating layers.
Figure 84:
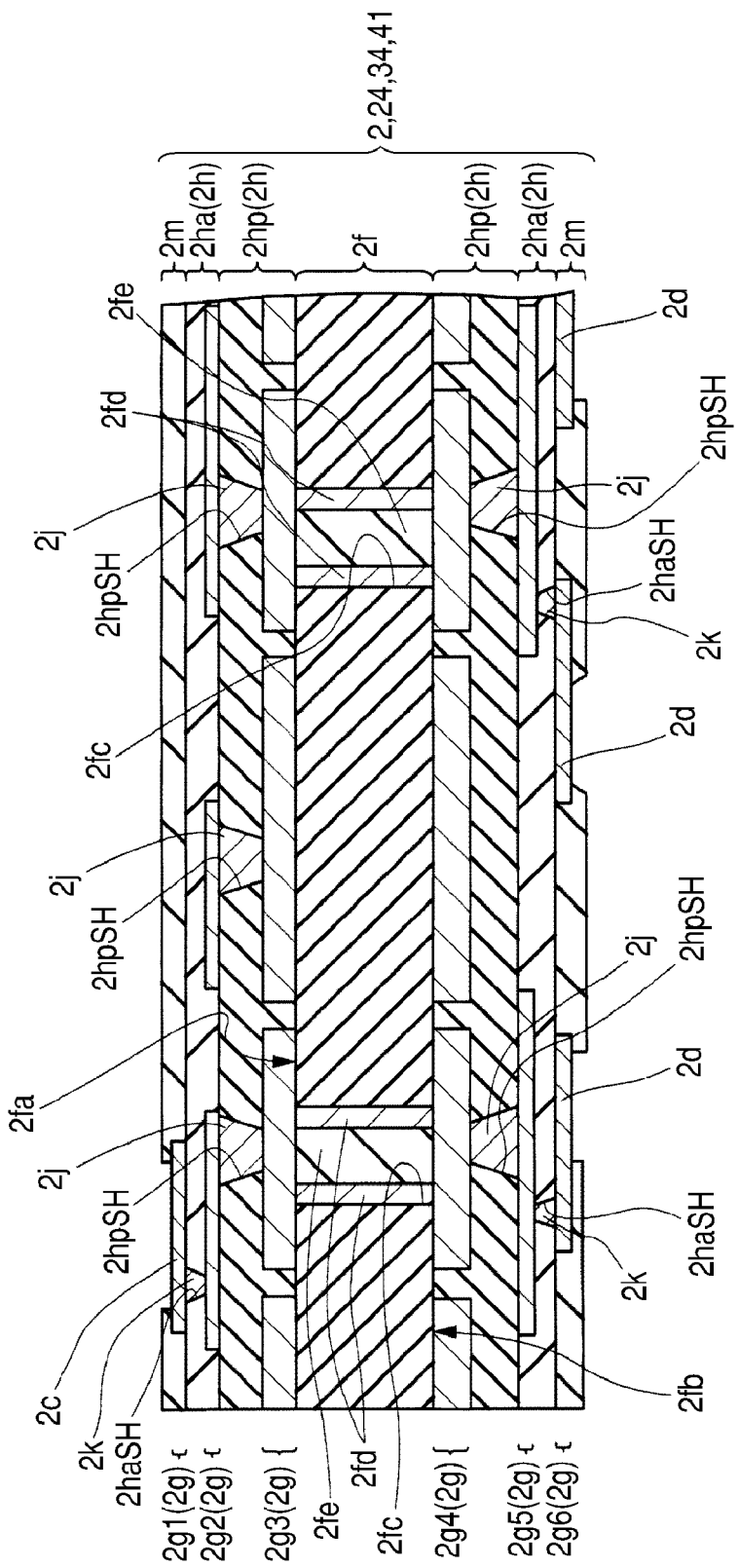
FIG. 84 is a partial sectional view illustrating how protective films are formed so that part of each of the first and sixth wiring layers is exposed.

Some examples will be taken. In the description of the first to fourth embodiments, processes in which wiring substrates 2, 24, 34, 41 manufactured beforehand are prepared to assemble semiconductor devices 10, 20, 30, 40 have been taken as examples. However, the invention is not limited to this. For example, semiconductor devices 10, 20, 30, 40 may be assembled after wiring substrates 2, 24, 34, 41 are manufactured. Hereafter, description will be given to this manufacturing process for wiring substrates 2, 24, 34, 41 with reference to FIG. 79 to FIG. 84. The drawings from FIG. 79 to FIG. 84 are enlarged sectional views explaining the manufacturing process for the wiring substrates. FIG. 79 is a partial sectional view illustrating how the third and fourth wiring layers are formed over the upper and lower surfaces of a core material; and FIG. 80 is a partial sectional view illustrating how a second insulating layer is formed over the upper and lower surfaces of the core material. FIG. 81 is a partial sectional view illustrating how the second and fifth wiring layers are respectively formed over the second insulating layers; and FIG. 82 is a partial sectional view illustrating how third insulating layers are formed so that the second and fifth wiring layers are respectively covered. FIG. 83 is a partial sectional view illustrating how the first and sixth wiring layers are formed over the third insulating layers; and FIG. 84 is a partial sectional view illustrating how protective films are formed so that part of each of the first and sixth wiring layers is exposed.

As illustrated in FIG. 79, first, a core material (first insulating layer) 2f as prepreg material with the third and fourth wiring layers 2g3, 2g4 formed over the upper and lower surfaces 2fa, 2fb thereof is prepared.

As illustrated in FIG. 80, subsequently, the second insulating layers 2hp as prepreg material are formed over the upper and lower surfaces 2fa, 2fb of the core material 2f so that the third and fourth wiring layers 2g3, 2g4 are respectively covered. Thereafter, openings (second insulating layer openings, vias) 2hpSH are formed in the second insulating layers 2hp so that part of each of the third and fourth wiring layers 2g3, 2g4 is exposed.

As illustrated in FIG. 81, subsequently, the second and fifth wiring layers 2g2, 2g5 are respectively formed over the second insulating layers 2hp. At this time, the second wiring layer 2g2 is electrically coupled to the third wiring layer 2g3 through wiring (metal film) 2j formed in the openings in the second insulating layer 2hp. This is the same with the fifth wiring layer 2g5.

As illustrated FIG. 82, subsequently, third insulating layers 2ha that do substantially not contain fiber and is comprised substantially only of resin are formed so that the second and fifth wiring layers 2g2, 2g5 are respectively covered. Thereafter, openings (third insulating layer openings, vias) 2haSH are formed in the third insulating layers 2ha so that part of each of the second and fifth wiring layers 2g2, 2g5 is exposed.

As illustrated in FIG. 83, subsequently, the first (uppermost) and sixth (lowermost) wiring layers 2g1, 2g6 are respectively formed over the third insulating layers 2ha. At this time, the first wiring layer 2g1 is electrically coupled with the second wiring layer 2g2 through wiring (metal film) 2k formed in the openings 2haSH in the third insulating layer 2ha. This is the same with the sixth wiring layer 2g6.

As illustrated in FIG. 84, finally, resin films (solder resist films) 2m as protective films are so formed that part of each of the first (uppermost) and sixth (lowermost) wiring layers 2g1, 2g6 is exposed. The wiring substrate 2, 24, 34, 41 is thereby completed.

In the description of the first to fourth embodiments, cases where lead-free solder is used for the material of the bump electrodes 2e, 52 have been taken as examples. However, the invention is not limited to this. When countermeasures against environmental pollution problems are not taken into account, for example, a solder material containing lead (Pb) may be used for the material of the bump electrodes 2e, 52.

In the description of the first embodiment, a case where the adhesive 3 is comprised of paste-like thermosetting resin has been taken as an example. However, the invention is not limited to this. For example, DAF (Die Attach Film) that is film-like adhesive may be used to fix the semiconductor chip 1. Use of DAF makes the following less prone to occur as compared with cases where paste-like adhesive 3 is used: part of the adhesive 3 flowing out from the rear surface 1b of the semiconductor chip 1 toward the bonding leads 2c provided in the peripheral area of the semiconductor chip 1. For this reason, each of the bonding leads 2c can be placed closer to the semiconductor chip 1 and thus it is possible to further reduce the outer dimensions of the wiring substrate 2 and cope with downsizing of the semiconductor devices.

Figure 85:
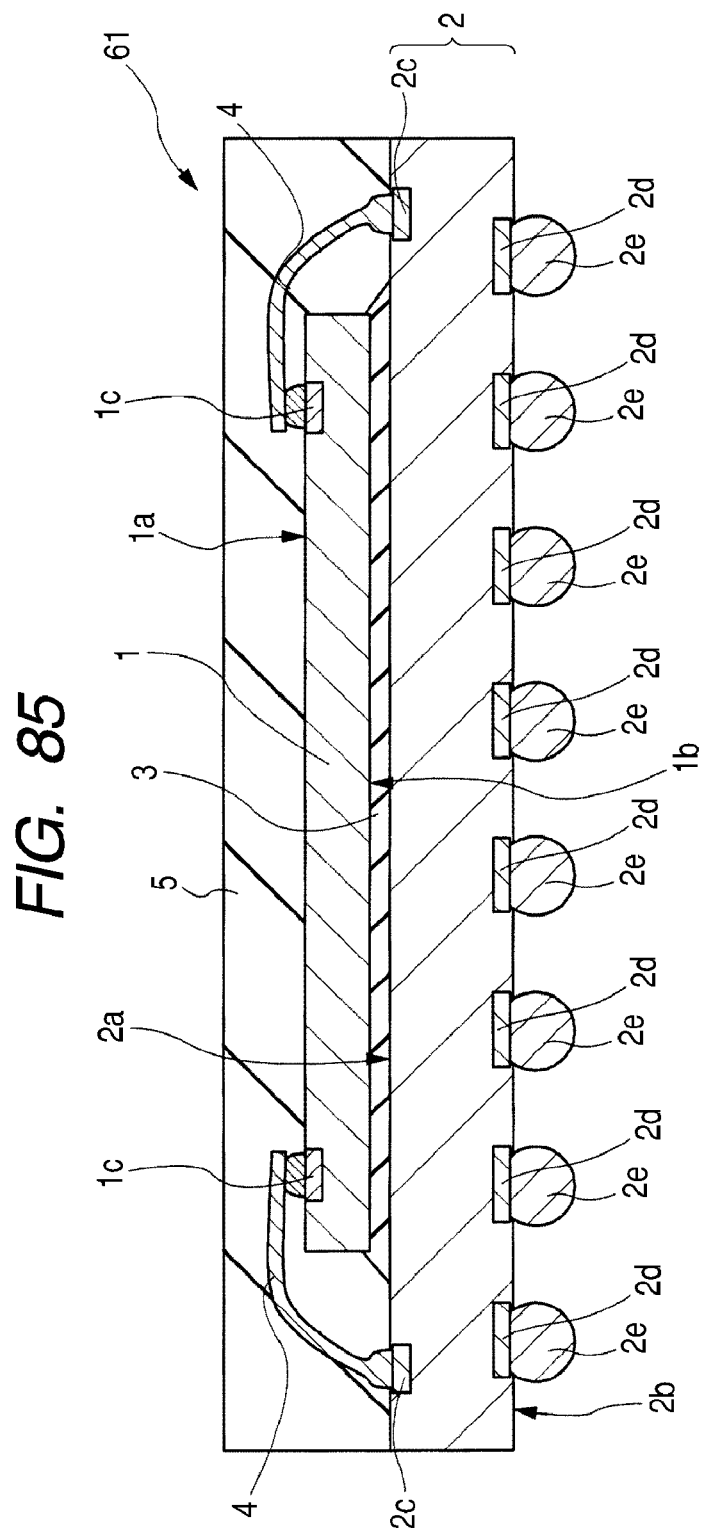
FIG. 85 is a sectional view illustrating a modification to the semiconductor device illustrated in FIG. 3.

FIG. 85 is a sectional view illustrating a modification to the semiconductor device illustrated in FIG. 3. In the description of the first, third, and fourth embodiments, cases where a normal bonding method is used in the process of bonding wires have been taken as examples. However, the invention is not limited to this. Instead, a so-called reverse bonding method may be adopted. In the reverse bonding method, like the semiconductor device 61 illustrated in FIG. 85 as an example, one end of a wire 4 is bonded to a bonding lead 2c of the wiring substrate 2 and then the other end of the wire 4 is bonded to a pad is of the semiconductor chip 1. This makes it possible to reduce the loop height of the wires 4 (the highest point of the wires 4) as compared with the normal bonding method and thus further reduce the thickness of the encapsulating body 5 formed in a subsequent process as well. As a result, the mounting height of the semiconductor device 61 can be further reduced. In case of reverse bonding, the load of the capillary is applied to the wiring substrate as the 1st side. In this embodiment, however, the insulating layer 2h directly under the uppermost wiring layer (first wiring layer) 2g1 (FIG. 3) is the third insulating layer 2ha that does substantially not contain fiber and is comprised substantially only of resin. Therefore, the insulating layer 2h is lower in hardness than the prepreg material and can absorb the load of the capillary. For this reason, the problem of cracking in the wiring substrate 2 can be suppressed even though the following takes place: the thickness of the wiring substrate 2 is reduced to reduce the mounting height of the semiconductor device 61 and the strength (hardness) of the wiring substrate 2 is degraded as a result.

Figure 86:
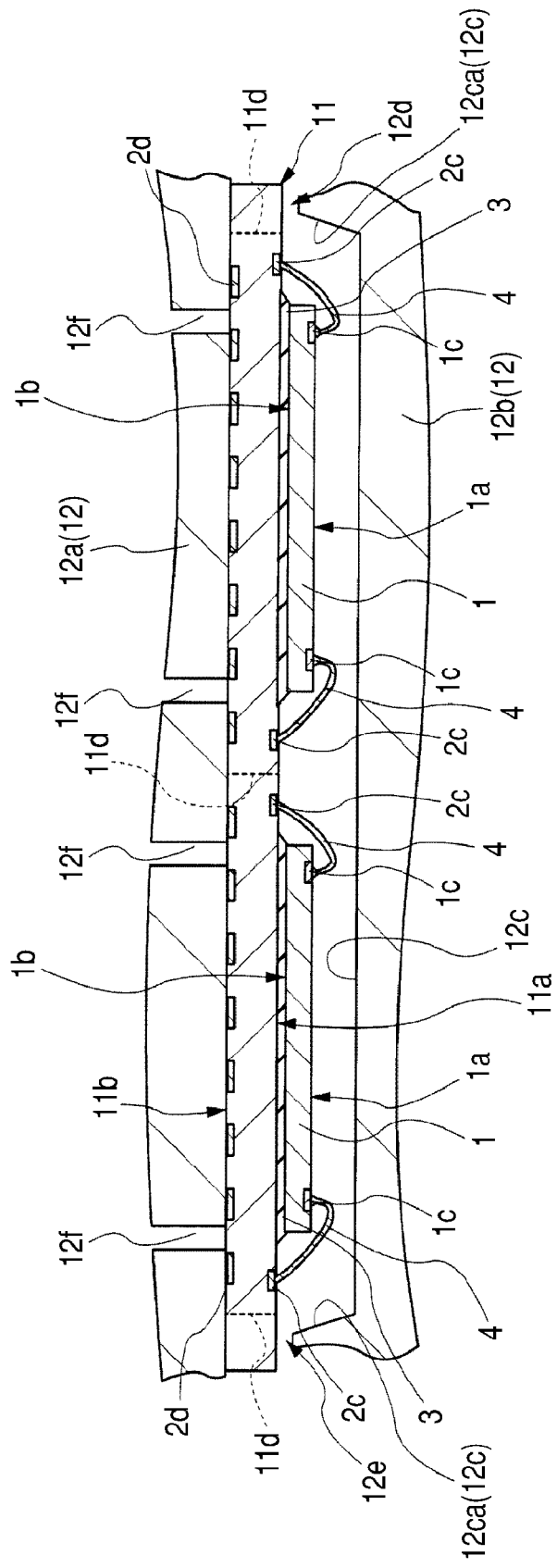
FIG. 86 is an enlarged substantial part sectional view illustrating a modification to the forming mold illustrated in FIG. 30.

FIG. 86 is an enlarged substantial part sectional view illustrating a modification to the forming mold illustrated in FIG. 30. In the description of the first and third embodiments, cases where cavities 12c are formed in the upper die face of the upper die 12a and wiring substrates 11 are set on the lower die face of the lower die 12b have been taken as examples. However, the invention is not limited to this. For example, a forming mold 12 in which cavities are not formed in the upper die face of the upper die 12a and cavities 12c are formed in the lower die face of the lower die 12b may be used. When such a forming mold 12 is used, however, it is required to fix the wiring substrates 11 on the upper die face of the upper die 12a. For this reason, it is desirable that multiple vacuum suction holes 12f should be formed beforehand in the upper die face of the upper die 12a as illustrated in FIG. 86 as an example.

Figure 87:
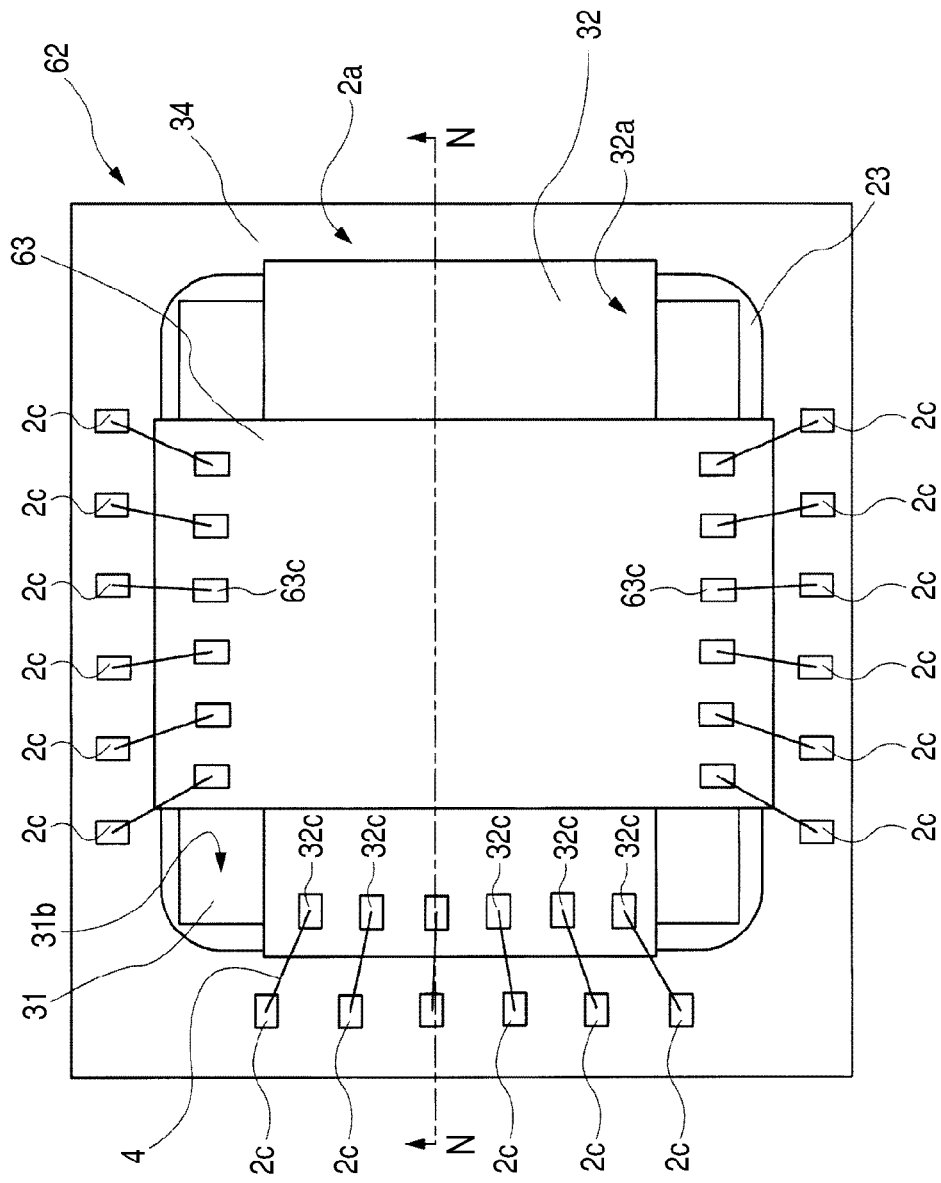
FIG. 87 is a plan view illustrating a modification to the semiconductor device illustrated in FIG. 42.
Figure 88:
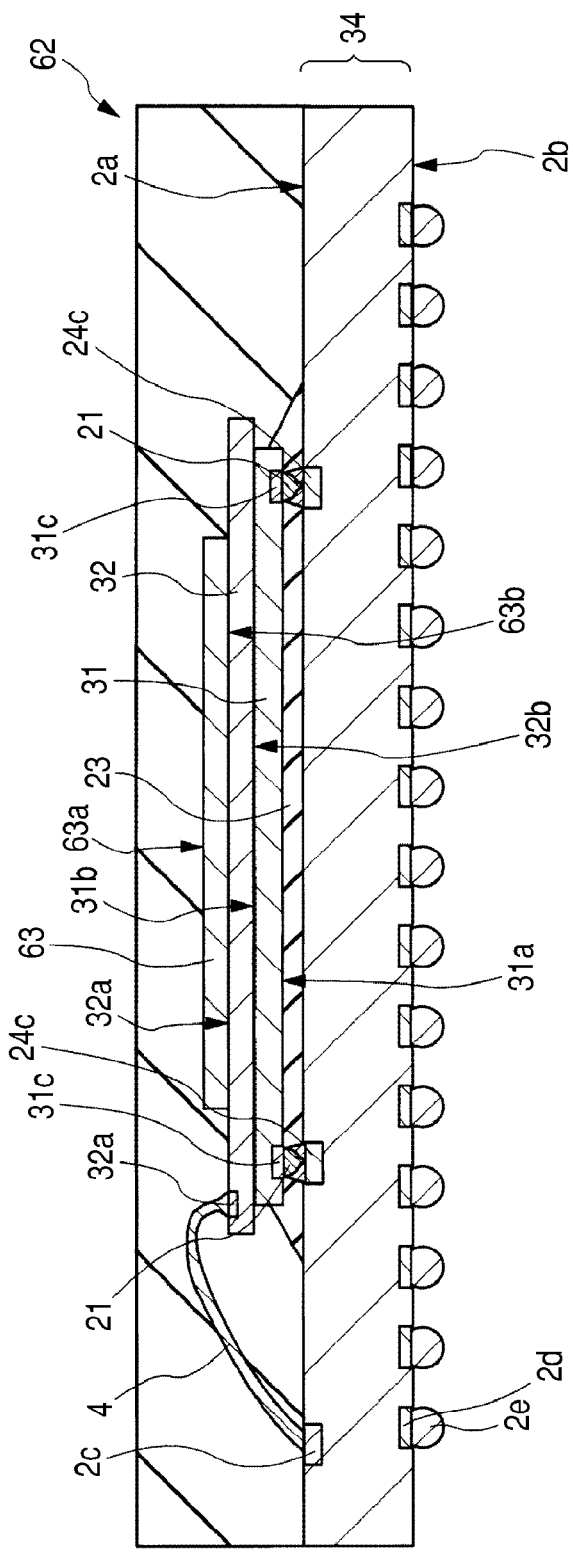
FIG. 88 is a sectional view taken along line N-N of FIG. 87, illustrating a modification to the semiconductor device illustrated in FIG. 44.
Figure 89:
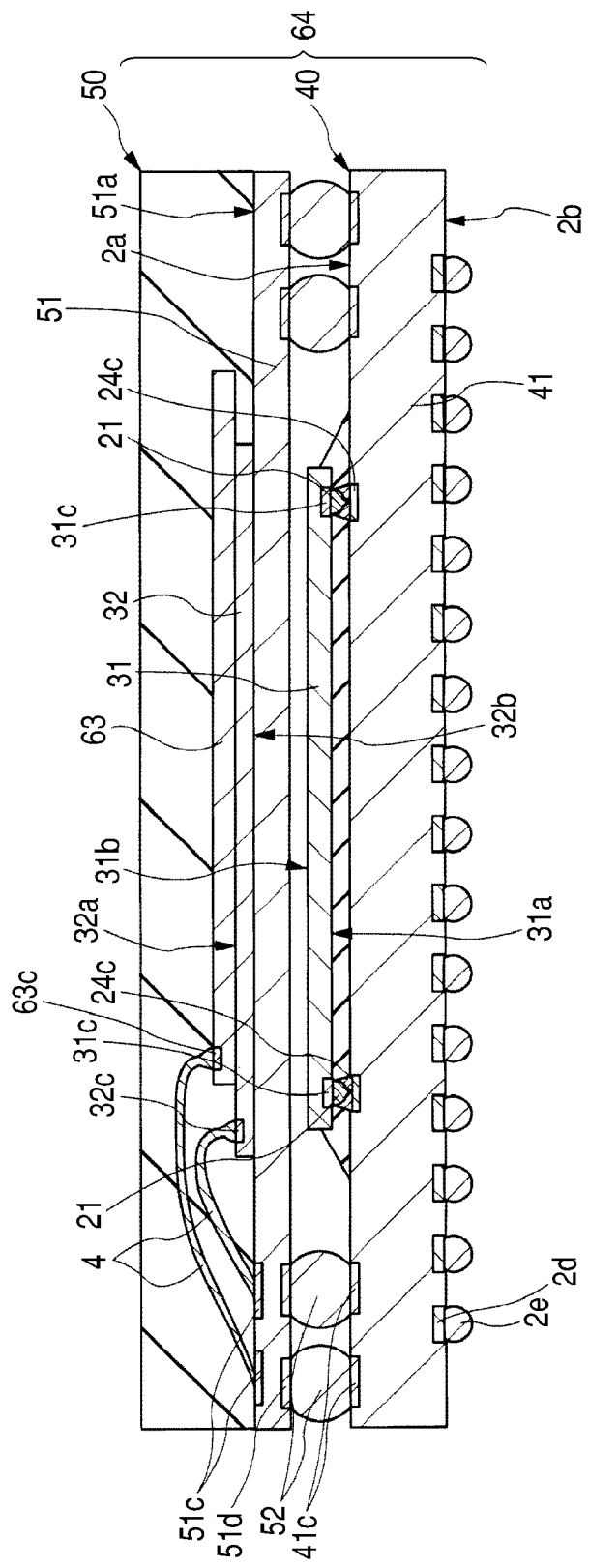
FIG. 89 is a sectional view illustrating a modification to the semiconductor device illustrated in FIG. 60.

FIG. 87 is a plan view illustrating a modification to the semiconductor device illustrated in FIG. 42. FIG. 88 is a sectional view taken along line N-N of FIG. 87, illustrating a modification to the semiconductor device illustrated in FIG. 44. FIG. 89 is a sectional view illustrating a modification to the semiconductor device illustrated in FIG. 60. In the description of the third and fourth embodiments, cases where one memory chip 32 is stacked (mounted) over a microcomputer chip 31 have been taken as examples. However, the invention is not limited to this and multiple memory chips 32 may be mounted. At this time, the following measure is taken, for example, like the semiconductor device 62 illustrated in FIG. 87 and FIG. 88 that is a modification to the third embodiment: bonding leads 2c electrically coupled with the pads 63c of a third-tier memory chip 63 through wires 4 are formed over the upper surface 2a of the wiring substrate 34. These bonding leads are formed along sides of the wiring substrate 34 different from a side of the wiring substrate 34 where bonding leads 2c electrically coupled with the pads 32c of a second-tier memory chip 32 through wires 4. Further, the memory circuit formed in the main surface 63a of the third-tier memory chip 63 may be different from the memory circuit formed in the main surface 32a of the second-tier memory chip 32. For example, DRAM may be formed.

In the POP type semiconductor device 64, the memory chips 32, 63 of the upper-side semiconductor device 50 may be stacked together, for example, as in the semiconductor device 64 illustrated in FIG. 89 that is a modification to the fourth embodiment. In the upper-side semiconductor device 50, in this case, the first-tier memory chip 32 is mounted over the upper surface 51a of the wiring substrate 51 and the second-tier memory chip 63 is mounted over the main surface 32a of the memory chip 32.

When the number of semiconductor chips (microcomputer chip 31, memory chips 32, 63) mounted over the wiring substrate 34 is increased as mentioned above, the thickness of the semiconductor device 62 is further increased. However, the thickness of the semiconductor device 62 can be reduced by adopting the wiring substrates 2, 24, 34, 41 described in relation to the first to fourth embodiments.

Figure 90:
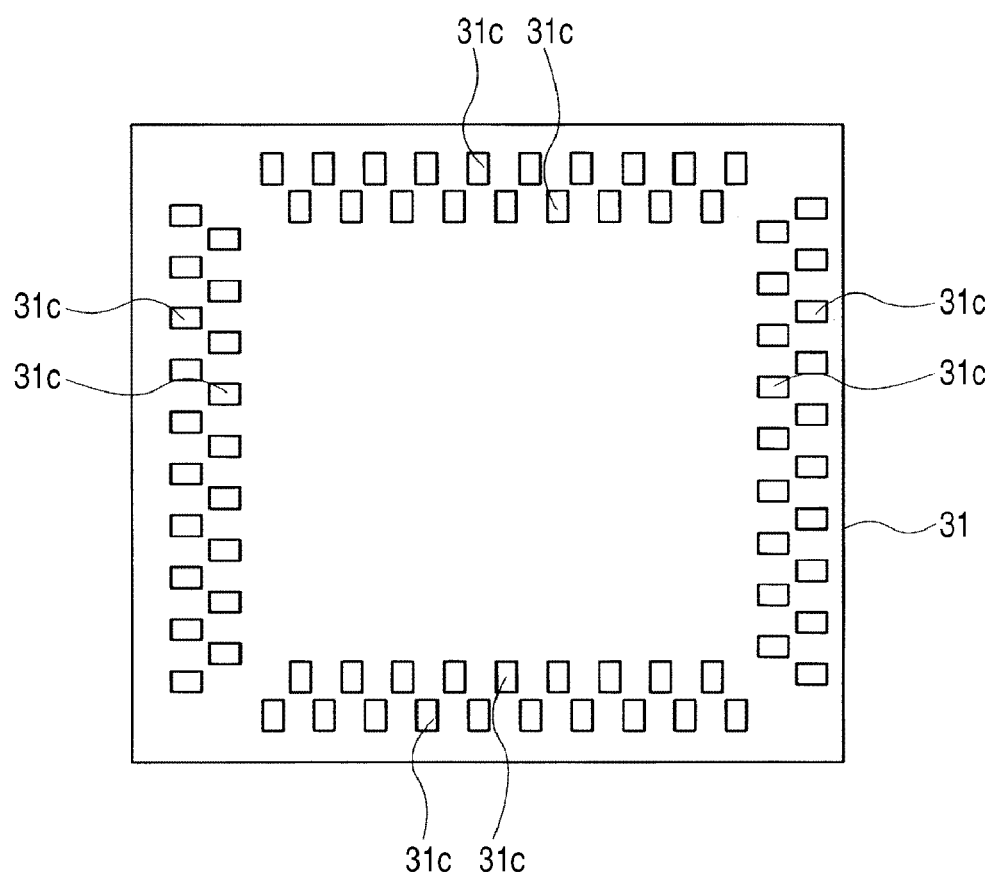
FIG. 90 is a plan view of the main surface side of a modification to the microcomputer chip illustrated in FIG. 42.
Figure 91:
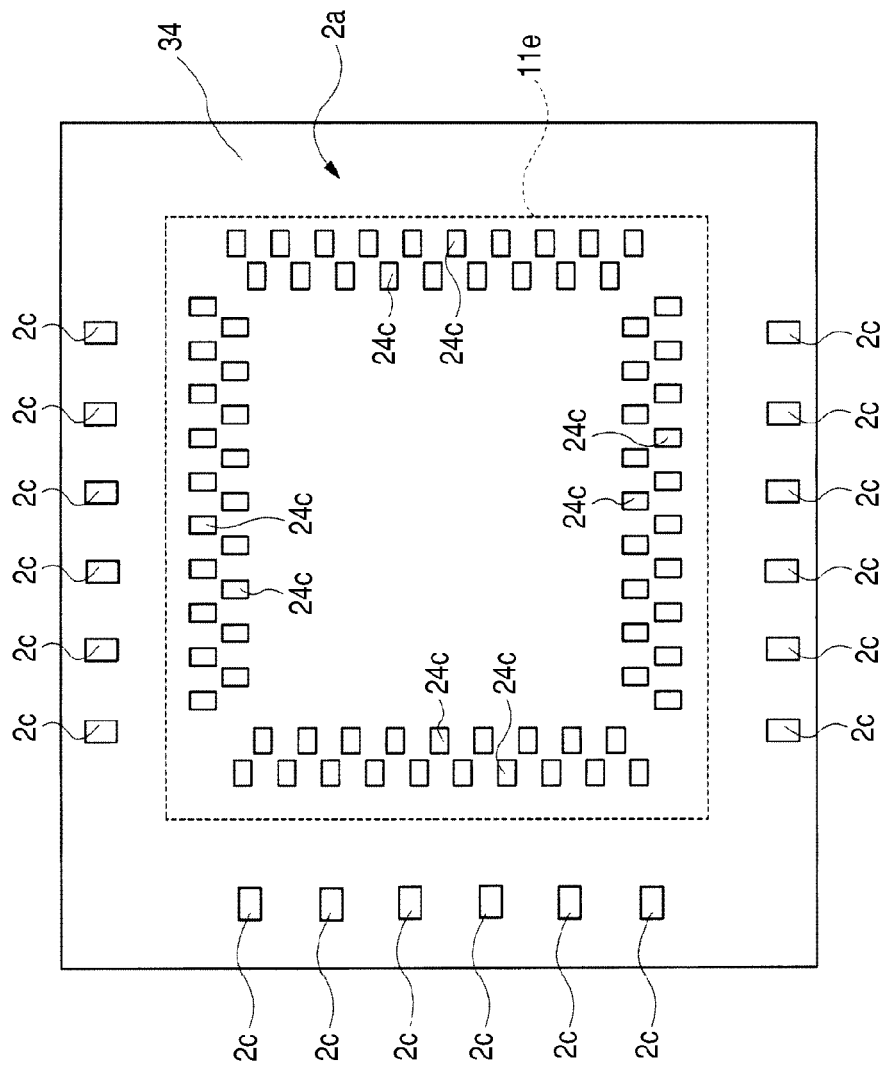
FIG. 91 is a plan view of the upper surface side of a modification to the wiring substrate illustrated in FIG. 42.
Figure 92:
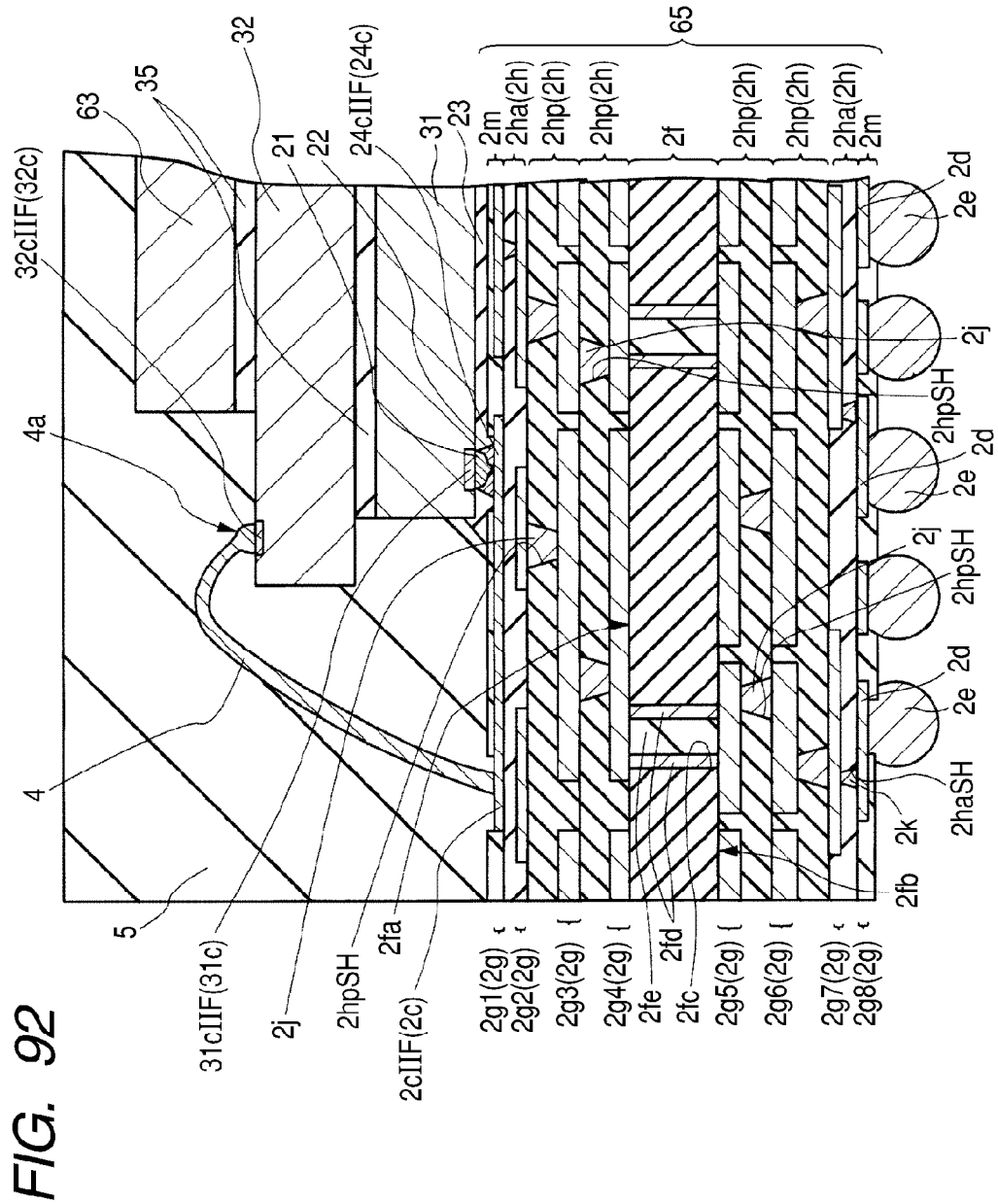
FIG. 92 is an enlarged substantial part sectional view illustrating a modification to the wiring substrate illustrated in FIG. 45.

FIG. 90 is a plan view on the main surface side illustrating a modification to the microcomputer chip illustrated in FIG. 42; FIG. 91 is a plan view on the upper surface side illustrating a modification to the wiring substrate illustrated in FIG. 42; and FIG. 92 is an enlarged substantial part sectional view illustrating a modification to the wiring substrate illustrated in FIG. 45.

In the description of the third embodiment as well as that of the second embodiment, the following case has been taken as an example: a case where multiple pads 31c are formed in a single row in the main surface 31a of the microcomputer chip 31 along each side of the main surface 31a of the microcomputer chip 31. However, the invention is not limited to this. Such a microcomputer chip 31 as illustrated in FIG. 90 may be used to cope with the enhancement of functionality of semiconductor devices and cases where the number of memory chips mounted over a microcomputer chip is increased. That is, a microcomputer chip in which multiple pads 31c are formed in multiple rows (for example, two rows) in a staggered arrangement along each side may be used. In this case, the following wiring substrate is used in accordance with the arrangement of the pads 31c of the microcomputer chip 31: a wiring substrate 34 in which bonding leads 24c for flip-chip bonding formed in the upper surface 2a thereof are also arranged in a staggered pattern as illustrated in FIG. 91. At this time, the number of wiring patterns formed in the wiring substrate 34 is larger than in the third embodiment. Therefore, to route the wiring patterns to desired lands 2d formed in the lower surface 2b of the wiring substrate 34, use of a wiring substrate 34 having six wiring layers 2g is indispensable. When downsizing of a semiconductor device is taken into account, however, there is a possibility that the number of wiring layers 2g can become insufficient to route the wiring patterns. To cope with this, a wiring substrate 65 having eight or more wiring layers 2g illustrated in FIG. 92 may be used. The wiring substrate 65 illustrated in FIG. 92 is the same as the wiring substrate 34 described in relation to the third embodiment with the exception that it is a wiring substrate of eight-layer structure in which eight wiring layers 2g are laminated. (The wiring substrate 34 includes the modification to the arrangement of the bonding leads 24c illustrated in FIG. 91.) Therefore, the detailed description thereof will be omitted. At this time, as mentioned above, it is required to form wiring patterns with as small a pitch as possible in the uppermost wiring layer 2g1 and the lowermost wiring layer 2g8. For this reason, it is desirable that the following insulating layer should be used for the insulating layers 2h positioned directly under the uppermost wiring layer 2g1 and above the lowermost wiring layer 2g8: an insulating layer 2ha that is not prepreg material and does substantially not contain fiber and is comprised substantially only of resin. It is desirable that an insulating layer 2hp comprised of prepreg material should be formed for the other insulating layers 2h to ensure the strength (hardness) of the wiring substrate 65.

In the description of the fourth embodiment, a case where the microcomputer chip 31 is flip-chip mounted over the wiring substrate 41 has been taken as an example. Instead, the following measure may be taken: the microcomputer chip 31 is face-up mounted over the wiring substrate 41 and the pads (electrodes) 31c of the microcomputer chip 31 and the bonding leads (electrodes) 24c of the wiring substrate 41 electrically coupled together through wires 4. (In this case, the bonding leads 24c are formed outside the chip placement area 11e where the microcomputer chip 31 is to be mounted, in the upper surface 2a of each wiring substrate 41.)

In case of the POP type semiconductor device 60, however, one semiconductor device 50 is stacked over the other semiconductor device 40 as illustrated in FIG. 60. For this reason, the following takes place when the microcomputer chip 31 is face-up mounted over the wiring substrate 41 and the pads (electrodes) 31c of the microcomputer chip 31 and the bonding leads (electrodes) 24c of the wiring substrate 41 are electrically coupled together through wires (not shown): it is required to cover the microcomputer chip 31 and the wires with the encapsulating body (not shown) as described in relation to the first embodiment. As a result, it is required to make the height of the bump electrodes 52 for electrical coupling between the upper-side semiconductor device (second semiconductor device) 50 and the lower-side semiconductor device (first semiconductor device) 40 larger than the thickness of the encapsulating body.

For this reason, the thickness of the POP type semiconductor device 60 becomes larger. (This thickness is equivalent to the following height: height from the tips of the bump electrodes (external terminals) 2e formed in the lower surface 2b of the first semiconductor device 40 to the front face of the encapsulating body 5 of the second semiconductor device 50.) To cope with this, it is desirable that the microcomputer chip 31 should be flip-chip bonded to over the wiring substrate 41 as in the fourth embodiment.

Figure 93:
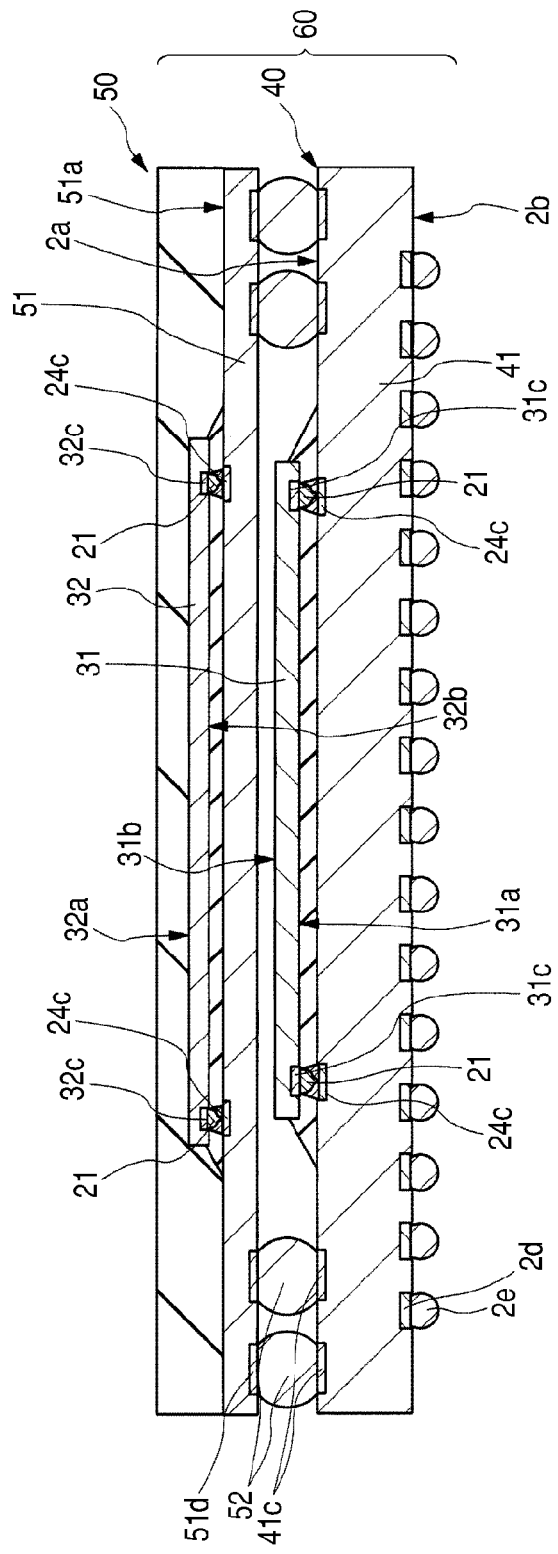
FIG. 93 is a sectional view illustrating a modification to the semiconductor device illustrated in FIG. 60.
Figure 94:
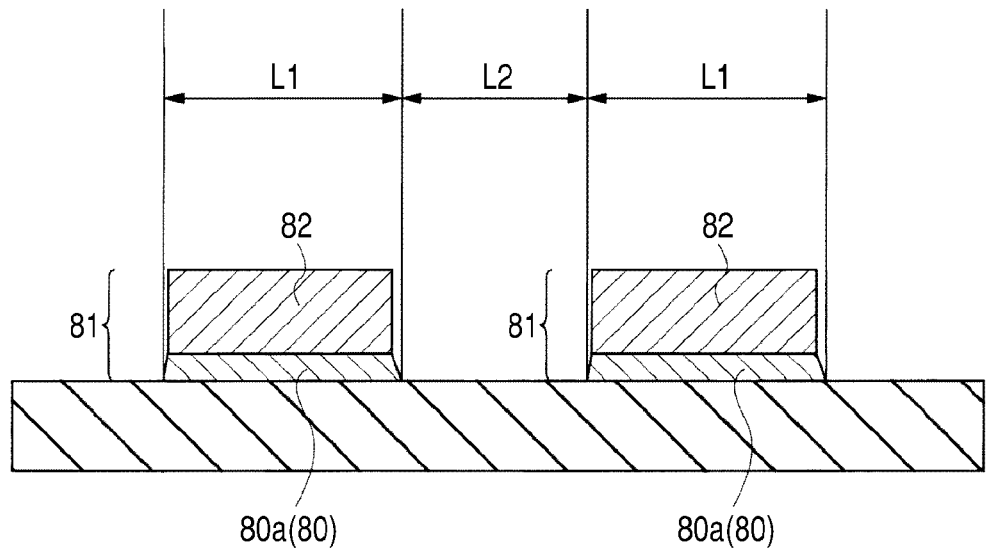
FIG. 94 is a sectional view illustrating wiring patterns using seed layers formed by electroless plating.
Figure 95:
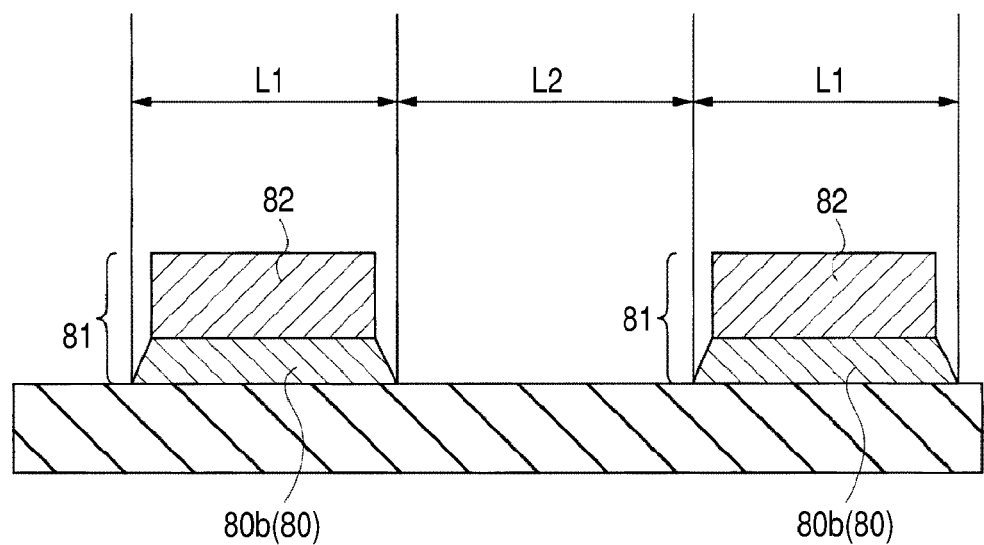
FIG. 95 is a sectional view of wiring patterns using metal foil as seed layers.

As illustrated in FIG. 93, the thickness of the POP type semiconductor device 60 can be further reduced by flip-chip mounting the memory chip 32 mounted in the upper-side semiconductor device 50 as well. FIG. 93 is a sectional view illustrating a modification to the semiconductor device illustrated in FIG. 60.

The invention is applicable to BGA (Ball Grid Array) type semiconductor devices in which a semiconductor chip is mounted over a wiring substrate and manufacturing methods therefor.

What is claimed is:

1. A method of manufacturing a semiconductor device, comprising the steps of:
(a) providing a wiring substrate having an upper surface on which a plurality of bonding leads are formed, and a lower surface on which a plurality of lands are formed, wherein
the lower surface opposes to the upper surface;
the wiring substrate includes a core material having an upper surface positioned on the upper surface side of the wiring substrate and a lower surface positioned on the lower surface side of the wiring substrate;
the wiring substrate is a multilayer wiring substrate in which a plurality of wiring layers and a plurality of insulating layers are alternately formed on both the upper surface side of the core material and the lower surface side of the core material;
the bonding leads are formed of part of the uppermost wiring layer of the wiring layers;
the lands are formed of part of the lowermost wiring layer of the wiring layers;
the core material is a first insulating layer containing fiber and resin;
the insulating layers include second insulating layers containing fiber and resin, and third insulating layers;
content of fiber in each of the third insulating layers is smaller than that of each of the first insulating layer and the second insulating layers;
the second insulating layers are formed on both the upper surface side of the core material and the lower surface side of the core material;

the third insulating layers are formed on both the upper surface side of the core material and the lower surface side of the core material via the second insulating layers;
both the uppermost wiring layer and the lowermost wiring layer are formed over the third insulating layers, respectively;
three of the wiring layers are formed on both the upper surface side of the core material and the lower surface side of the core material,
the thickness of the first insulating layer is larger than the thickness of each of the second insulating layers; and
the thickness of each of the second insulating layers is larger than the thickness of each of the third insulating layers,
(b) after the step (a), mounting a semiconductor chip over the upper surface of the wiring substrate via a plurality of bump electrodes such that a main surface of the semiconductor chip on which a plurality of pads are formed faces the upper surface of the wiring substrate, and electrically connecting the pads of the semiconductor chip with the bonding leads of the wiring substrate through the bump electrodes;
(c) after the step (b), supplying a resin between the main surface of the semiconductor chip and the upper surface of the wiring substrate; and
(d) after the step (c), coupling a plurality of external terminals to the lands of the wiring substrate, respectively.

2. The method according to claim 1,
wherein in the step (b), a rear surface of the semiconductor chip opposite to the main surface is pushed by a tool.

3. The method according to claim 2,
wherein in the step (b), heat is applied to bonding parts of the bump electrodes and the bonding leads, respectively.

4. The method according to claim 1,
wherein in the main surface of the semiconductor chip, there is formed a computation circuit converting signals supplied from an external device,
wherein the pads include: first interfacing pads which are electrically coupled with the computation circuit and to which the signals supplied from the external device are inputted; second interfacing pads which are electrically coupled with the computation circuit and to which signals converted at the computation circuit are outputted; power supply potential pads to which power supply potential supplied from the external device is inputted; and reference potential pads to which reference potential supplied from the external device is inputted,
wherein the wiring layers include: first wiring patterns through which the signals flow; second wiring patterns through which the power supply potential flows; and third wiring patterns through which the reference potential flows, and
wherein each of the first wiring patterns, the second wiring patterns, and the third wiring patterns is so formed that the total area of the first wiring patterns is larger than the total area of the second wiring patterns and the third wiring patterns in the uppermost wiring layer and the lowermost wiring layer, and the total area of the second wiring patterns or the total area of the third wiring patterns is larger than the total area of the first wiring patterns in the wiring layers other than the uppermost wiring layer and the lowermost wiring layer.

5. A method of manufacturing a semiconductor device, comprising the steps of:

(a) providing a wiring substrate having an upper surface on which a plurality of bonding leads are formed, and a lower surface on which a plurality of lands are formed, wherein
the lower surface opposes to the upper surface;
the wiring substrate includes a core material having an upper surface positioned on the upper surface side of the wiring substrate and a lower surface positioned on the lower surface side of the wiring substrate;
the wiring substrate is a multilayer wiring substrate in which a plurality of wiring layers and a plurality of insulating layers are alternately formed on both the upper surface side of the core material and the lower surface side of the core material;
the bonding leads are formed of part of the uppermost wiring layer of the wiring layers;
the lands are formed of part of the lowermost wiring layer of the wiring layers;
the core material is a first insulating layer containing fiber and resin;
the insulating layers include second insulating layers containing fiber and resin, and third insulating layers;
content of fiber in each of the third insulating layers is smaller than that of each of the first insulating layer and the second insulating layers;
the second insulating layers are formed on both the upper surface side of the core material and the lower surface side of the core material;
the third insulating layers are formed on both the upper surface side of the core material and the lower surface side of the core material via the second insulating layers;
both the uppermost wiring layer and the lowermost wiring layer are formed over the third insulating layers, respectively;
three of the wiring layers are formed on both the upper surface side of the core material and the lower surface side of the core material,
the thickness of the first insulating layer is larger than the thickness of each of the second insulating layers; and
the thickness of each of the second insulating layers is larger than the thickness of each of the third insulating layers,
(b) after the step (a), mounting a first semiconductor chip over the upper surface of the wiring substrate via a plurality of bump electrodes such that a first main surface of the first semiconductor chip on which a plurality of first pads are formed faces the upper surface of the wiring substrate, and electrically connecting the first pads of the first semiconductor chip with first bonding leads of the bonding leads of the wiring substrate through the bump electrodes;
(c) after the step (b), supplying a first resin between the first main surface of the first semiconductor chip and the upper surface of the wiring substrate;
(d) after the step (c), mounting a second semiconductor chip over a first rear surface of the first semiconductor chip opposite to the first main surface such that a second rear surface of the second semiconductor chip opposite to a second main surface on which a plurality of second pads are formed faces the first rear surface of the first semiconductor chip;
(e) after the step (d), electrically connecting the second pads of the second semiconductor chip with second bonding leads of the bonding leads of the wiring substrate through a plurality of wires;

(f) after the step (e), sealing the first semiconductor chip, the second semiconductor chip and the wires with second resin.

6. The method according to claim 5,
wherein a pitch between the first bonding leads adjacent to each other is smaller than that between the second bonding leads adjacent to each other.

7. The method according to claim 5,
wherein in the step (b), the first rear surface of the first semiconductor chip is pushed by a tool.

8. The method according to claim 7,
wherein in the step (b), heat is applied to bonding parts of the bump electrodes and the first bonding leads, respectively.

9. The method according to claim 5,
wherein in the first main surface of the first semiconductor chip, there is formed a computation circuit converting signals supplied from an external device,
wherein the first pads include: first interfacing pads which are electrically coupled with the computation circuit and to which the signals supplied from the external device are inputted; second interfacing pads which are electrically coupled with the computation circuit and to which signals converted at the computation circuit are outputted; power supply potential pads to which power supply potential supplied from the external device is inputted; and reference potential pads to which reference potential supplied from the external device is inputted,
wherein the wiring layers include: first wiring patterns through which the signals flow; second wiring patterns through which the power supply potential flows; and third wiring patterns through which the reference potential flows, and
wherein each of the first wiring patterns, the second wiring patterns, and the third wiring patterns is so formed that the total area of the first wiring patterns is larger than the total area of the second wiring patterns and the third wiring patterns in the uppermost wiring layer and the lowermost wiring layer, and the total area of the second wiring patterns or the total area of the third wiring patterns is larger than the total area of the first wiring patterns in the wiring layers other than the uppermost wiring layer and the lowermost wiring layer.

* * * * *